United States Patent
Hayano

(10) Patent No.: US 11,832,506 B2
(45) Date of Patent: Nov. 28, 2023

(54) ORGANIC ELECTROLUMINESCENCE DEVICE AND FUSED POLYCYCLIC COMPOUND FOR ORGANIC ELECTROLUMINESCENCE DEVICE

(71) Applicant: Samsung Display Co., Ltd., Yongin-si (KR)

(72) Inventor: Tetsuji Hayano, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 568 days.

(21) Appl. No.: 17/002,617

(22) Filed: Aug. 25, 2020

(65) Prior Publication Data

US 2021/0184123 A1    Jun. 17, 2021

(30) Foreign Application Priority Data

Dec. 13, 2019  (KR) ................ 10-2019-0167201

(51) Int. Cl.
| | | |
|---|---|---|
| H01L 51/00 | (2006.01) | |
| H10K 85/30 | (2023.01) | |
| C07F 5/02 | (2006.01) | |
| C09K 11/06 | (2006.01) | |
| H10K 50/11 | (2023.01) | |
| H10K 101/10 | (2023.01) | |

(52) U.S. Cl.
CPC ........... H10K 85/322 (2023.02); C07F 5/027 (2013.01); C09K 11/06 (2013.01); *C09K 2211/1022* (2013.01); *H10K 50/11* (2023.02); *H10K 2101/10* (2023.02)

(58) Field of Classification Search
CPC ... H01L 51/008; H01L 51/5012; C09K 11/06; C07F 5/027
USPC ........................................................ 428/690
See application file for complete search history.

(56) References Cited

U.S. PATENT DOCUMENTS

| | | |
|---|---|---|
| 6,602,618 B2 | 8/2003 | Watanabe et al. |
| 10,374,166 B2 | 8/2019 | Hatakeyama et al. |
| 10,483,471 B2 | 11/2019 | Ishidai et al. |
| 2004/0170863 A1 | 9/2004 | Kim et al. |
| 2007/0059552 A1 | 3/2007 | Takeda et al. |
| 2015/0236274 A1 | 8/2015 | Hatakeyama et al. |
| 2018/0069182 A1* | 3/2018 | Hatakeyama ........ H10K 50/167 |
| 2018/0094000 A1 | 4/2018 | Hatakeyama et al. |
| 2018/0108857 A1 | 4/2018 | Adachi et al. |
| 2018/0301629 A1 | 10/2018 | Hatakeyama et al. |
| 2019/0058124 A1 | 2/2019 | Hatakeyama et al. |
| 2019/0115538 A1 | 4/2019 | Lim et al. |
| 2019/0348617 A1 | 11/2019 | Mamada et al. |
| 2021/0159411 A1 | 5/2021 | Sim et al. |
| 2021/0273174 A1 | 9/2021 | Kuwabara et al. |
| 2021/0305512 A1 | 9/2021 | Suzaki |
| 2021/0376250 A1 | 12/2021 | Suzaki |

FOREIGN PATENT DOCUMENTS

| | | |
|---|---|---|
| CA | 3017002 A1 | 3/2019 |
| CH | 422200 A | 10/1966 |
| CN | 107417715 A | 12/2017 |
| JP | 2007-73891 A | 3/2007 |
| JP | 2012-116784 A | 6/2012 |
| JP | 5935199 B2 | 6/2016 |
| JP | 2018043984 A2 | 3/2018 |
| JP | WO2017/138526 A1 | 12/2018 |
| KR | 10-2016-0119683 A | 10/2016 |
| KR | 10-2017-0082447 A | 7/2017 |
| KR | 10-2017-0130434 A | 11/2017 |
| KR | 10-2017-0130435 A | 11/2017 |
| KR | 10-1876763 B1 | 7/2018 |
| KR | 10-1886773 B1 | 8/2018 |
| KR | 10-2018-0108604 A | 10/2018 |
| KR | 10-2018-0122298 A | 11/2018 |
| KR | 10-2019-0025065 | 3/2019 |
| KR | 10-1955647 B1 | 3/2019 |
| KR | 10-1955648 B1 | 3/2019 |
| KR | 10-2019-0042791 A | 4/2019 |
| WO | WO 2015/102118 A1 | 7/2015 |

(Continued)

OTHER PUBLICATIONS

Final Office Action for U.S. Appl. No. 16/523,168 dated Mar. 28, 2022, 24 pages.
Restriction Requirement for U.S. Appl. No. 16/523,168 dated Aug. 16, 2021, 8 pages.
U.S. Advisory Action dated May 31, 2022, issued in U.S. Appl. No. 16/523,168 (3 pages).
Anton Pershin, et al., "Highly emissive excitons with reduced exchange energy in thermally activated delayed fluorescent molecules," Nature Communications, vol. 10, No. 597, (2019), pp. 1-5.

(Continued)

*Primary Examiner* — Hui H Chin
(74) *Attorney, Agent, or Firm* — Lewis Roca Rothgerber Christie LLP

(57) ABSTRACT

An organic electroluminescence device of an embodiment includes a first electrode, an oppositely disposed second electrode, and a plurality of organic layers disposed between the first electrode and the second electrode, wherein at least one of the plurality of organic layers includes a fused polycyclic compound represented by Formula 1 and has an improved emission efficiency and long device life span:

[Formula 1]

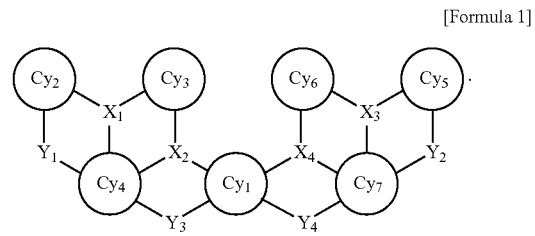

20 Claims, 2 Drawing Sheets

(56) References Cited

FOREIGN PATENT DOCUMENTS

| WO | WO 2016/152418 A1 | 9/2016 |
| WO | WO 2016/152544 A1 | 9/2016 |
| WO | WO 2016/152605 A1 | 9/2016 |
| WO | WO 2017/188111 A1 | 11/2017 |
| WO | WO 2018/212169 A1 | 11/2018 |
| WO | WO 2019/052940 A1 | 3/2019 |
| WO | WO 2021/230133 A1 | 11/2021 |
| WO | WO 2022/096495 A1 | 5/2022 |

OTHER PUBLICATIONS

Chibani et al., "Excited States of Ladder-Type TT-Conjugated Dyes with a Joint SOS-CIS(D) and PCM-TD-OFT Approach," J. Phys. Chem. A. 119—pp. 5417-5425. 2015 (Year: 2015).

Wang et al., "Synthesis of Di- and Trixanthones that Display High Stability and a Visual Fluorescence Response to Strong Acid," Chem. Asian J. 9—pp. 3307-3312. 2014 (Year: 2014).

U.S. Office Action dated Dec. 21, 2021, issued in U.S. Appl. No. 16/523,168 (25 pages).

Agou, T., et al. "Syntheses, Structure, and Optical Properties of Ladder-Type Fused Azaborines," Organic Letters 8(11), 2006, pp. 2241-2244.

Chinese Office Action dated Mar. 17, 2023 for CN Appl. No. 201910694080.8, 11 pages.

Office Action for U.S. Appl. No. 16/523,168 dated Feb. 16, 2023, 10 pages.

Zhang, J., et al. "The Ground State Spin Multiplicity of Schlenk-type Biradicals and the Influence of Additional Linkage to Ladder Type Structures" Chemical Physics 206, 1996, pp. 339-351.

WO-2021230133-A1 machine translation (Year: 2021).

U.S. Office Action dated May 17, 2023, issued in U.S. Appl. No. 17/110,108 (35 pages).

U.S. Final Office Action dated Jul. 7, 2023, issued in U.S. Appl. No. 16/523,168 (10 pages).

\* cited by examiner

ORGANIC ELECTROLUMINESCENCE DEVICE AND FUSED POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2019-0167201, filed on Dec. 13, 2019, the entire content of which is hereby incorporated by reference.

BACKGROUND

1. Field

One or more aspects of embodiments of the present disclosure relate to an organic electroluminescence device and a fused polycyclic compound used therein, and for example, to a fused polycyclic compound used as a light-emitting material and an organic electroluminescence device including the same.

2. Description of the Related Art

Organic electroluminescence display devices are actively being developed as image display devices. Different from a liquid crystal display device, an organic electroluminescence display device is a so-called self-luminescent display device in which holes and electrons respectively injected from a first electrode and a second electrode recombine in an emission layer, and a light-emitting organic compound in the emission layer emits light to attain display.

In the application of an organic electroluminescence device to a display device, a decreased driving voltage, increased emission efficiency, and increased life span are desired, and improved materials capable of stably attaining such demands for an organic electroluminescence device are desired.

Recently, in order to accomplish an organic electroluminescence device with high efficiency, materials utilizing triplet state energy phosphorescence emission, delayed fluorescence triplet-triplet annihilation (TTA) (in which singlet excitons are generated by collision of triplet excitons), and/or thermally activated delayed fluorescence (TADF) are being developed.

SUMMARY

One or more aspects of embodiments of the present disclosure are directed toward an organic electroluminescence device having improved emission efficiency.

One or more aspects of embodiments of the present disclosure are directed toward a fused polycyclic compound capable of improving the emission efficiency of an organic electroluminescence device.

One or more example embodiments of the present disclosure provide an organic electroluminescence device including a first electrode, a second electrode oppositely disposed to the first electrode, and a plurality of organic layers disposed between the first electrode and the second electrode. At least one organic layer among the plurality of organic layers may include a fused polycyclic compound represented by Formula 1:

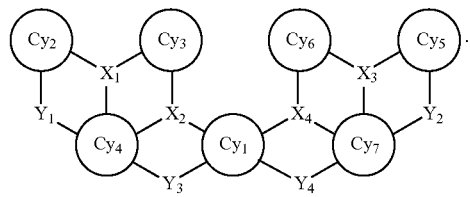

[Formula 1]

In Formula 1, $Cy_1$ to $Cy_7$ may each independently be a substituted or unsubstituted aromatic hydrocarbon ring, or a substituted or unsubstituted aromatic heterocycle, and/or may be combined with an adjacent group to form a ring, $X_1$ to $X_4$ may each independently be B or N, at least one of $X_1$ or $X_2$ may be B, at least one of $X_3$ or $X_4$ may be B, $Y_1$ and $Y_2$ may each independently be a direct linkage, O, S, or $NAr_1$, $Y_3$ and $Y_4$ may each independently be O, S, or $NAr_2$, and $Ar_1$ and $Ar_2$ may each independently be a substituted or unsubstituted aryl group of 6 to 60 carbon atoms for forming a ring, or a substituted or unsubstituted heteroaryl group of 2 to 60 carbon atoms for forming a ring.

In an embodiment, the plurality of organic layers may include a hole transport region disposed on the first electrode, an emission layer disposed on the hole transport region, and an electron transport region disposed on the emission layer. The emission layer may include the fused polycyclic compound.

In an embodiment, the emission layer may be to emit delayed fluorescence.

In an embodiment, the emission layer may be a delayed fluorescence emission layer including a host and a dopant, and the dopant may include the fused polycyclic compound.

In an embodiment, the fused polycyclic compound represented by Formula 1 may be represented by at least one of Formula 2-1 to Formula 2-5:

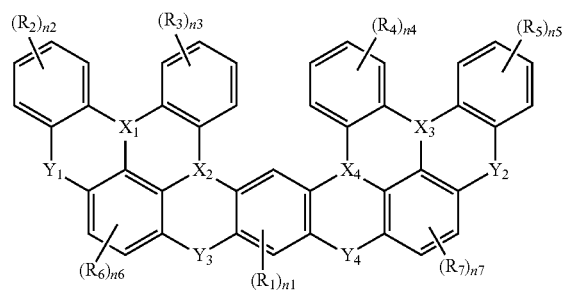

[Formula 2-1]

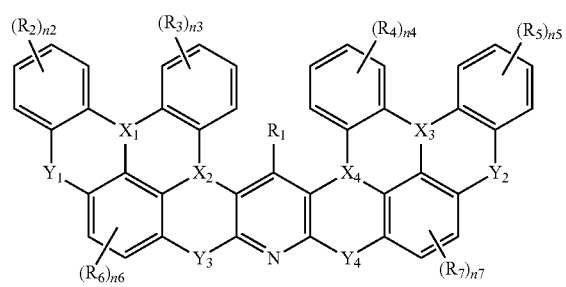

[Formula 2-2]

[Formula 2-3]

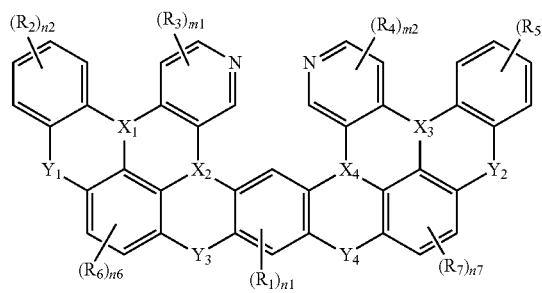

[Formula 2-4]

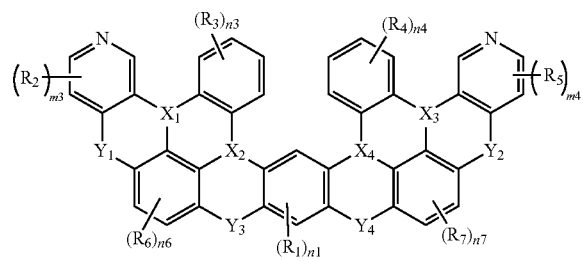

[Formula 2-5]

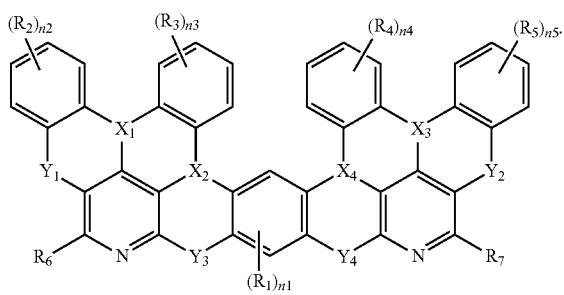

In Formulae 2-1 to 2-5, $R_1$ to $R_7$ may each independently be a hydrogen atom, a deuterium atom, a halogen atom, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 60 carbon atoms for forming a ring, or a substituted or unsubstituted heteroaryl group of 2 to 60 carbon atoms for forming a ring, and/or may be combined with an adjacent group to form a ring, "$n_1$" may be an integer of 0 to 2, "$n_2$" to "$n_5$" may each independently be an integer of 0 to 4, "$n_6$" and "$n_7$" may each independently be an integer of 0 to 2, "$m_1$" to "$m_4$" may each independently be an integer of 0 to 3, and $X_1$ to $X_4$ and $Y_1$ to $Y_4$ may each independently be the same as defined in Formula 1.

In an embodiment, the fused polycyclic compound represented by Formula 1 may be represented by at least one of Formula 3-1 or Formula 3-2:

[Formula 3-1]

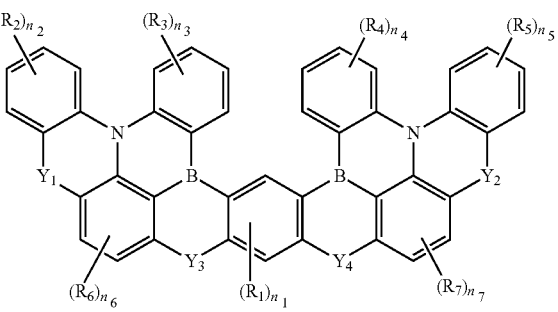

[Formula 3-2]

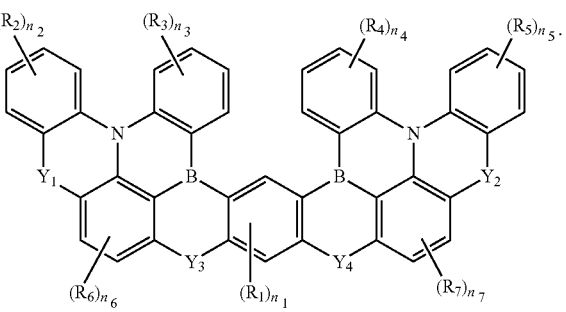

In Formula 3-1 and Formula 3-2, $Y_1$ to $Y_4$, $R_1$ to $R_7$, and "$n_1$" to "$n_7$" may each independently be the same as defined in Formula 1 and Formula 2-1 to Formula 2-5.

In an embodiment, the fused polycyclic compound represented by Formula 1 may be represented by Formula 4:

[Formula 4]

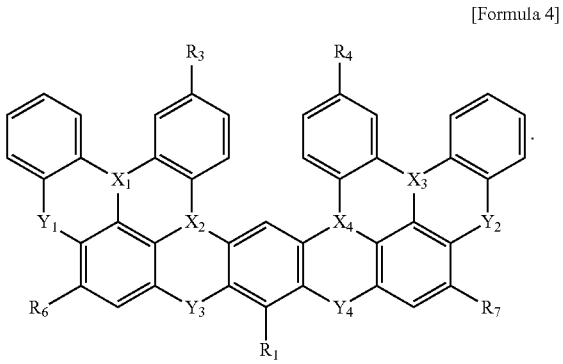

In Formula 4, $X_1$ to $X_4$, $Y_1$ to $Y_4$, $R_1$, $R_3$, $R_4$, $R_6$, and $R_7$ may each independently be the same as defined in Formula 1 and Formula 2-1 to Formula 2-5.

In an embodiment, the fused polycyclic compound represented by Formula 1 may be represented by Formula 5-1 to Formula 5-6:

[Formula 5-1]

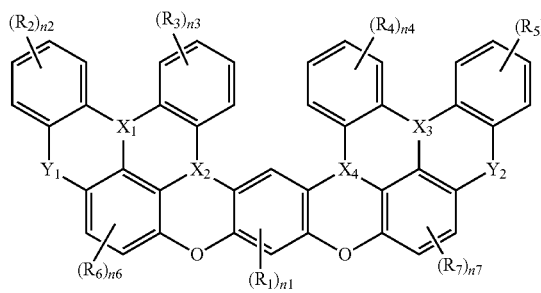

[Formula 5-2]

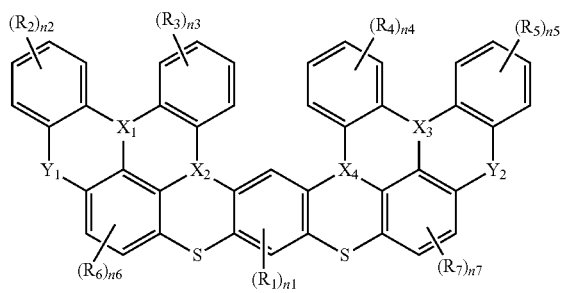

[Formula 5-3]

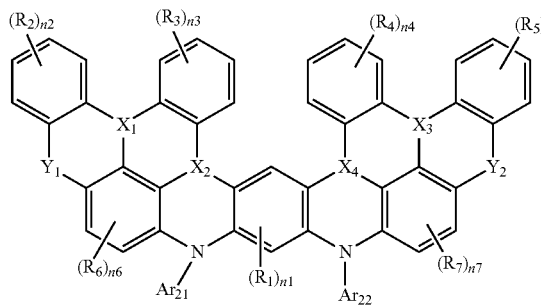

[Formula 5-4]

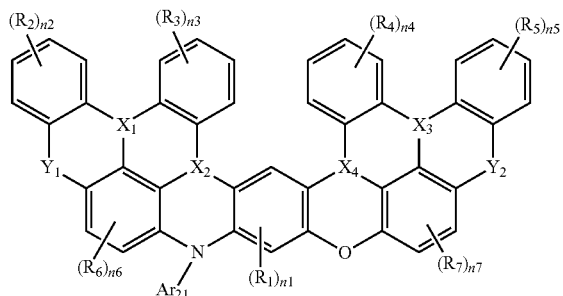

[Formula 5-5]

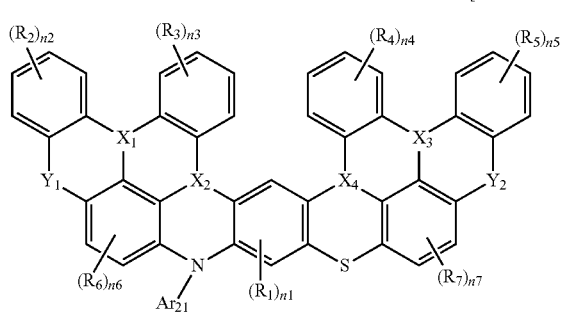

[Formula 5-6]

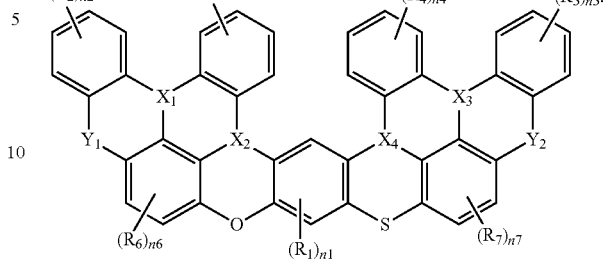

In Formula 5-1 to Formula 5-6, $Ar_{21}$ and $Ar_{22}$ may each independently be a substituted or unsubstituted aryl group of 6 to 60 carbon atoms for forming a ring, or a substituted or unsubstituted heteroaryl group of 2 to 60 carbon atoms for forming a ring, and $X_1$ to $X_4$, $Y_1$ and $Y_2$, $R_1$ to $R_7$, and "$n_1$" to "$n_7$" may each independently be the same as defined in Formula 1 and Formula 2-1 to Formula 2-5.

In an embodiment, the fused polycyclic compound represented by Formula 1 may be represented by at least one of Formula 6-1 to Formula 6-4:

[Formula 6-1]

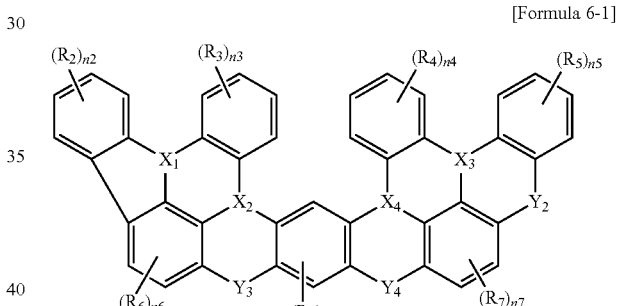

[Formula 6-2]

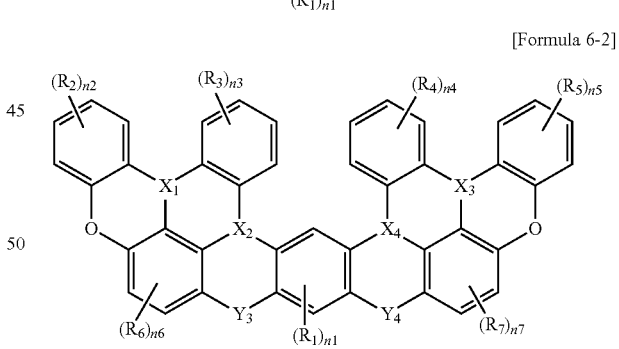

[Formula 6-3]

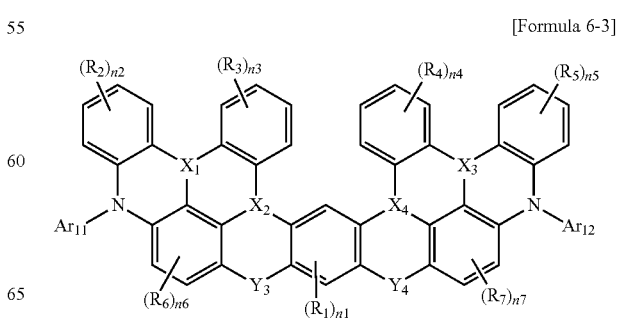

-continued

[Formula 6-4]

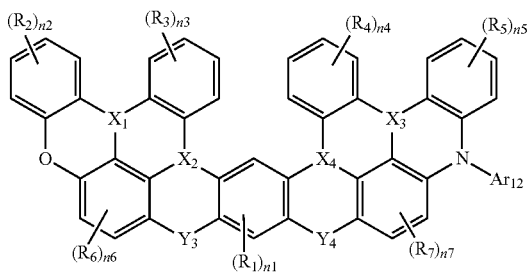

In Formula 6-1 to Formula 6-4, $Ar_{11}$ and $Ar_{12}$ may each independently be a substituted or unsubstituted aryl group of 6 to 60 carbon atoms for forming a ring, or a substituted or unsubstituted heteroaryl group of 2 to 60 carbon atoms for forming a ring, and $X_1$ to $X_4$, $Y_3$ and $Y_4$, $R_1$ to $R_7$, and "$n_1$" to "$n_7$" may each independently be the same as defined in Formula 1 and Formula 2-1 to Formula 2-5.

In an embodiment, $R_1$ to $R_7$ may each independently be a hydrogen atom, a substituted or unsubstituted methyl group, a substituted or unsubstituted isopropyl group, a substituted or unsubstituted arylamine group, a substituted or unsubstituted phenyl group, a substituted or unsubstituted pyridine group, a substituted or unsubstituted pyrimidine group, or a substituted or unsubstituted pyrazine group.

In an embodiment, $Ar_1$ and $Ar_2$ may each independently be a substituted or unsubstituted phenyl group, or a substituted or unsubstituted pyridine group.

In an embodiment, at least one of $R_1$ to $R_3$ may be a deuterium atom, a deuterium-substituted alkyl group of 1 to 20 carbon atoms, a deuterium-substituted alkenyl group of 2 to 20 carbon atoms, a deuterium-substituted aryl group of 6 to 30 carbon atoms for forming a ring, or a deuterium-substituted heteroaryl group of 2 to 30 carbon atoms for forming a ring.

In an embodiment, the first electrode and the second electrode may each independently comprise at least one selected from silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), indium (In), tin (Sn), and zinc (Zn), a compound of two or more thereof, a mixture of two or more thereof, or an oxide of one or more thereof.

One or more example embodiments of the present disclosure provide a fused polycyclic compound represented by Formula 1.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
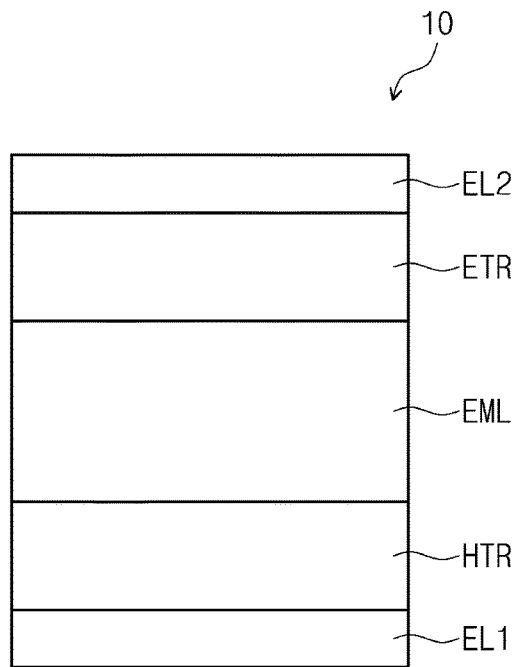
FIG. 1 is a schematic cross-sectional view illustrating an organic electroluminescence device according to an embodiment of the present disclosure.

The above objects, other objects, features, and advantages of the present disclosure will be easily understood from example embodiments described with reference to the accompanying drawings. The present disclosure may, however, be embodied in different forms and should not be construed as being limited to the embodiments set forth herein. Rather, example embodiments are provided so that the contents disclosed herein will be thorough and complete, and the spirit of the present disclosure may be sufficiently described to a person skilled in the art.

Like reference numerals refer to like elements throughout, and duplicative descriptions thereof may not be provided. In the drawings, the sizes of elements may be enlarged for clarity of the present disclosure. It will be understood that although the terms "first," "second," etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "includes," "including," "comprises," and/or "comprising," when used in this specification, specify the presence of stated features, numerals, steps, operations, elements, parts, or a combination thereof, but do not preclude the presence or addition of one or more other features, numerals, steps, operations, elements, parts, or a combination thereof. It will also be understood that when a layer, a film, a region, a plate, etc. is referred to as being "on" another part, it can be "directly on" the other part, or intervening layers may also be present. In contrast, when a layer, a film, a region, a plate, etc. is referred to as being "under" another part, it can be "directly under" the other part, or intervening layers may also be present.

As used herein, the singular forms "a," "an," and "the" are intended to include the plural forms as well, unless the context clearly indicates otherwise. As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items. Further, the use of "may" when describing embodiments of the present disclosure refers to "one or more embodiments of the present disclosure".

Hereinafter, an organic electroluminescence device according to an embodiment of the present disclosure and a fused polycyclic compound of an embodiment included therein will be explained with reference to attached drawings.

FIGS. 1 to 4 are schematic cross-sectional views showing organic electroluminescence devices according to example embodiments of the present disclosure. Referring to FIGS. 1 to 4, in an organic electroluminescence device 10 according to an embodiment, a first electrode EL1 and a second electrode EL2 are oppositely disposed, and between the first electrode EL1 and the second electrode EL2, a plurality of organic layers may be disposed. The plurality of organic layers may include a hole transport region HTR, an emission layer EML, and an electron transport region ETR. For example, the organic electroluminescence device 10 of an embodiment may include a first electrode EL1, a hole transport region HTR, an emission layer EML, an electron transport region ETR, and a second electrode, laminated one by one. In some embodiments, a capping layer CPL may be further disposed on the second electrode EL2.

The organic electroluminescence device 10 of an embodiment may include a polycyclic compound of an embodiment, which will be explained later, in at least one organic layer among the plurality of the organic layers disposed between the first electrode EL1 and the second electrode EL2. For example, the organic electroluminescence device 10 of an embodiment may include a polycyclic compound of an embodiment, in the emission layer EML disposed between the first electrode EL1 and the second electrode EL2. However, embodiments of the present disclosure are not limited thereto, and the organic electroluminescence device 10 of an embodiment may include a polycyclic compound of an embodiment, in at least one organic layer included in the hole transport region HTR and the electron transport region ETR (which are among the plurality of the organic layers disposed between the first electrode EL1 and the second electrode EL2 in addition to the emission layer EML), or in the capping layer CPL disposed on the second electrode EL2.

Figure 2:
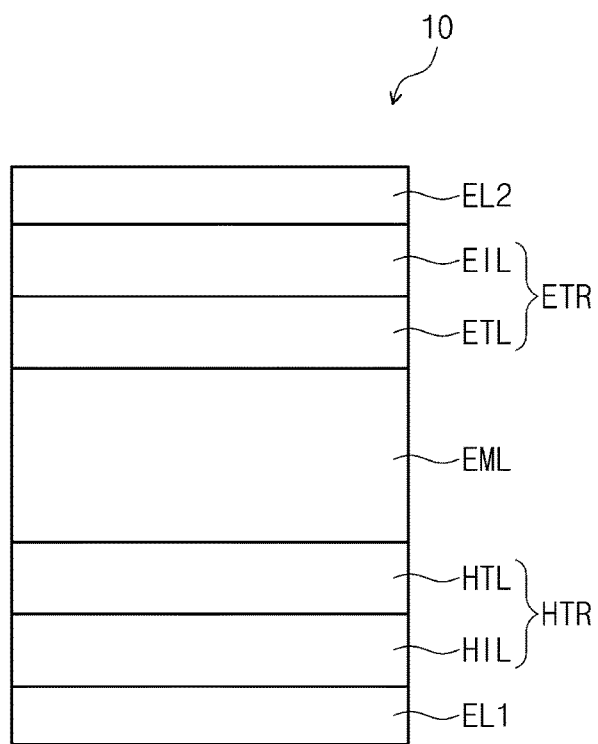
FIG. 2 is a schematic cross-sectional view illustrating an organic electroluminescence device according to an embodiment of the present disclosure.
Figure 3:
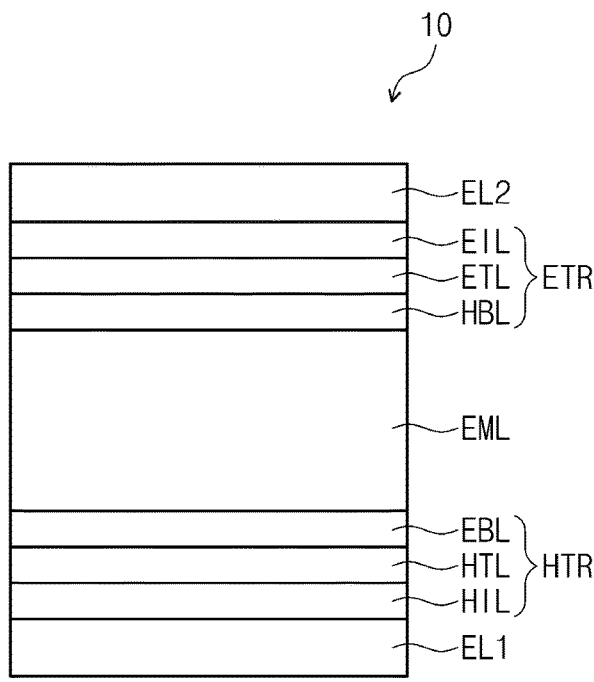
FIG. 3 is a schematic cross-sectional view illustrating an organic electroluminescence device according to an embodiment of the present disclosure.
Figure 4:
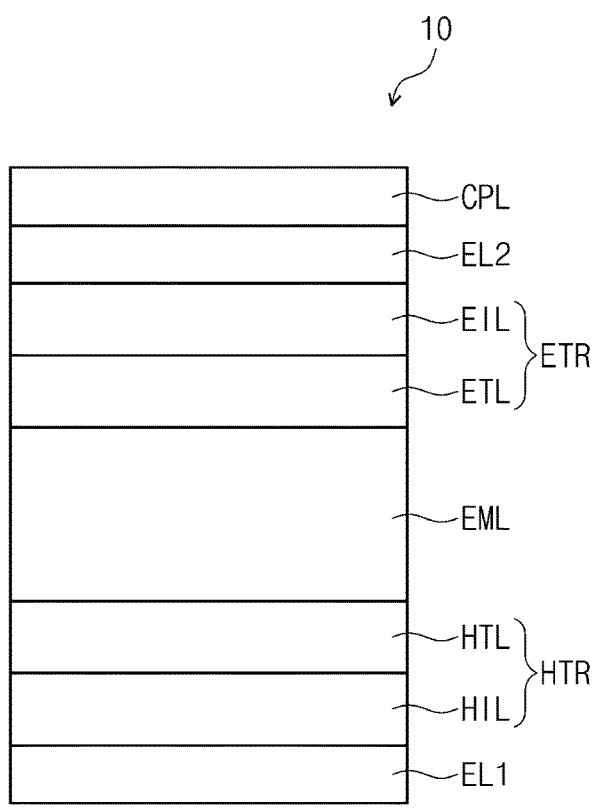
FIG. 4 is a c schematic ross-sectional view illustrating an organic electroluminescence device according to an embodiment of the present disclosure.

Compared with FIG. 1, FIG. 2 shows a cross-sectional view of an organic electroluminescence device 10 of an embodiment, wherein the hole transport region HTR includes a hole injection layer HIL and a hole transport layer HTL, and the electron transport region ETR includes an electron injection layer EIL and an electron transport layer ETL. Compared with FIG. 1, FIG. 3 shows a cross-sectional view of an organic electroluminescence device 10 of an embodiment, wherein the hole transport region HTR includes the hole injection layer HIL, the hole transport layer HTL, and an electron blocking layer EBL, and the electron transport region ETR includes the electron injection layer EIL, the electron transport layer ETL, and a hole blocking layer HBL. Compared with FIG. 2, FIG. 4 shows a cross-sectional view of an organic electroluminescence device 10 of an embodiment including a capping layer CPL disposed on the second electrode EL2.

Hereinafter, in explaining the organic electroluminescence device 10 of an embodiment, the emission layer EML is described as including a polycyclic compound according to an embodiment (which will be explained later), but embodiments of the present disclosure are not limited thereto. The polycyclic compound according to an embodiment, which will be explained layer, may be included in the hole transport region HTR, electron transport region ETR, and/or capping layer CPL.

The first electrode EL1 may have conductivity. The first electrode EL1 may be formed using a metal alloy and/or a conductive compound. The first electrode EU may be an anode. The first electrode EL1 may be a pixel electrode. The first electrode EL1 may be a transmissive electrode, a transflective electrode, or a reflective electrode.

When the first electrode EL1 is the transmissive electrode, the first electrode EL1 may be formed using a transparent metal oxide (such as indium tin oxide (ITO), indium zinc oxide (IZO), zinc oxide (ZnO), and/or indium tin zinc oxide (ITZO)). When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), a compound thereof, or a mixture thereof (for example, a mixture of Ag and Mg). In some embodiments, the first electrode EU may have a structure including a plurality of layers including a reflective layer or a transflective layer formed using the above materials, and a transmissive conductive layer formed using ITO, IZO, ZnO, and/or ITZO. For example, the first electrode EL1 may include a three-layer structure of ITO/Ag/ITO. However, embodiments of the present disclosure are not limited thereto. The thickness of the first electrode EL1 may be about 1,000 Å to about 10,000 Å, for example, about 1,000 Å to about 3,000 Å.

The hole transport region HTR is disposed on the first electrode EL1. The hole transport region HTR may include at least one of a hole injection layer HIL, a hole transport layer HTL, a hole buffer layer, or an electron blocking layer EBL. The thickness of the hole transport region HTR may be about 50 Å to about 1,500 Å.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer of a hole injection layer HIL or a hole transport layer HTL, or may have a structure of a single layer formed using a hole injection material and a hole transport material. In some embodiments, the hole transport region HTR may have a structure of a single layer formed using a plurality of different materials, or a structure laminated from the first electrode EL1 of hole injection layer HIL/hole transport layer HTL, hole injection layer HIL/hole transport layer HTL/hole buffer layer (not shown), hole injection layer HIL/hole buffer layer, hole transport layer HTL/hole buffer layer, or hole injection layer HIL/hole transport layer HTL/electron blocking layer EBL, without limitation.

The hole transport region HTR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

The hole injection layer HIL may include, for example, a phthalocyanine compound (such as copper phthalocyanine), N,N'-diphenyl-N,N'-bis-[4-(phenyl-m-tolyl-amino)-phenyl]-phenyl-4,4'-diamine (DNTPD), 4,4',4''-[tris(3-methylphenyl)phenylamino] triphenylamine (m-MTDATA), 4,4', 4''-tris(N,N-diphenylamino)triphenylamine (TDATA), 4,4', 4''-tris{N,-2-naphthyl)-N-phenylamino}-triphenylamine (2-TNATA), poly(3,4-ethylene dioxythiophene)/poly(4-styrene sulfonate) (PEDOT/PSS), polyaniline/dodecylbenzene sulfonic acid (PANI/DBSA), polyaniline/camphor sulfonic acid (PANI/CSA), polyaniline/poly(4-styrene sulfonate) (PANI/PSS), N,N'-di(naphthalen-1-yl)-N,N'-diphenyl-benzidine (NPB), N,N'-di(1-naphthyl)-N,N''-diphenyl-(1,1''-biphenyl)-4,4''-diamine (NPD), triphenylamine-containing polyether ketone (TPAPEK), 4-isopropyl-4'-methyldiphenyliodonium [tetrakis(pentafluorophenyl)borate], and dipyrazino[2,3-f:2',3'-h]quinoxaline-2,3,6,7,10,11-hexacarbonitrile (HAT-CN).

The hole transport layer HTL may include, for example, carbazole derivatives (such as N-phenyl carbazole and/or polyvinyl carbazole), fluorene-based derivatives, N,N'-bis (3-methylphenyl)-N,N'-diphenyl-[1,1-biphenyl]-4,4'-diamine (TPD), triphenylamine-based derivatives (such as 4,4',4''-tris(N-carbazolyl)triphenylamine (TCTA)), N,N'-di (1-naphthalene-1-yl)-N,N'-diphenyl-benzidine (NPB), 4,4'-cyclohexylidene bis[N,N-bis(4-methylphenyl)benzenamine (TAPC), 4,4'-bis[N,N'-(3-tolyl)amino]-3,3'-dimethylbiphenyl (HMTPD), 1,3-bis(N-carbazolyl)benzene (mCP), 9-(4-tert-butylphenyl)-3,6-bis(triphenylsilyl)-9H-carbazole (CzSi), etc.

The thickness of the hole transport region HTR may be about 100 Å to about 10,000 Å, for example, about 100 Å to about 5,000 Å. The thickness of the hole injection region HIL may be, for example, about 30 Å to about 1,000 Å, and the thickness of the hole transport layer HTL may be about 30 Å to about 1,000 Å. For example, the thickness of the electron blocking layer EBL may be about 10 Å to about 1,000 Å. When the thicknesses of the hole transport region HTR, the hole injection layer HIL, the hole transport layer HTL, and the electron blocking layer EBL satisfy the above-described ranges, satisfactory hole transport properties may be achieved without substantial increase of a driving voltage.

The hole transport region HTR may further include a charge generating material in addition to the above-described materials to increase conductivity. The charge generating material may be dispersed substantially uniformly or non-uniformly in the hole transport region HTR. The charge generating material may be, for example, a p-dopant. The p-dopant may be a quinone derivative, metal oxide, or cyano group-containing compound, without limitation. Non-limiting examples of the p-dopant include quinone derivatives (such as tetracyanoquinodimethane (TCNQ) and/or 2,3,5,6-tetrafluoro-7,7',8,8'-tetracyanoquinodimethane (F4-TCNQ)), and metal oxides (such as tungsten oxide and/or molybdenum oxide).

The hole transport region HTR may further include at least one of a hole butter layer or an electron blocking layer EBL in addition to the hole injection layer HIL and the hole transport layer HTL. The hole buffer layer may compensate for an optical resonance distance of the wavelength of light emitted from an emission layer EML and may increase hole emission efficiency. Materials that may be included in the hole transport region HTR may also be used in the hole buffer layer. The electron blocking layer EBL may prevent or reduce electron injection from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed using a single material, a single layer formed using a plurality of different materials, or a multi-layer structure having a plurality of layers formed using a plurality of different materials.

In the organic electroluminescence device 10 of an embodiment, the emission layer EML may include the fused polycyclic compound of an embodiment.

In the description, the term "substituted or unsubstituted" refers to a state of being unsubstituted, or substituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the example substituents may be substituted or unsubstituted. For example, a biphenyl group may be interpreted as a named aryl group or as a phenyl group substituted with a phenyl group.

In the description, the term "forming a ring via combination with an adjacent group" may refer to forming a substituted or unsubstituted hydrocarbon ring, or a substituted or unsubstituted heterocycle via combination with an adjacent group. The hydrocarbon ring may be an aliphatic hydrocarbon ring or an aromatic hydrocarbon ring. The heterocycle may be an aliphatic heterocycle or an aromatic heterocycle. The ring formed by combination with an adjacent group may be a monocyclic ring or a polycyclic ring. In addition, the ring formed via combination with an adjacent group may be further combined with another ring to form a spiro structure.

In the description, the term "adjacent group" may refer to a substituent on the same atom or point, a substituent on an atom that is directly connected to the base atom or point, or a substituent sterically positioned (e.g., within intramolecular bonding distance) to the corresponding substituent. For example, in 1,2-dimethylbenzene, two methyl groups may be interpreted as "adjacent groups" to each other, and in 1,1-diethylcyclopentane, two ethyl groups may be interpreted as "adjacent groups" to each other.

In the description, the term "direct linkage" may refer to a single bond.

In the description, the halogen atom may be a fluorine atom, a chlorine atom, a bromine atom, or an iodine atom.

In the description, the term "alkyl group" may refer to a linear, branched or cyclic type. The carbon number of the alkyl may be 1 to 50, 1 to 30, 1 to 20, 1 to 10, or 1 to 6. Non-limiting examples of the alkyl include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc.

In the description, the term "alkenyl group" may refer to a hydrocarbon group including one or more carbon-carbon double bonds in the middle of or at a terminal end of an alkyl group including 2 or more carbon atoms. The alkenyl group may be a linear chain or a branched chain. The carbon number is not specifically limited, but may be 2 to 30, 2 to 20 or 2 to 10. Non-limiting examples of the alkenyl group include a vinyl group, a 1-butenyl group, a 1-pentenyl group, a 1,3-butadienyl aryl group, a styrenyl group, a styrylvinyl group, etc.

In the description, the hydrocarbon ring may be an aliphatic hydrocarbon ring or an aromatic hydrocarbon ring. A "heterocycle" may be an aliphatic heterocycle or an aromatic heterocycle. The hydrocarbon ring and the heterocycle may each independently be monocyclic or polycyclic.

In the description, the hydrocarbon ring may be an optional functional group or substituent derived from an aliphatic hydrocarbon ring, or an optional functional group or substituent derived from an aromatic hydrocarbon ring. The carbon number of the hydrocarbon ring for forming a ring may be 5 to 60.

In the description, the heterocyclic group may be an optional functional group or substituent derived from a heterocycle including at least one heteroatom as a ring-forming element. The carbon number of the heterocyclic group for forming a ring may be 5 to 60.

In the description, the term "aryl group" may refer to an optional functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Non-limiting examples of the aryl group include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc.

In the description, the fluorenyl group may be substituted, and two substituents (e.g., at the 9H position) may be combined with each other to form a spiro structure. Non-limiting examples of a substituted fluorenyl group are as follows. However, embodiments of the present disclosure are not limited thereto:

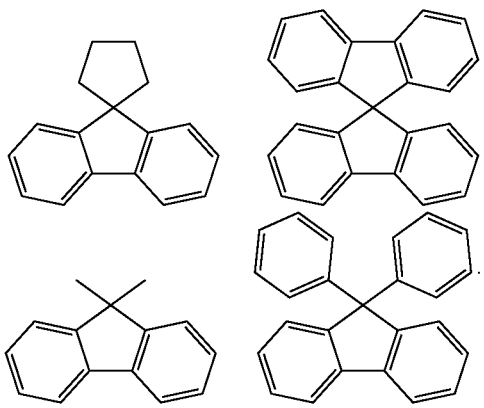

In the description, the heteroaryl group may include at least one of boron (B), oxygen (O), nitrogen (N), phosphorus (P), silicon (Si), or sulfur (S) as heteroatoms. When the heteroaryl includes two or more heteroatoms, the two or more heteroatoms may be the same or different. The heteroaryl may be a monocyclic heteroaryl or a polycyclic heteroaryl. The carbon number for forming a ring of the heteroaryl may be 2 to 30, 2 to 20, or 2 to 10. Non-limiting examples of the heteroaryl include thiophene, furan, pyrrole, imidazole, thiazole, oxazole, oxadiazole, triazole, pyridine, bipyridine, pyrimidine, triazine, triazole, acridyl, pyridazine, pyrazine, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzimidazole, benzothiazole, benzocarbazole, benzothiophene, dibenzothiophene, thienothiophene, benzofuran, phenanthroline, thiazole, isooxazole, oxadiazole, thiadiazole, phenothiazine, dibenzosilole, dibenzofuran, etc.

In the description, the silyl group may be an alkylsilyl group or an arylsilyl group. Non-limiting examples of the silyl group include trimethylsilyl, triethylsilyl, t-butyldimethylsilyl, vinyldimethylsilyl, propyldimethylsilyl, triphenylsilyl, diphenylsilyl, phenylsilyl, etc. However, embodiments of the present disclosure are not limited thereto.

In the description, the boron group may bean alkyl boron group or an aryl boron group. Non-limiting examples of the boron group include a trimethylboron group, a triethylboron group, a t-butyldimethylboron group, a triphenylboron group, a diphenylboron group, a phenylboron group, etc.

In the description, the carbon number of the amine group is not specifically limited, but may be 1 to 30. The amine group may include an alkyl amine group and an aryl amine group. Non-limiting examples of the amine group include a methylamine group, a dimethylamine group, a phenylamine group, a naphthylamine group, a 9-methyl-anthracenylamine group, a triphenylamine group, etc.

In the description, the term "hydrocarbon ring" refers to an optional functional group or substituent derived from an aliphatic hydrocarbon ring. The hydrocarbon ring may be a saturated hydrocarbon ring of 5 to 20 carbon atoms for forming a ring.

In the description, the heterocyclic group may include at least one of B, O, N, P, Si and S as heteroatoms. When the heterocyclic group includes two or more heteroatoms, the two or more heteroatoms may be the same or different. The heterocyclic group may be a monocyclic heterocyclic group or a polycyclic heterocyclic group, and in some embodiments may be a heteroaryl group. The carbon number for forming a ring of the heterocyclic group may be 2 to 30, 2 to 20, or 2 to 10.

The fused polycyclic compound of an embodiment includes two fused polycyclic heterocycles, wherein each fused polycyclic heterocycle includes five fused rings, at least one boron atom, and at least one nitrogen atom, and the two fused polycyclic heterocycles may be connected via an intervening five- or six-membered aromatic ring as a linker. A heteroatom (such as an oxygen atom, a hydrogen atom, and/or a nitrogen atom) may be positioned as an additional connecting group between the two fused polycyclic heterocycles and the five- or six-membered aromatic ring linker.

The fused polycyclic compound of an embodiment may be represented by
Formula 1:

[Formula 1]

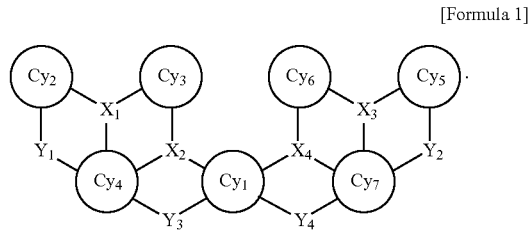

in Formula 1, $Cy_1$ to $Cy_7$ may each independently be a substituted or unsubstituted aromatic hydrocarbon ring, or a substituted or unsubstituted aromatic heterocycle, and/or may be combined with an adjacent group to form a ring. $Cy_1$ to $Cy_7$ may each independently be a substituted or unsubstituted five-member or six-member aromatic hydrocarbon ring, or a substituted or unsubstituted five-member or six-member aromatic heterocycle. For example, $Cy_1$ to $Cy_7$ may each independently be a substituted or unsubstituted benzene ring, or a substituted or unsubstituted pyridine ring. The substituents on each of $Cy_1$ to $Cy_7$ may each independently be, for example, a hydrogen atom, a deuterium atom, a halogen atom, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 60 carbon atoms for forming a ring, or a substituted or unsubstituted heteroaryl group of 2 to 60 carbon atoms for forming a ring. In some embodiments, the substituents on each of $Cy_1$ to $Cy_7$ may be combined with an adjacent group to form a ring.

In Formula 1, $X_1$ to $X_4$ may each independently be B or N. At least one of $X_1$ or $X_2$ may be B, and at least one of $X_3$ or $X_4$ may be B. At least one of $X_1$ or $X_2$ may be B, and the remaining one may be N. At least one of $X_3$ or $X_4$ may be B, and the remaining one may be N. In an embodiment, $X_1$ and $X_3$ may be B, and $X_2$ and $X_4$ may be N. In some embodiments, $X_1$ and $X_4$ may be B, and $X_2$ and $X_3$ may be N.

In Formula 1, $Y_1$ and $Y_2$ may each independently be a direct linkage, O, S, or $NAr_1$. $Y_3$ and $Y_4$ may each independently be O, S, or $NAr_2$. In an embodiment, $Y_1$ and $Y_2$ may be the same. In an embodiment, $Y_3$ and $Y_4$ may be the same or different. In some embodiments for example, $Y_3$ may be O, and $Y_4$ may be S. In some embodiments, $Y_3$ may be O or S, and $Y_4$ may be $NAr_2$.

In Formula 1, $Ar_1$ and $Ar_2$ may each independently be a substituted or unsubstituted aryl group of 6 to 60 carbon atoms for forming a ring, or a substituted or unsubstituted heteroaryl group of 2 to 60 carbon atoms for forming a ring. For example, $Ar_1$ and $Ar_2$ may each independently be a substituted or unsubstituted phenyl group, or a substituted or unsubstituted pyridine group. When a plurality of $Ar_1$ and/or $Ar_2$ are present in the fused polycyclic compound represented by Formula 1, each of the plurality of $Ar_1$ and/or $Ar_2$ may be the same or different.

Compared with a conventional polycyclic compound including a nitrogen atom and a boron atom in a core, the fused polycyclic compound of an embodiment includes two fused polycyclic heterocycles, each including at least one boron atom, one nitrogen atom, and five fused rings. The two fused polycyclic heterocycles are connected via a five-member or six-member aromatic ring as a linker, and includes a structure in which a heteroatom such as an oxygen atom, a sulfur atom, and/or a nitrogen atom are provided as additional connecting groups between the two fused polycyclic heterocycles and the five-member or six-member aromatic ring linker. The fused polycyclic compound of an embodiment includes two or more boron atoms, and the positions of the boron atoms, heteroatoms and aromatic rings may be optimized or suitable within the structure of Formula 1. Accordingly, the fused polycyclic compound may have a suitable full width at half maximum and wavelength range as a blue light-emitting material, and when the fused polycyclic compound is applied to a luminescence device, the life of the luminescence device may be improved.

The fused polycyclic compound represented by Formula 1 may be represented by at least one of Formula 2-1 to Formula 2-5:

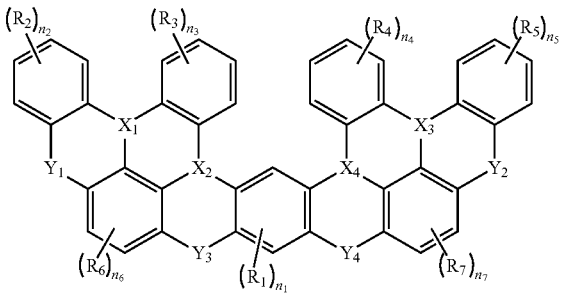

[Formula 2-1]

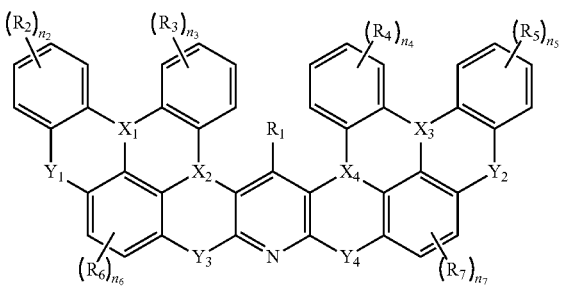

[Formula 2-2]

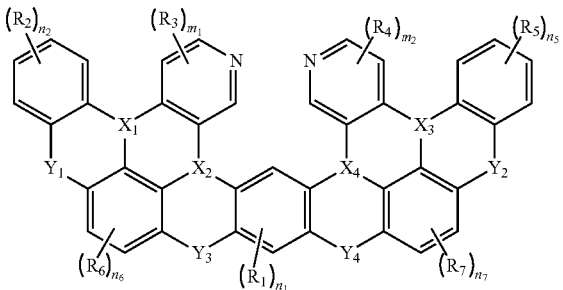

[Formula 2-3]

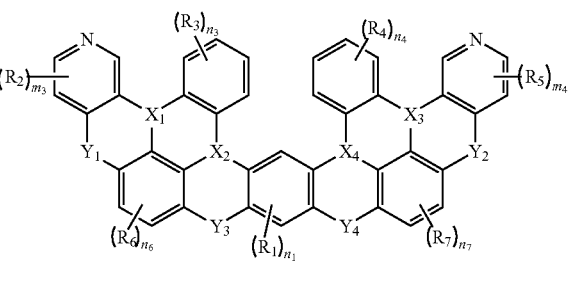

[Formula 2-4]

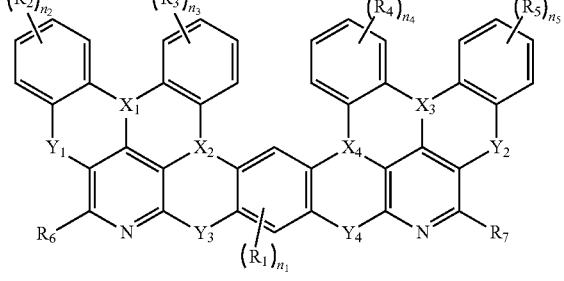

[Formula 2-5]

Formulae 2-1 to 2-5 represent embodiments in which $Cy_1$ to $Cy_7$ in Formula 1 are substituted or unsubstituted benzene rings or substituted or unsubstituted pyridine rings.

In Formulae 2-1 to 2-5, $R_1$ to $R_7$ may each independently be a hydrogen atom, a deuterium atom, a halogen atom, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 60 carbon atoms for forming a ring, or a substituted or unsubstituted heteroaryl group of 2 to 60 carbon atoms for forming a ring, and/or may be combined with an adjacent group to form a ring. For example, $R_1$ to $R_7$ may each independently be a hydrogen atom, a substituted or unsubstituted methyl group, a substituted or unsubstituted isopropyl group, a substituted or unsubstituted arylamine group, a substituted or unsubstituted phenyl group, a substituted or unsubstituted pyridine group, a substituted or unsubstituted pyrimidine group, or a substituted or unsubstituted pyrazine group. $R_1$ to $R_7$ may each independently be a hydrogen atom, an unsubstituted methyl group, an unsubstituted isopropyl group, an unsubstituted diphenylamine group, an unsubstituted phenyl group, an unsubstituted pyridine group, an unsubstituted pyrimidine group, or an unsubstituted pyrazine group.

At least one of $R_1$ to $R_3$ may be a deuterium atom or a deuterated substituent. At least one of $R_1$ to $R_3$ may be a deuterium atom, a deuterium-substituted alkyl group of 1 to 20 carbon atoms, a deuterium-substituted alkenyl group of 2 to 20 carbon atoms, a deuterium-substituted aryl group of 6 to 30 carbon atoms for forming a ring, or a deuterium-substituted heteroaryl group of 2 to 30 carbon atoms. In an embodiment, $R_1$ may be a deuterium-substituted phenyl group (e.g., a deuterated phenyl group).

In Formula 2-1 to Formula 2-5, "$n_1$" may be an integer of 0 to 2. "$n_2$" to "$n_5$" may each independently be an integer of 0 to 4. "$n_6$" and "$n_7$" may each independently be an integer of 0 to 2. "$m_1$" to "$m_4$" may each independently be an integer of 0 to 3. When each of "$n_1$" to "$n_7$", and "$m_1$" to "$m_4$" are 0, the fused polycyclic compound of an embodiment may be unsubstituted. When each of "$n_1$" to "$n_7$", and "$m_1$" to "$m_4$" is an integer of 2 or more, all of the substituents may be the same, or at least one of the substituents may be different.

In Formula 2-1 to Formula 2-5, $X_1$ to $X_4$ and $Y_1$ to $Y_4$ may each independently be the same as described in connection with Formula 1.

The fused polycyclic compound represented by Formula 1 may be represented by at least one of Formula 3-1 or Formula 3-2:

[Formula 3-1]

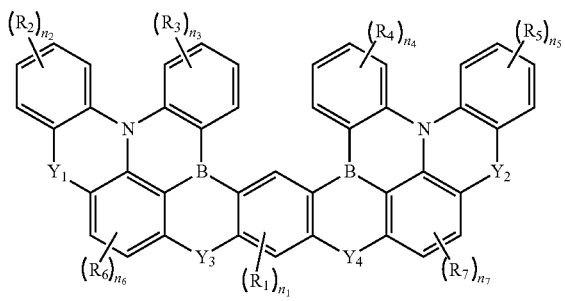

[Formula 3-2]

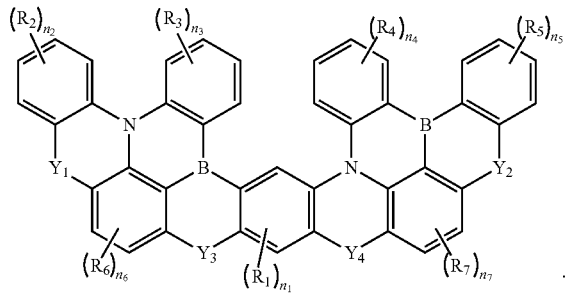

Formula 3-1 and Formula 3-2 represent embodiments in which $X_1$ to $X_4$ in Formula 2-1 are specified to be B or N.

In Formula 3-1 and Formula 3-2, $Y_1$ to $Y_4$, $R_1$ to $R_7$, and "$n_1$" to "$n_7$" may each independently be the same as described in connection with Formula 1 and Formula 2-1 to Formula 2-5.

The fused polycyclic compound represented by Formula 1 may be represented by Formula 4:

[Formula 4]

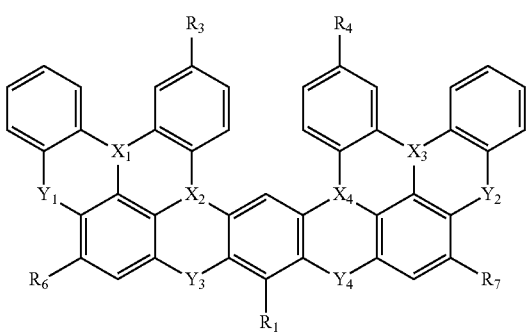

Formula 4 represents an embodiment in which the numbers and positions of substituents of $R_1$ to $R_7$ in Formula 2-1 are specified.

In Formula 4, $X_1$ to $X_4$, $Y_1$ to $Y_4$, $R_1$, $R_3$, $R_4$, $R_6$, and $R_7$ may each independently be the same as described in connection with Formula 1 and Formula 2-1 to Formula 2-5.

The fused polycyclic compound represented by Formula 1 may be represented by at least one of Formula 5-1 to Formula 5-6:

[Formula 5-1]

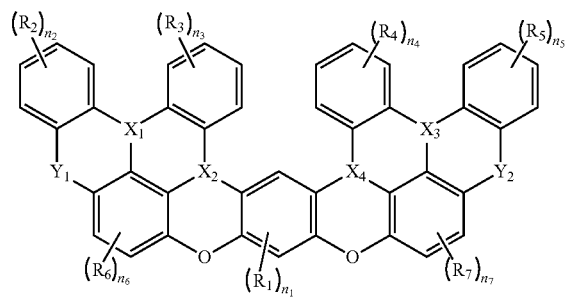

[Formula 5-2]

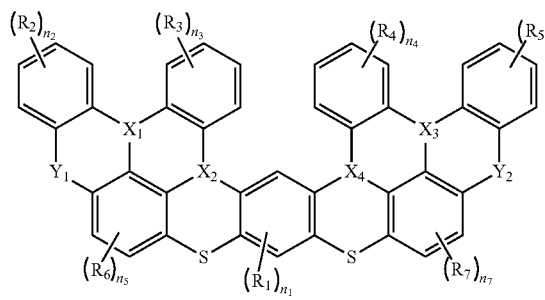

[Formula 5-3]

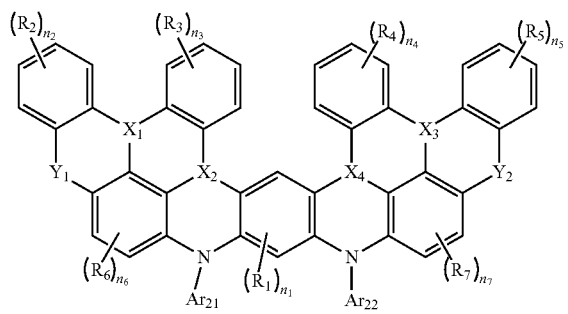

[Formula 5-4]

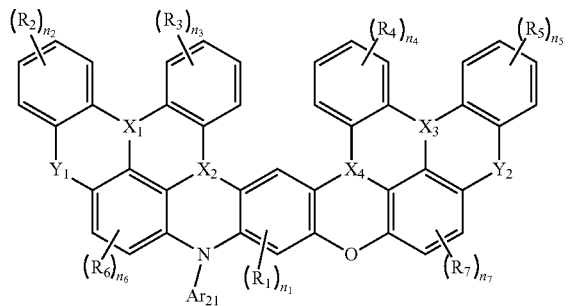

[Formula 5-5]

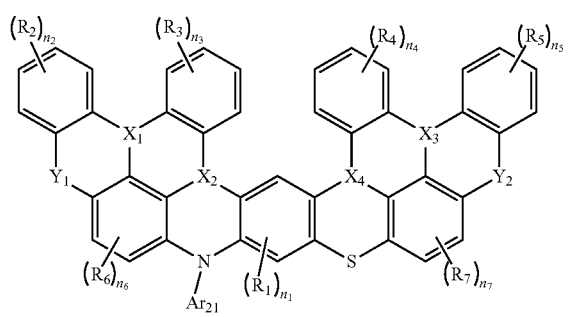

[Formula 5-6]

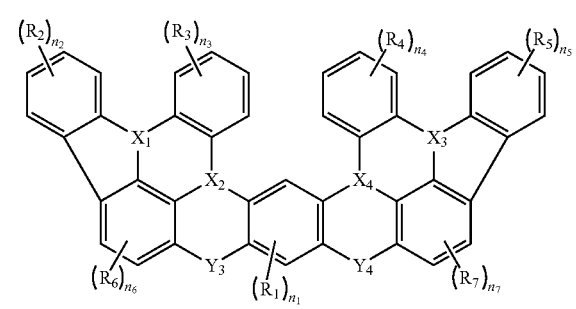

Formulae 5-1 to 5-6 represent embodiments in which $Y_3$ and $Y_4$ in Formula 2-1 are specified to be one of O, S, and $NAr_2$.

In Formulae 5-1 to 5-6, $Ar_{21}$ and $Ar_{22}$ may each independently be a substituted or unsubstituted aryl group of 6 to 60 carbon atoms for forming a ring, or a substituted or unsubstituted heteroaryl group of 2 to 60 carbon atoms for forming a ring. For example, $Ar_{21}$ and $Ar_{22}$ may each independently be a substituted or unsubstituted phenyl group, or a substituted or unsubstituted pyridine group.

In Formula 5-1 to Formula 5-6, $X_1$ to $X_4$, $Y_1$ and $Y_2$, $R_1$ to $R_7$, and "$n_1$" to "$n_7$" may each independently be the same as described in connection with Formula 1 and Formula 2-1 to Formula 2-5.

The fused polycyclic compound represented by Formula 1 may be represented by Formula 6-1 to Formula 6-4:

[Formula 6-1]

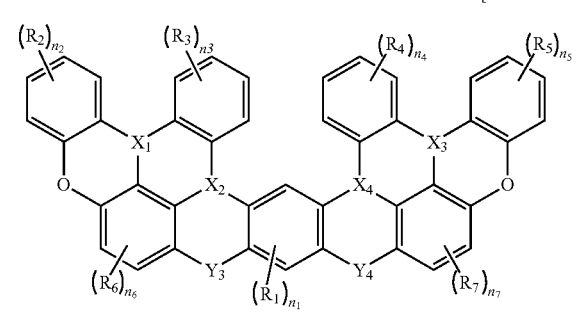

[Formula 6-2]

-continued

[Formula 6-3]

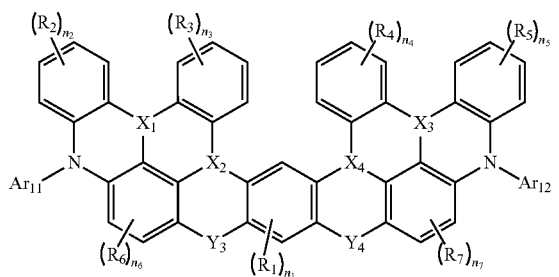

[Formula 6-4]

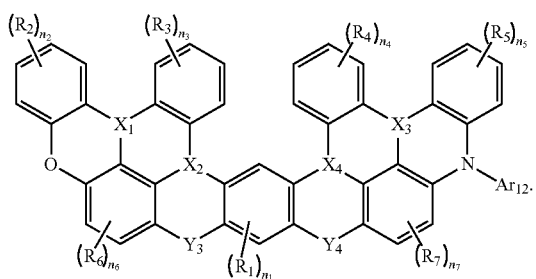

Formulae 6-1 to 6-4 represent embodiments in which $Y_1$ and $Y_2$ in Formula 2-1 are specified to be a direct linkage, O, S, or $NAr_1$.

In Formulae 6-1 to 6-4, $Ar_{11}$ and $Ar_{12}$ may each independently be a substituted or unsubstituted aryl group of 6 to 60 carbon atoms for forming a ring, or a substituted or unsubstituted heteroaryl group of 2 to 60 carbon atoms for forming a ring. For example, $Ar_{11}$ and $Ar_{12}$ may each independently be a substituted or unsubstituted phenyl group, or a substituted or unsubstituted pyridine group.

In Formula 6-1 to Formula 6-4, $X_1$ to $X_4$, $Y_3$ and $Y_4$, $R_1$ to $R_7$, and "$n_1$" to "$n_7$" may each independently be the same as described in connection with Formula 1 and Formula 2-1 to Formula 2-5.

The fused polycyclic compound of an embodiment may be at least one selected from the compounds represented in the following Compound Groups. An organic electroluminescence device 10 of an embodiment may include at least one fused polycyclic compound selected from the compounds represented in Compound Group A to Compound Group G in an emission layer EML:

[Compound Group A]

A-1

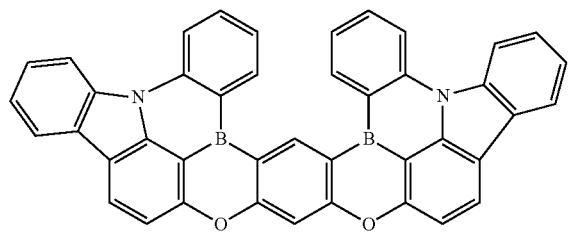

A-2

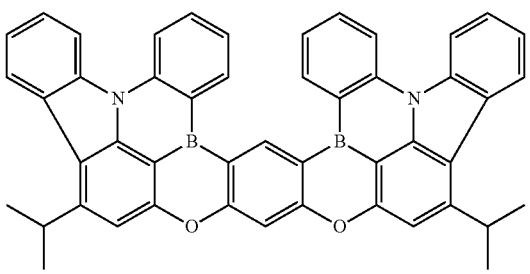

A-3

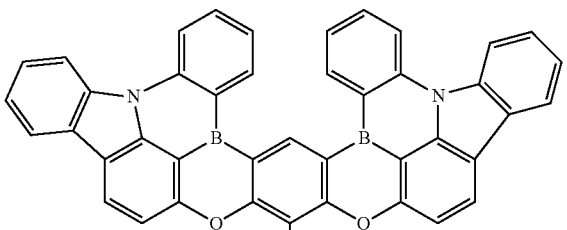

A-4

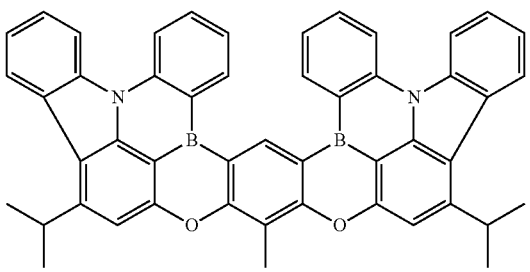

A-5

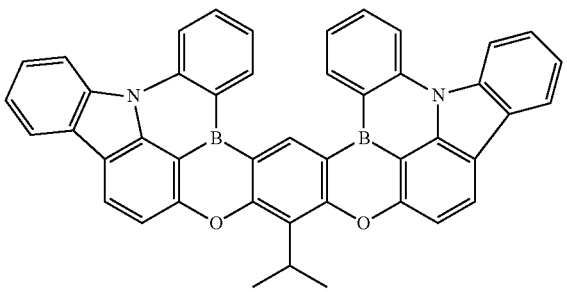

A-6

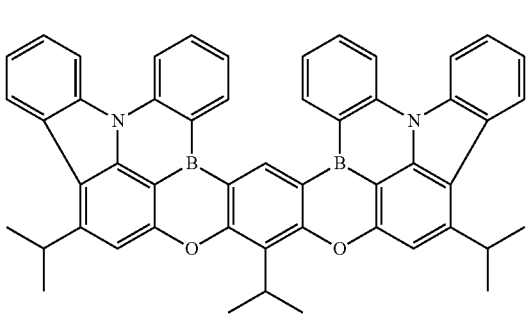

A-7
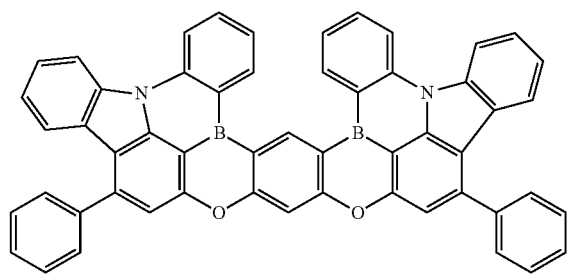
A-8
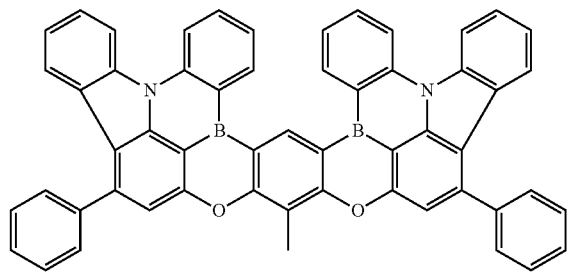
A-9
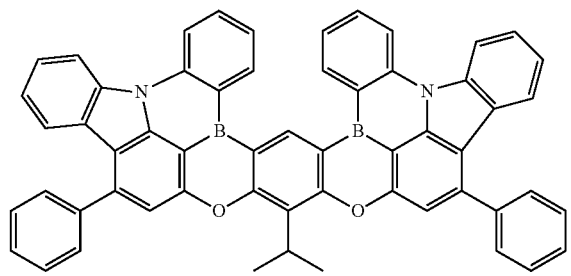
A-10
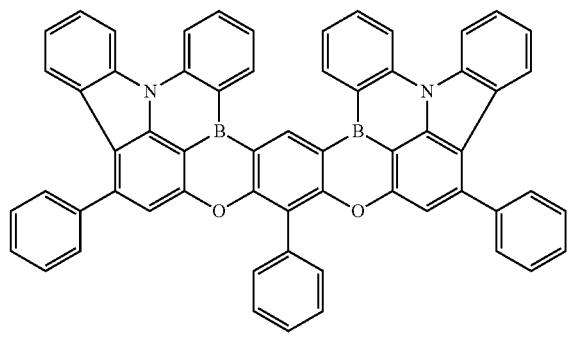
A-11
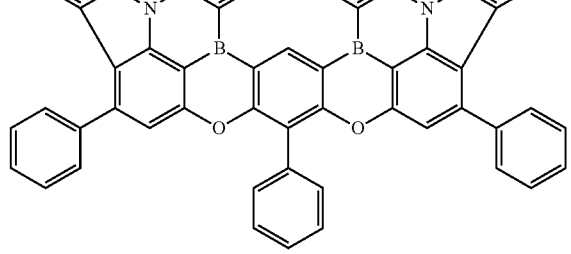
A-12
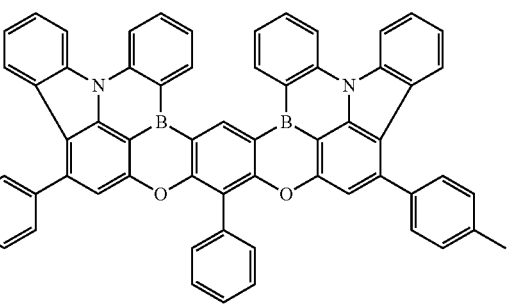
A-13
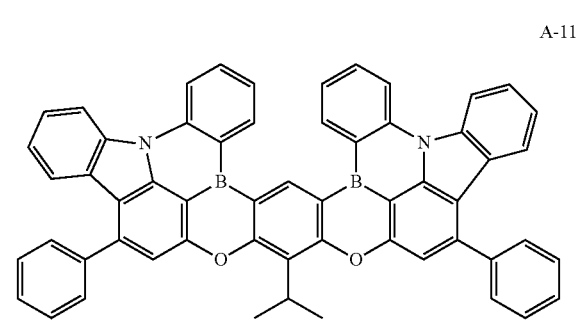
A-14
A-15
A-16
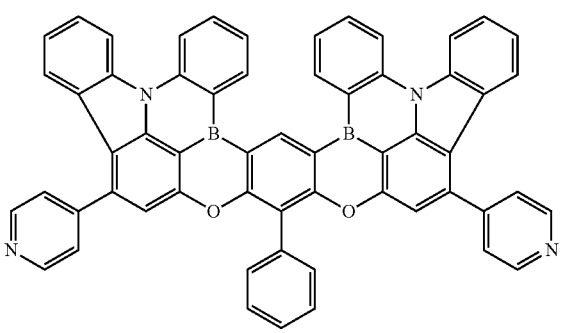

A-17
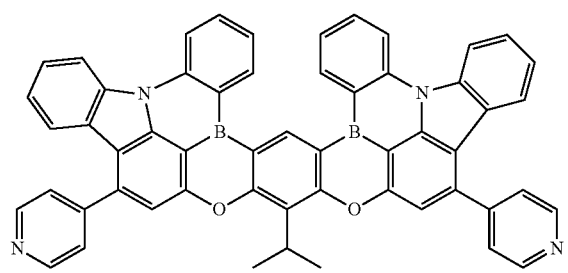
A-18
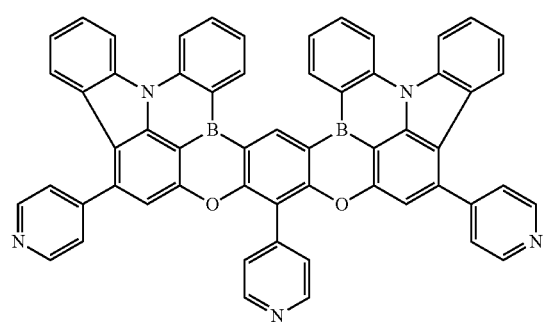
A-19
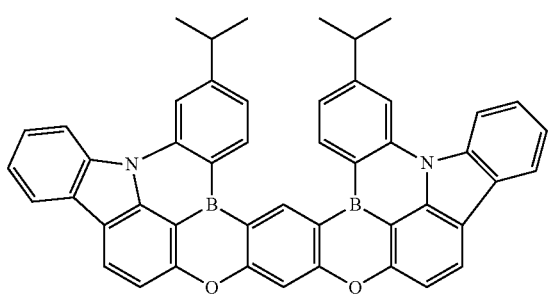
A-20
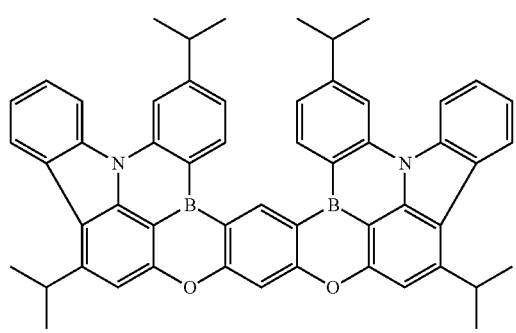
A-21
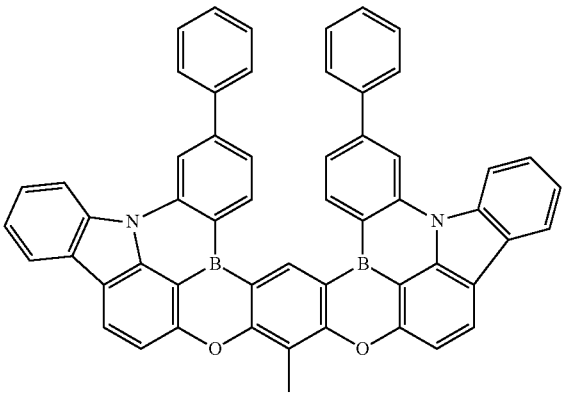
A-22
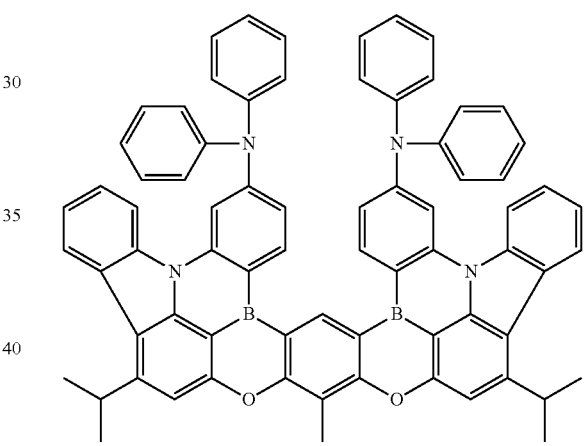
A-23
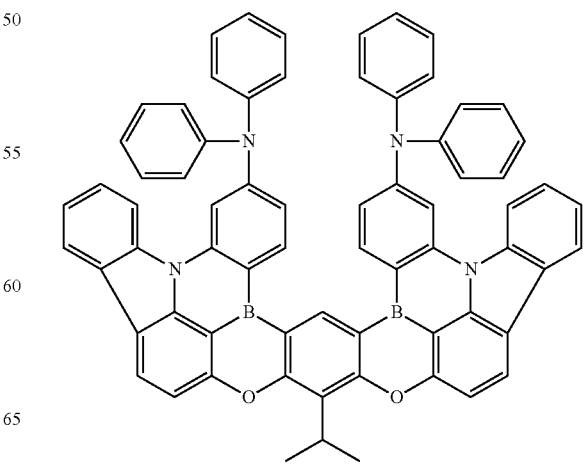

-continued
A-24
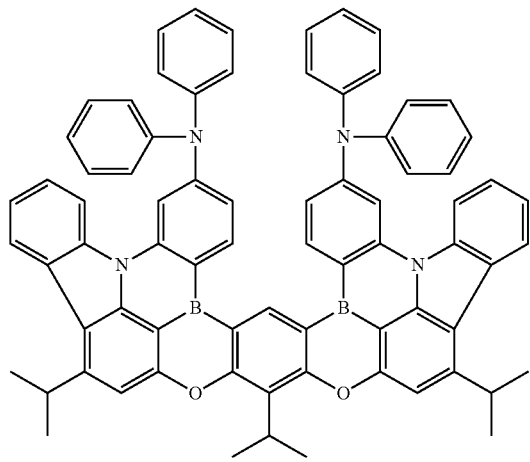
A-25
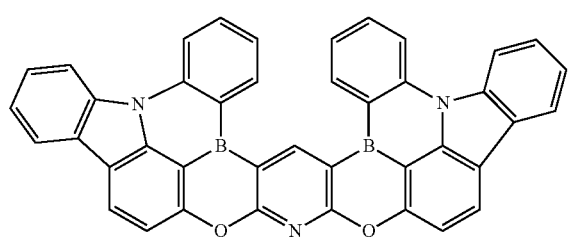
A-26
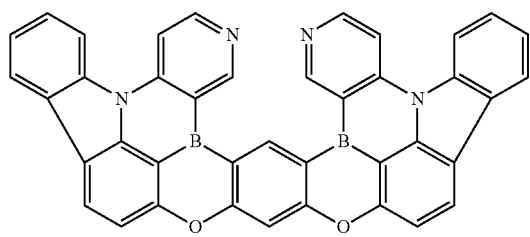
A-27
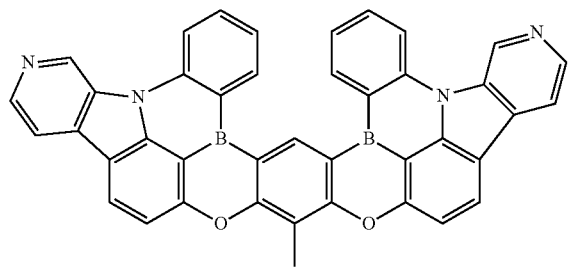
A-28
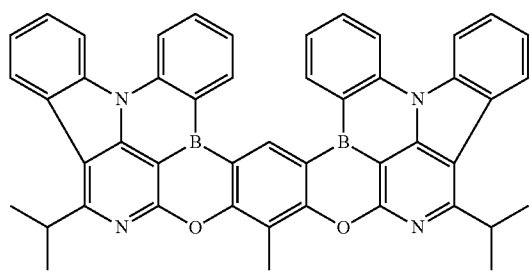
A-29
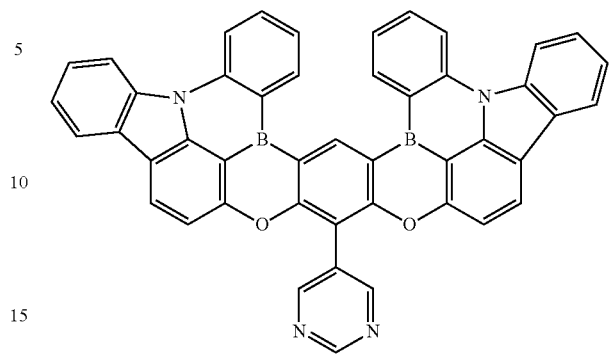
A-30
A-31
[Compound Group B]
B-1
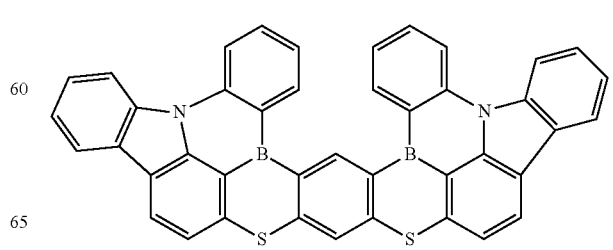

B-2
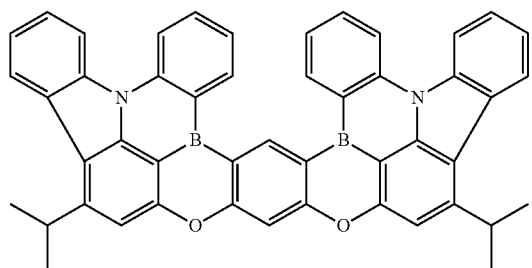
B-3
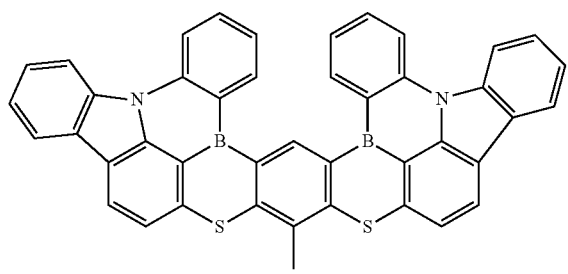
B-4
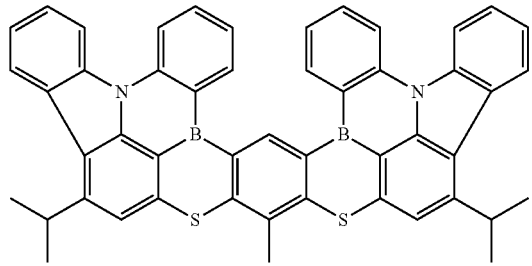
B-5
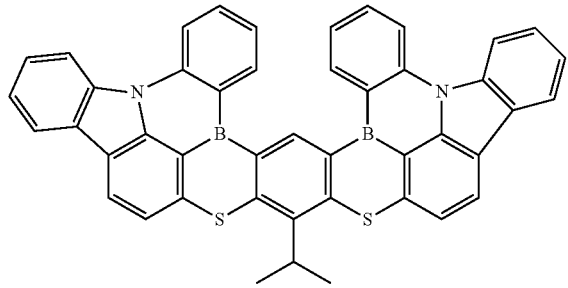
B-6
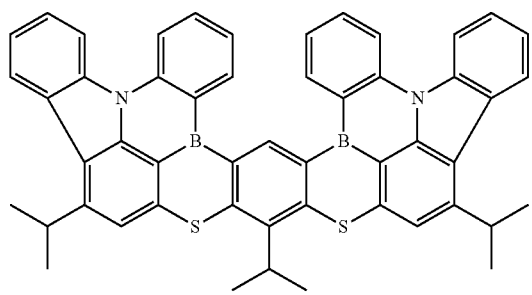
B-7
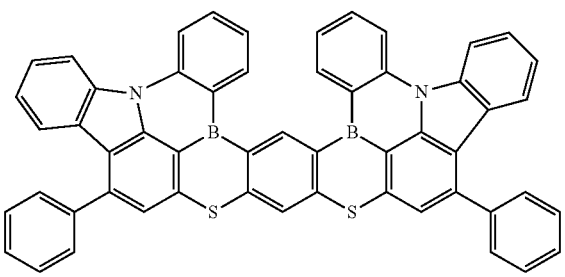
B-8
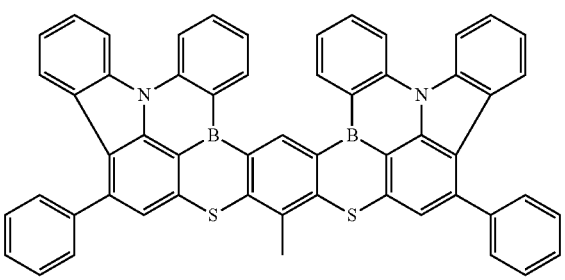
B-9
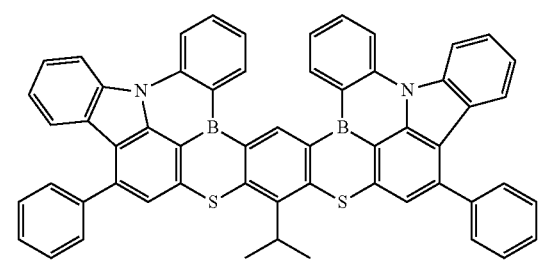
B-10
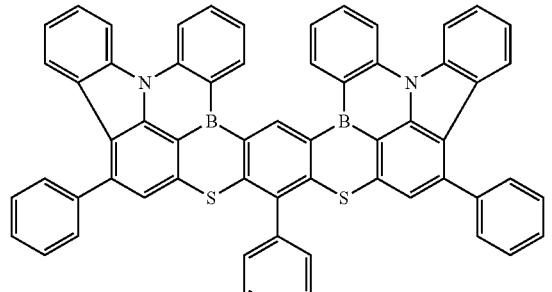
B-11
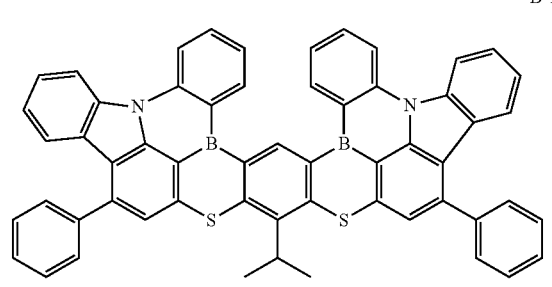

B-12
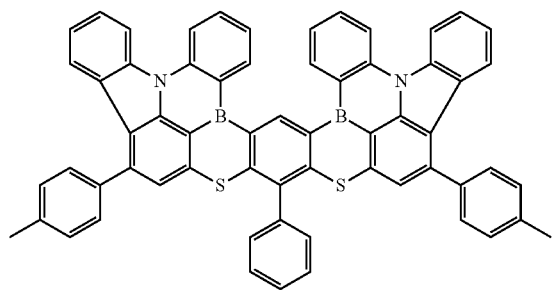
B-13
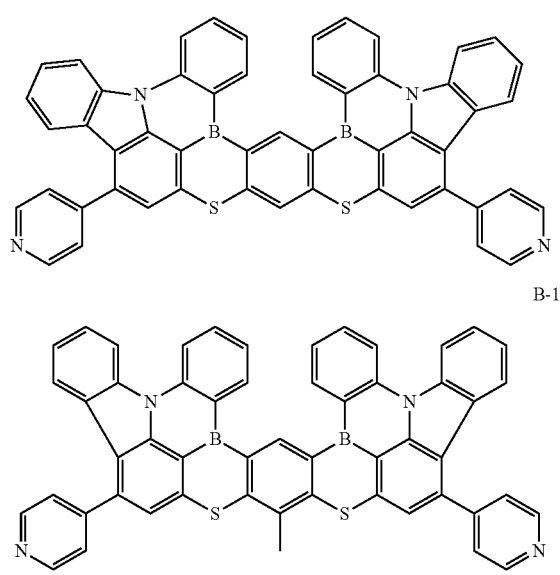
B-14
B-15
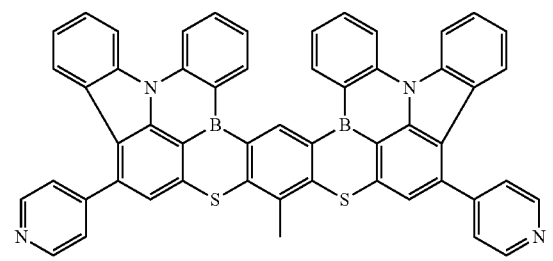
B-16
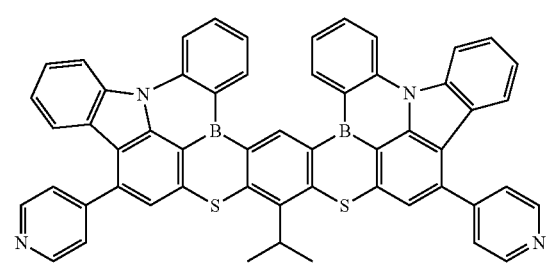
B-17
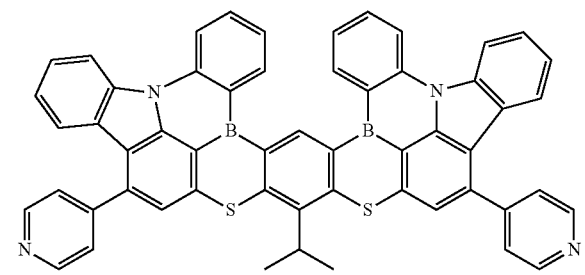
B-18
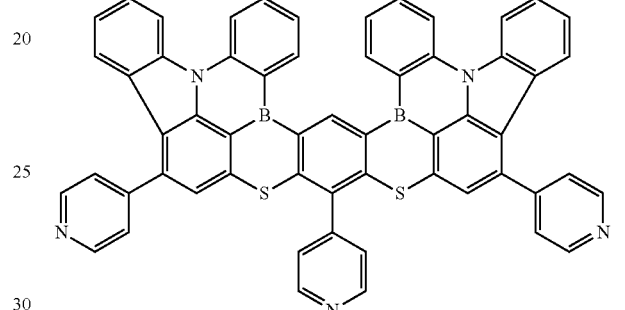
B-19
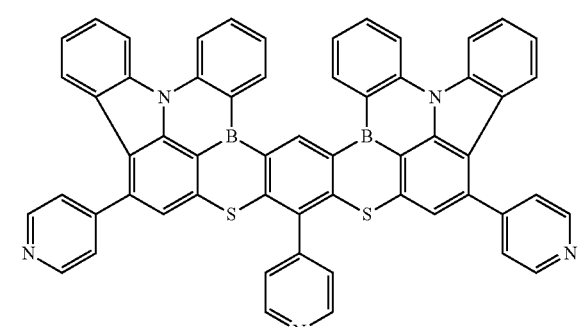
B-20
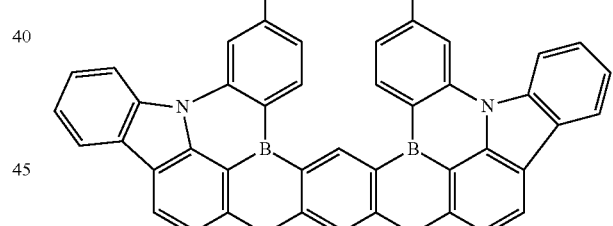

B-21
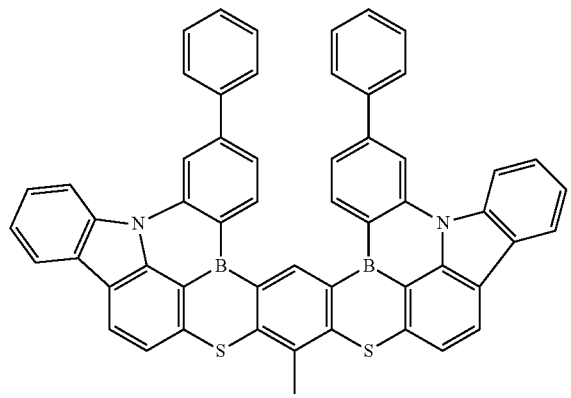
B-22
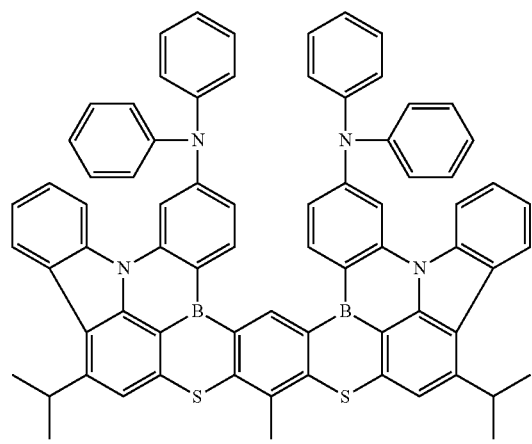
B-23
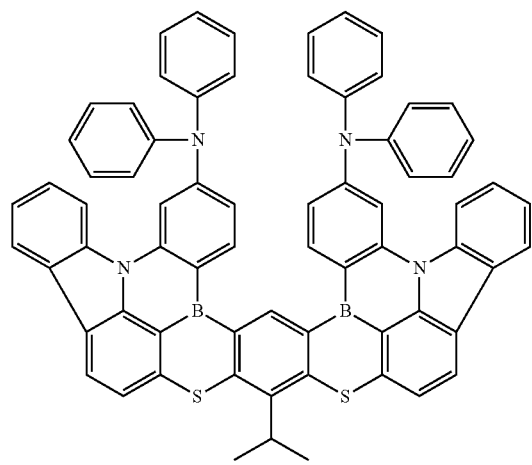
B-24
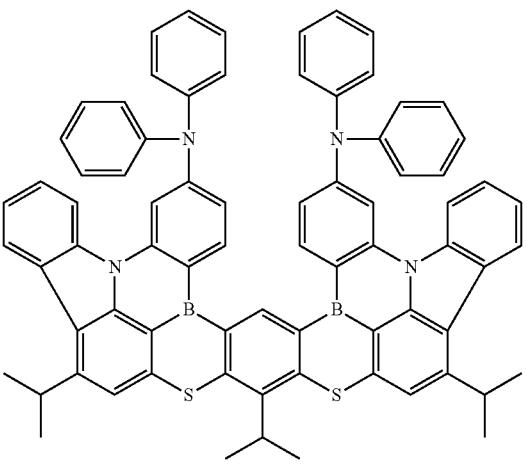
[Compound Group C]
C-1
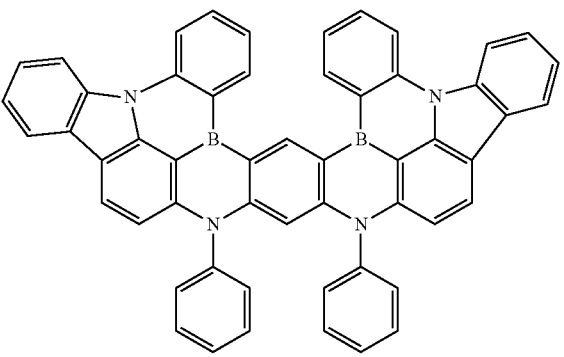
C-2
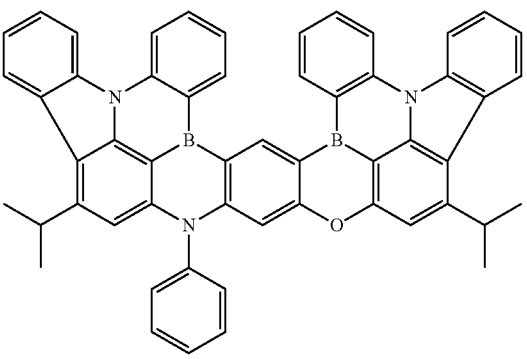
C-3
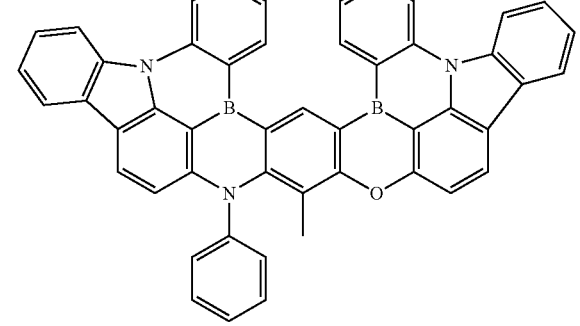

-continued
C-4
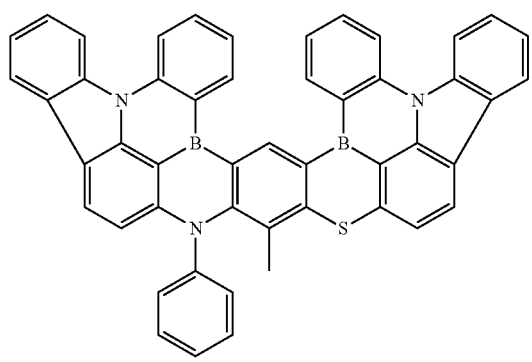
C-8
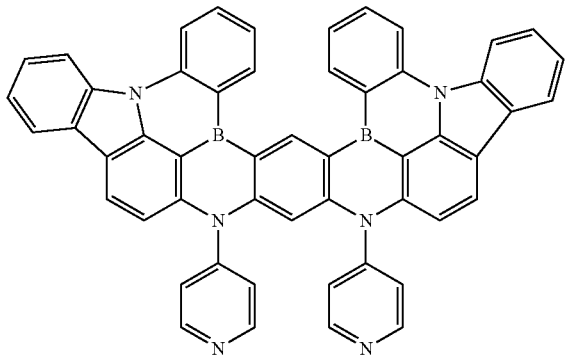
C-5
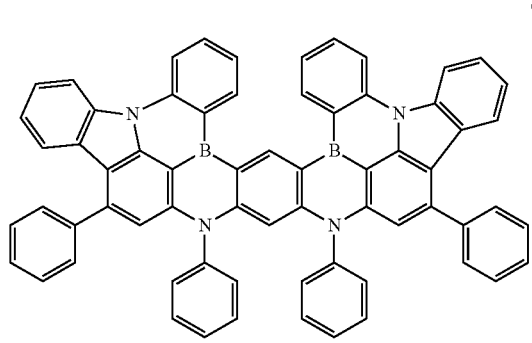
C-9
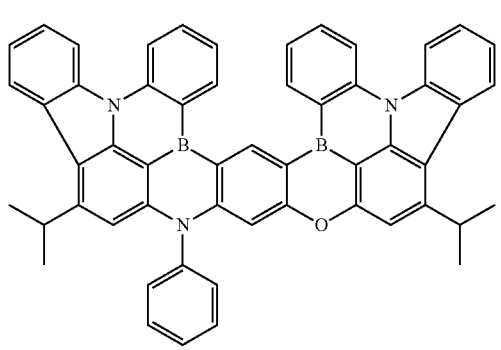
C-6
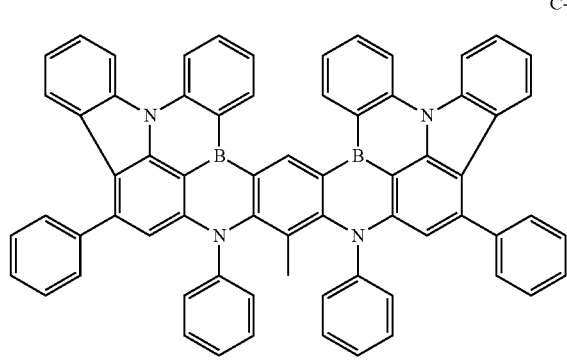
C-10
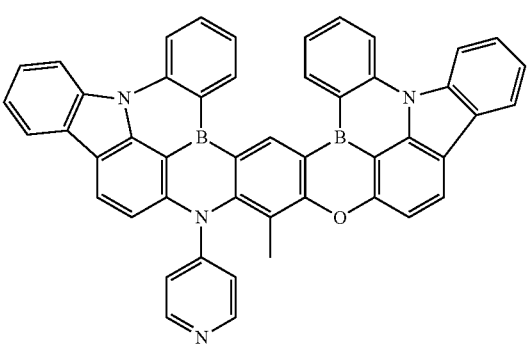
C-7
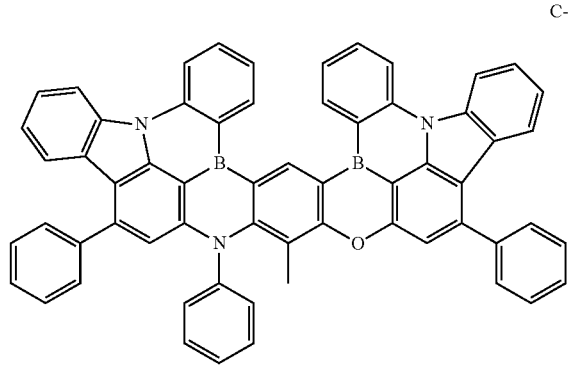
C-11
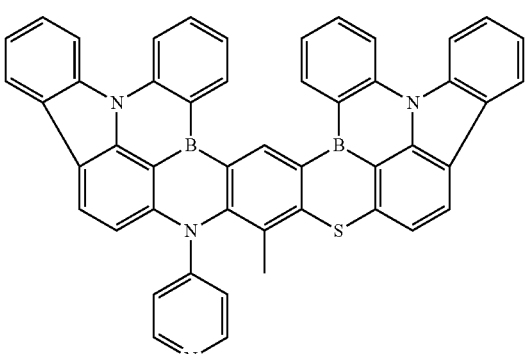

C-12 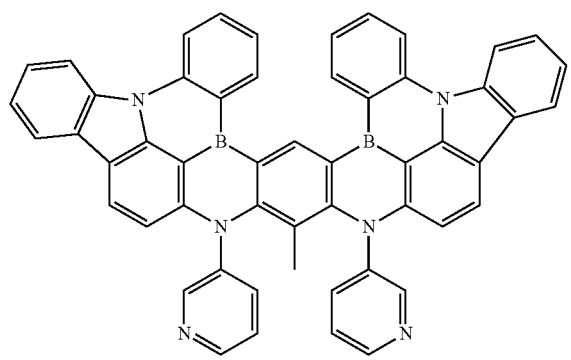
C-16 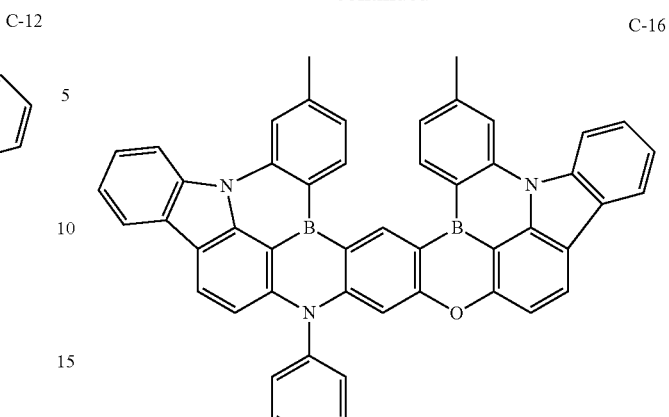
C-13 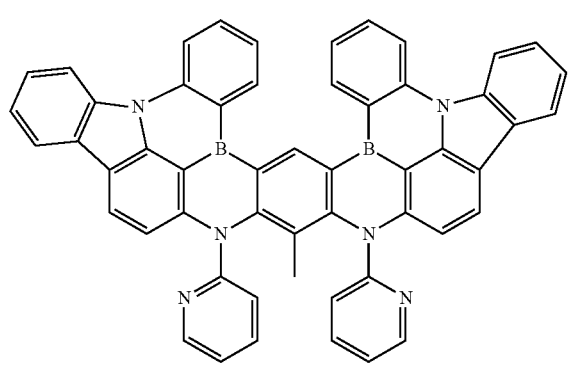
C-17 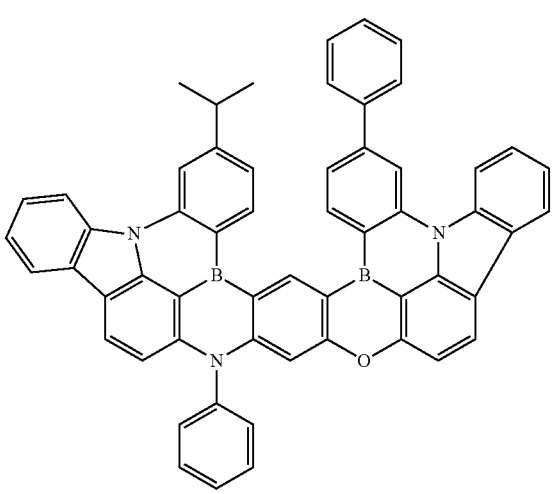
C-14 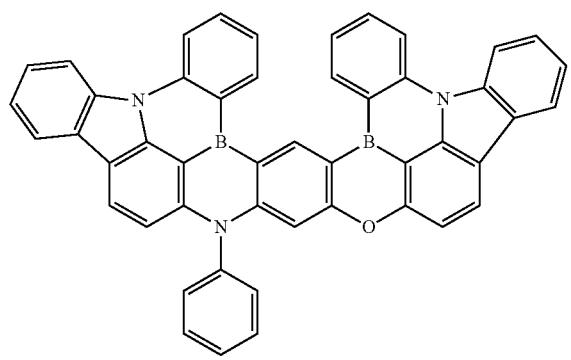
[Compound Group D]
D-1 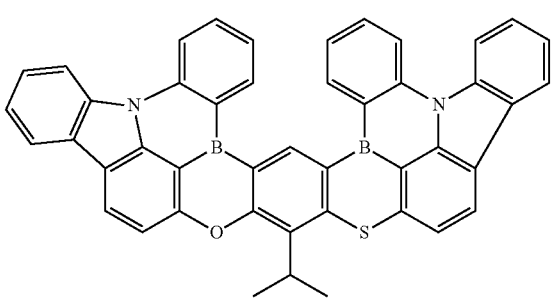
C-15 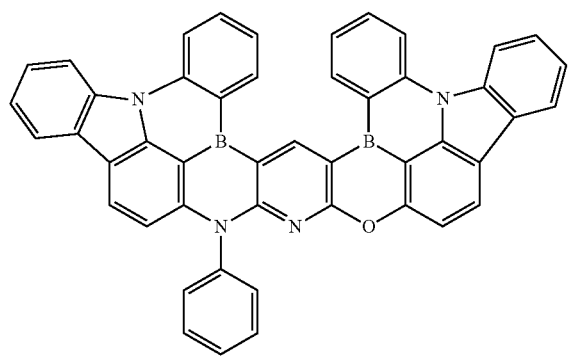
D-2 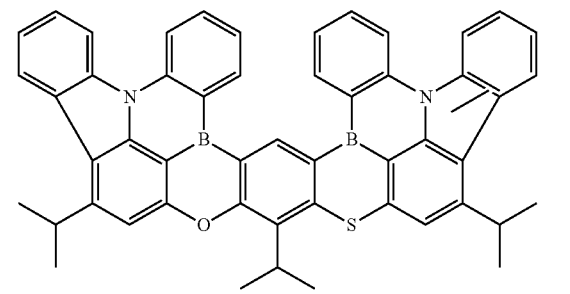

D-3
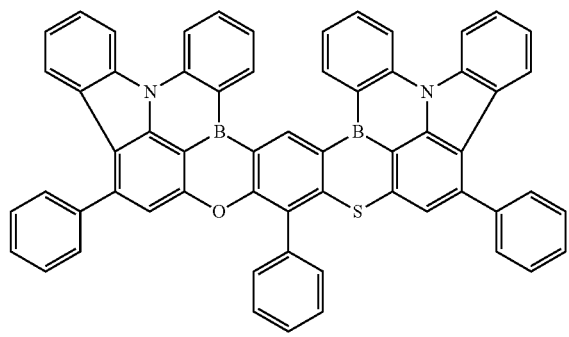
D-4
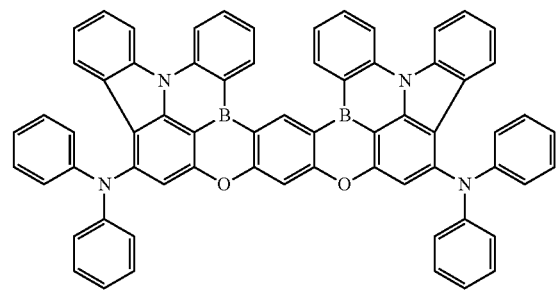
D-5
[Compound Group E]
E-1
E-2
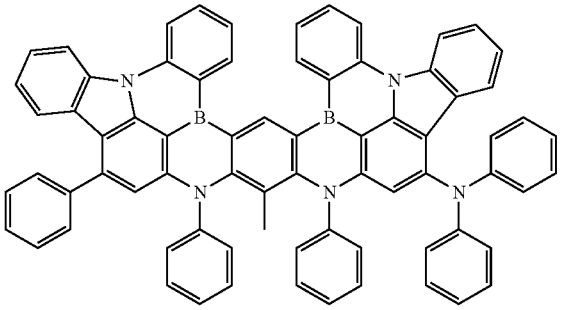
E-3
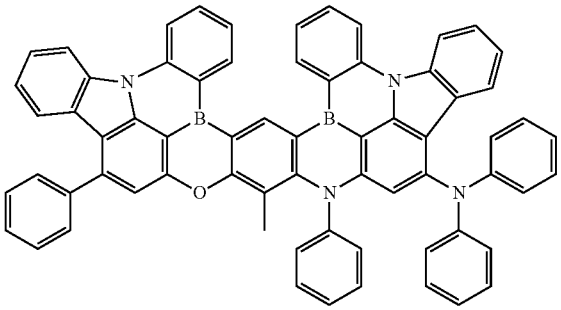
E-4
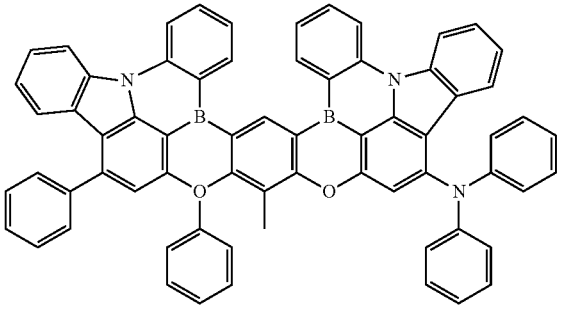
E-5
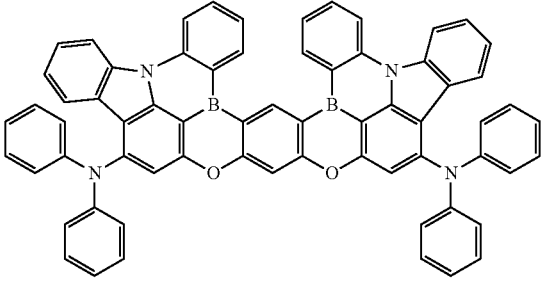
E-6
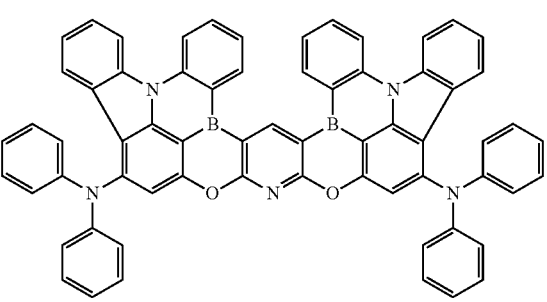

E-7
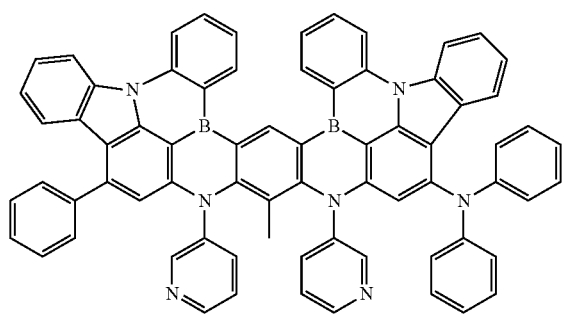
E-11
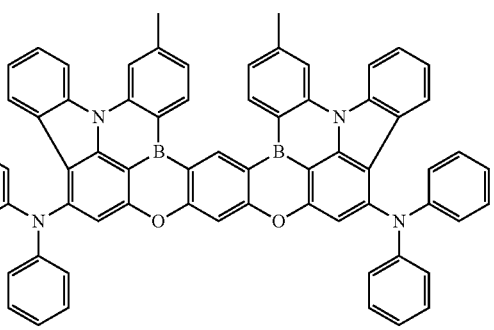
E-8
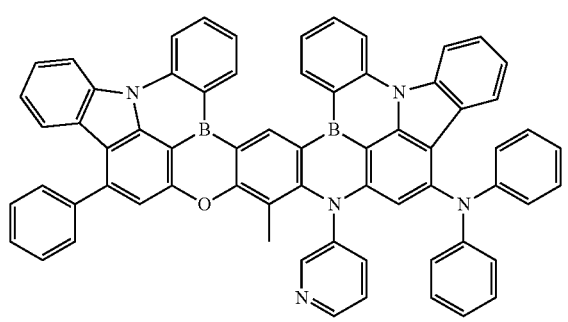
E-12
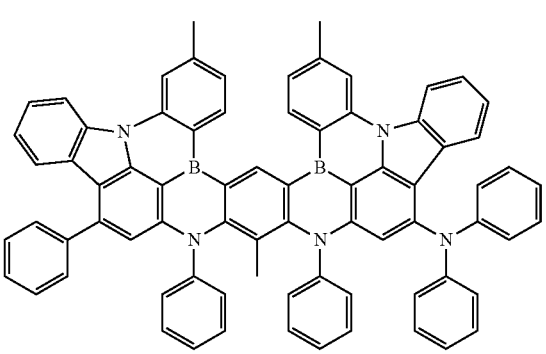
E-9
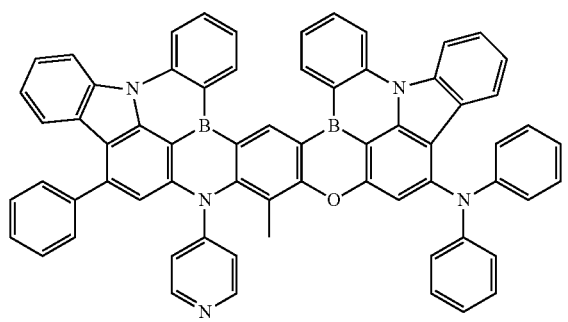
E-13
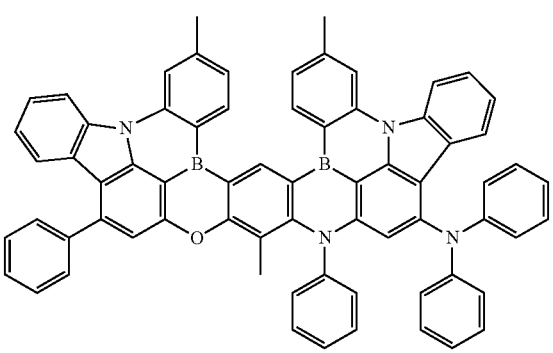
E-10
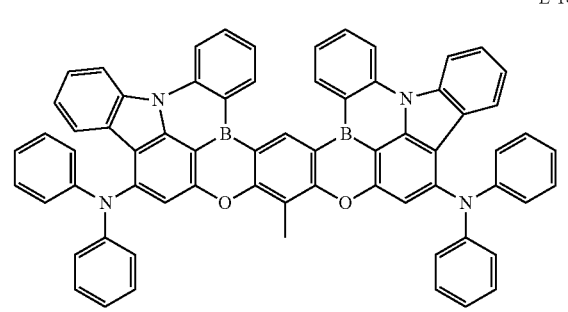
E-14
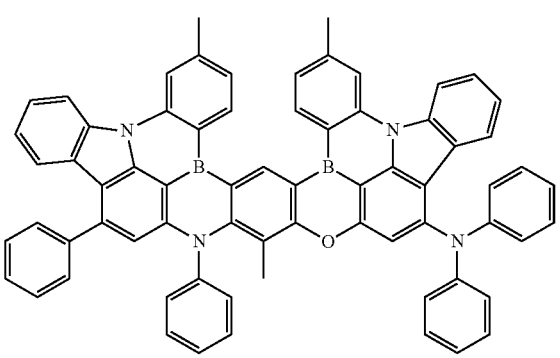

E-15
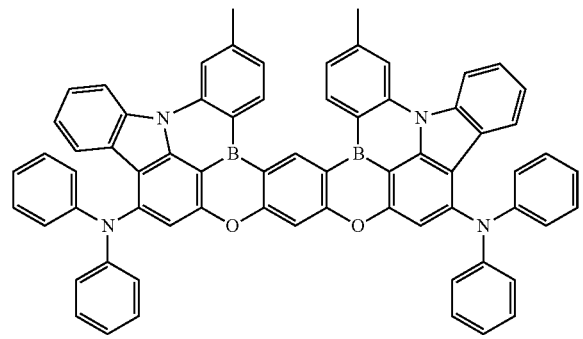
E-19
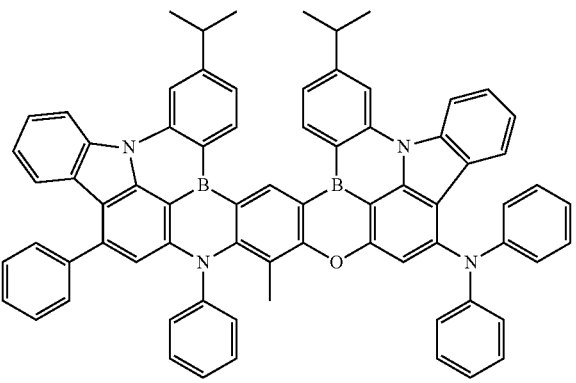
E-16
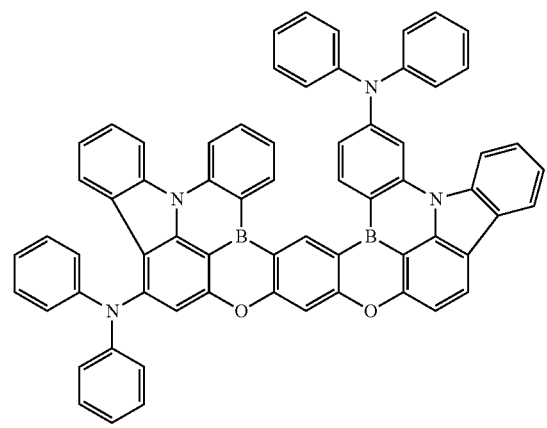
E-20
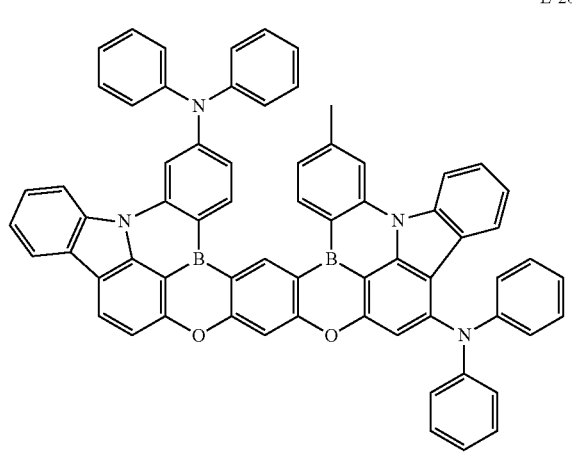
E-17
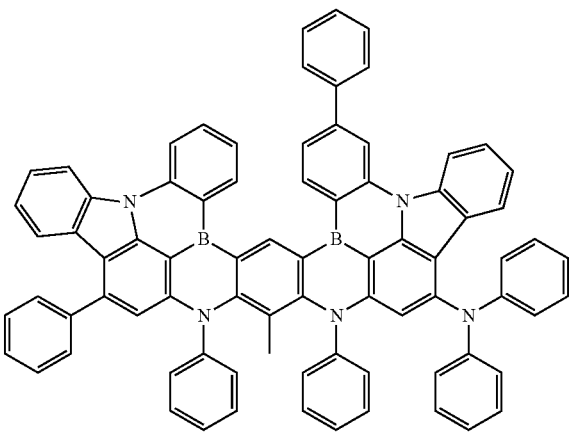
[Compound Group F]
F-1
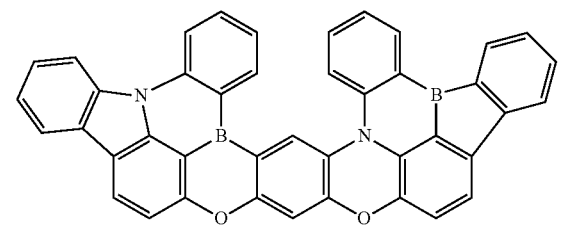
E-18
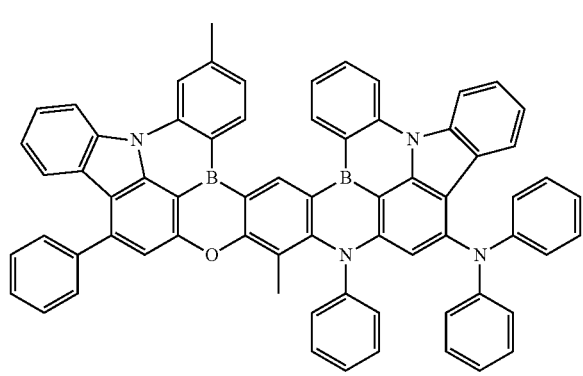
F-2
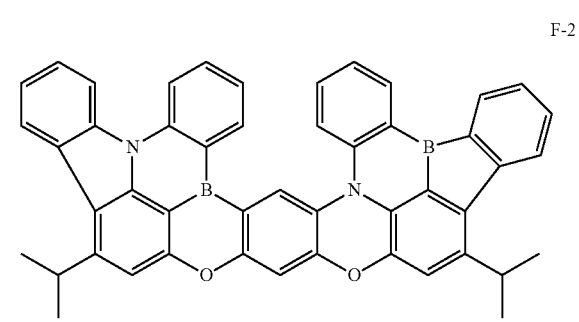

F-3
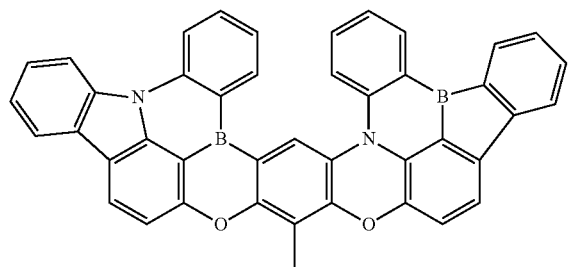
F-4
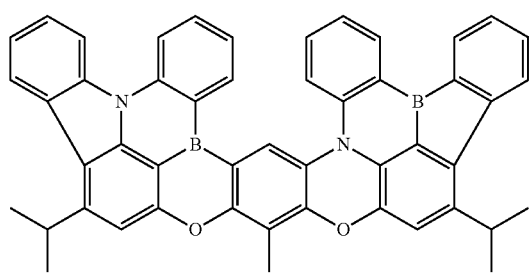
F-5
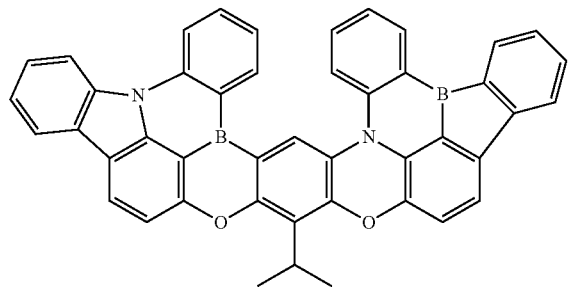
F-6
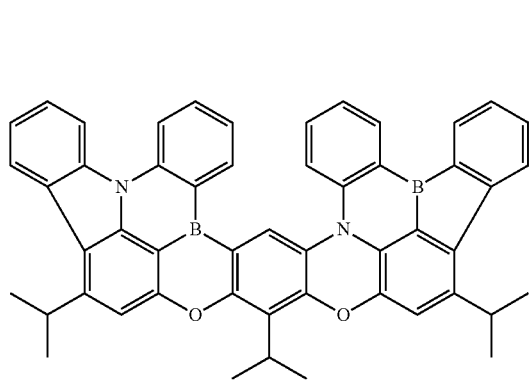
F-7
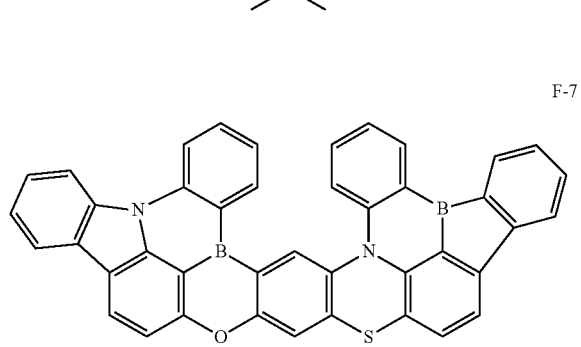
F-8
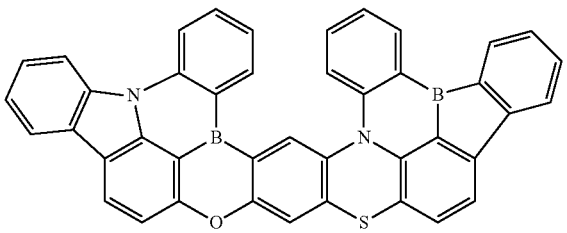
F-9
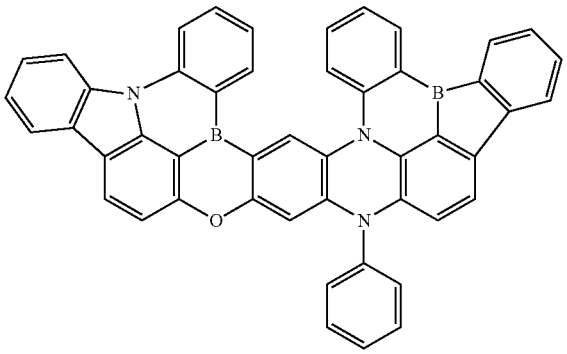
F-10
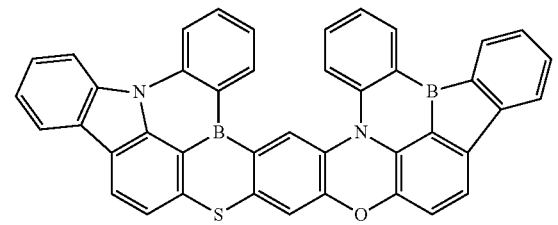
F-11
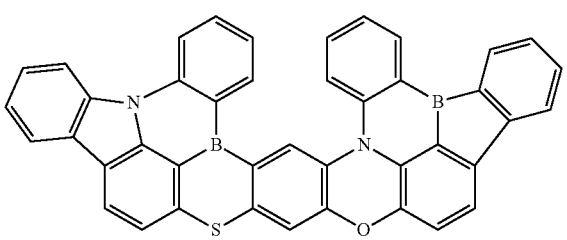
F-12
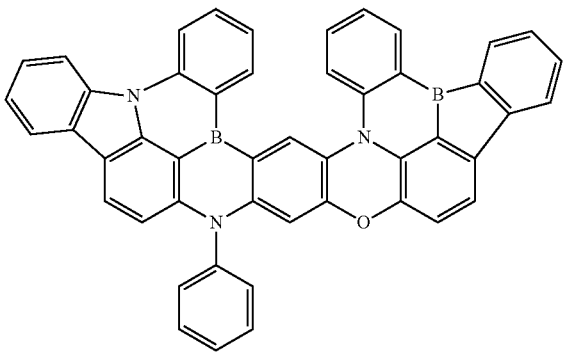

[Compound Group G]
G-1
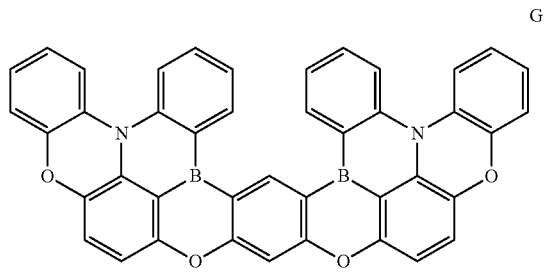
G-2
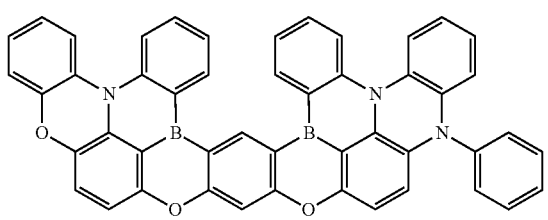
G-3
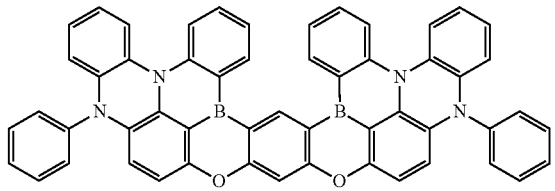
G-4
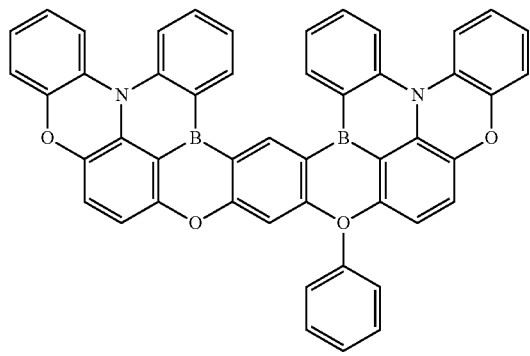
G-5
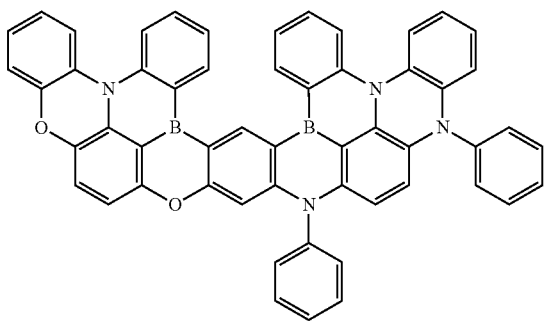
G-6
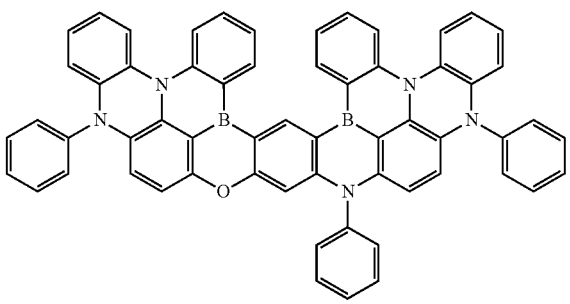
G-7
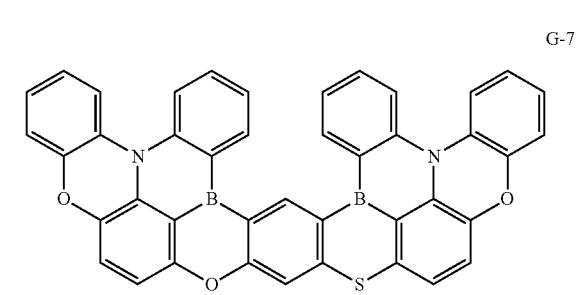
G-8
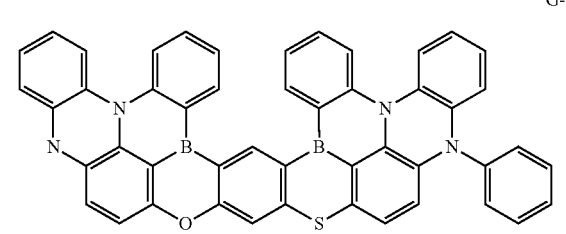
G-9
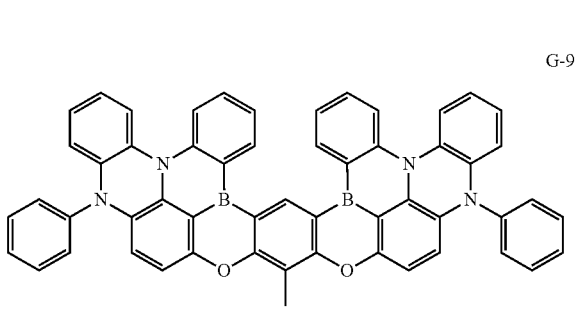 [SMILES: Cc1c2c(cc3c1Oc1ccc4c5c1B3c1ccccc1N5c1ccccc1N4c1ccccc1)B1c3ccccc3N3c4ccccc4N(c4ccccc4)c4ccc(c1c43)O2]
G-10
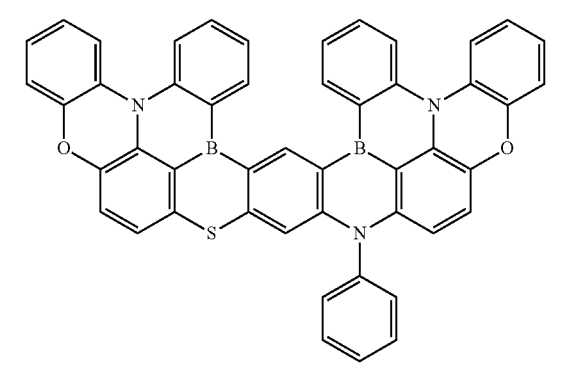

-continued
G-11
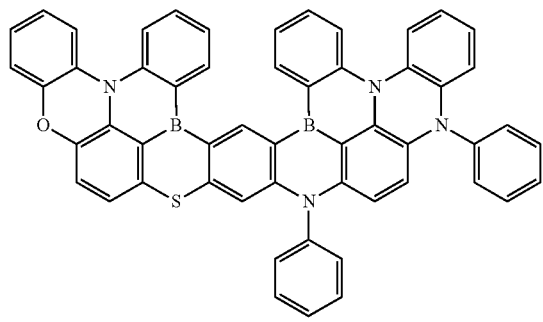
G-12
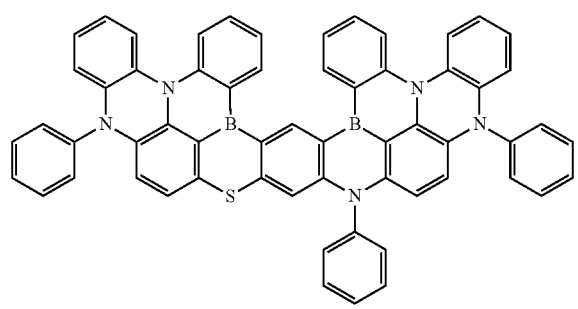
G-13
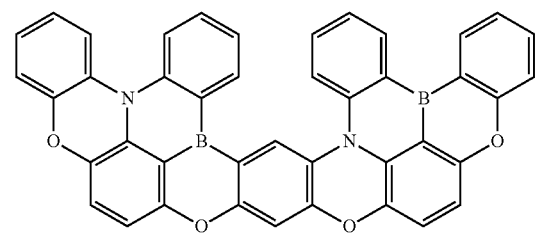
G-14
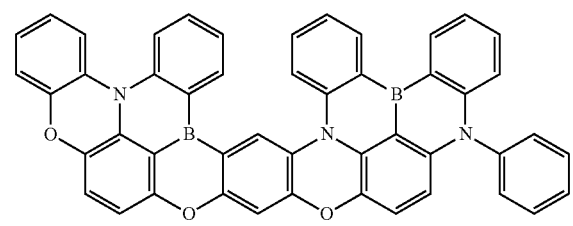
G-15
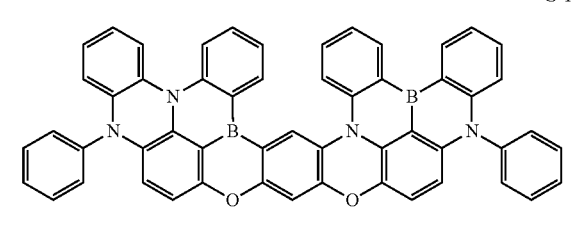
-continued
G-16
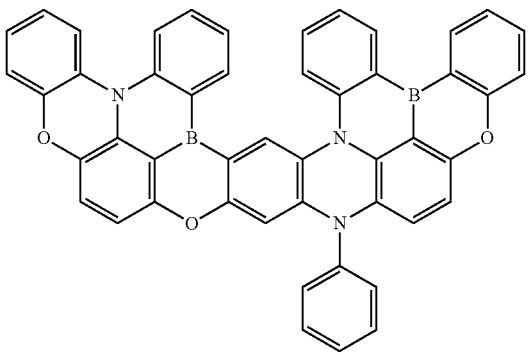
G-17
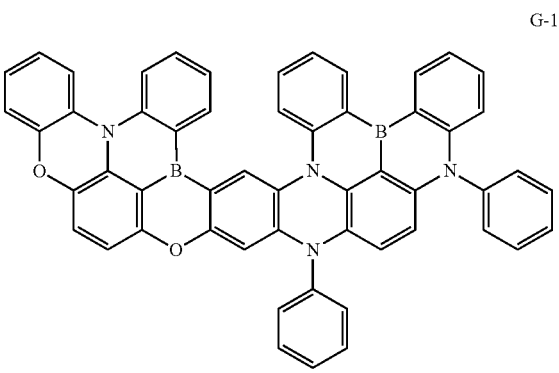
G-18
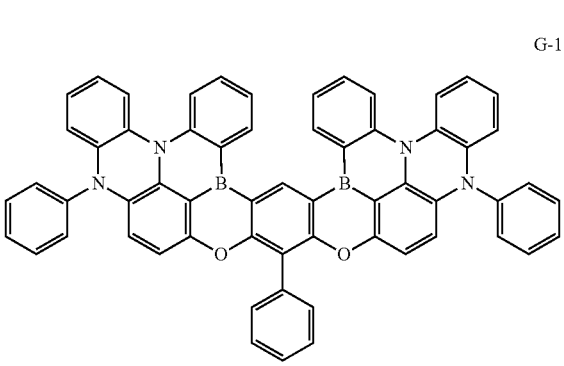
G-19
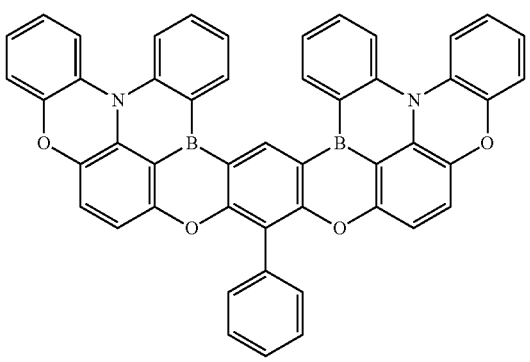

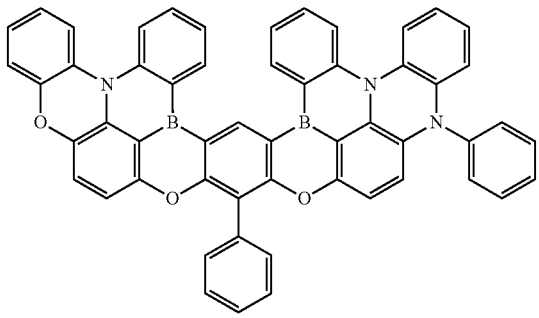

G-20

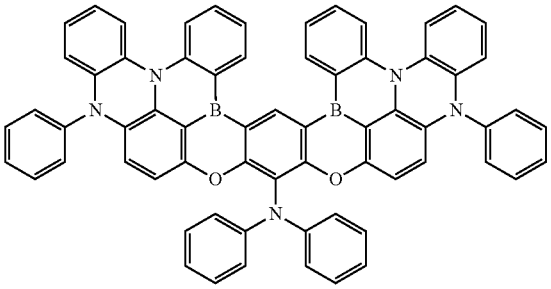

G-24

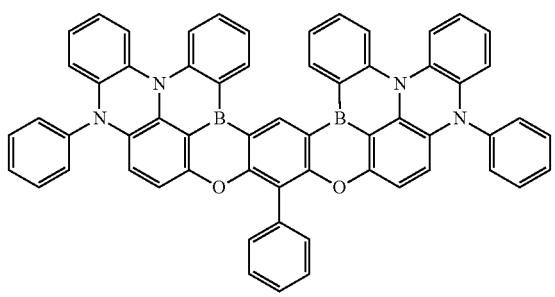

G-21

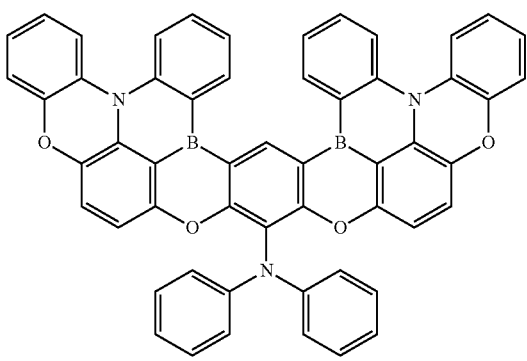

G-22

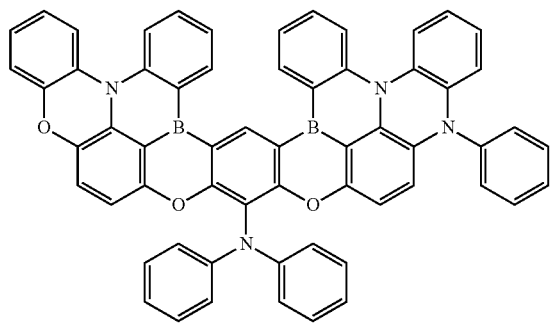

G-23

The emission spectrum of the fused polycyclic compound of an embodiment represented by Formula 1 may have a full width at half maximum of about 10-50 nm, for example, a full width at half maximum of about 20-40 nm. When the emission spectrum of the fused polycyclic compound of an embodiment, represented by Formula 1 has the full width at half maximum in the above-described range, the emission efficiency of a device including the fused polycyclic compound may be improved. When the fused polycyclic compound may be used as a blue light-emitting material for a luminous device, the device life span may be increased.

The fused polycyclic compound of an embodiment represented by Formula 1 may be a thermally activated delayed fluorescence (TADF) emitting material. In some embodiments, the fused polycyclic compound of an embodiment represented by Formula 1 may be a thermally activated delayed fluorescence dopant having an energy difference ($\Delta E_{ST}$) between the lowest triplet excitation energy level (T1 level) and the lowest singlet excitation energy level (S1 level) of about 0.3 eV or less. For example, the fused polycyclic compound of an embodiment, represented by Formula 1 may have LEST of about 0.1 eV or less. The fused polycyclic compound of an embodiment represented by Formula 1 may be a light-emitting material having a light-emitting central wavelength in a wavelength region of about 430 nm to about 490 nm. For example, the fused polycyclic compound of an embodiment represented by Formula 1 may be a blue emitting thermally activated delayed fluorescence (TADF) dopant. However, embodiments of the present disclosure are not limited thereto, and when the fused polycyclic compound of an embodiment is used as a light-emitting material, the fused polycyclic compound may be used as a dopant material to emit light in any suitable wavelength region or as any suitable color dopant (such as a red emitting dopant or a green emitting dopant).

In the organic electroluminescence device 10 of an embodiment, the emission layer EML may be to emit delayed fluorescence. For example, the emission layer EML may be to emit thermally activated delayed fluorescence (TADF).

In addition, the organic electroluminescence device 10 may be to emit blue light. For example, the emission layer EML of the organic electroluminescence device 10 of an embodiment may be to emit blue light in a region of about 490 nm or more.

However, an embodiment of the present disclosure is not limited thereto, and the emission layer EML may be to emit green light or red light.

In some embodiments, the organic electroluminescence device 10 of an embodiment may include a plurality of emission layers. The plurality of emission layers may be laminated one by one. For example, the organic electroluminescence device 10 including a plurality of emission layers may be to emit white light. The organic electroluminescence device including the plurality of emission layers may be an organic electroluminescence device having a tandem structure. When the organic electroluminescence device 10 includes a plurality of emission layers, at least one emission layer EML may include the fused polycyclic compound of an embodiment.

In an embodiment, the emission layer EML includes a host and a dopant, and may include the fused polycyclic compound of an embodiment as a dopant. For example, in the organic electroluminescence device 10 of an embodiment, the emission layer EML may include a host to emit delayed fluorescence and a dopant to emit delayed fluorescence, and may include the fused polycyclic compound as a dopant to emit delayed fluorescence. The emission layer EML may include at least one of the fused polycyclic compounds represented in Compound Groups A through G as a thermally activated delayed fluorescence dopant.

Any suitable material may be used as a host material in the emission layer EML, and for example, may be selected from fluoranthene derivatives, pyrene derivatives, arylacetylene derivatives, anthracene derivatives, fluorene derivatives, perylene derivatives, chrysene derivatives, and the like. In some embodiments, pyrene derivatives, perylene derivatives, and anthracene derivatives may be used. For example, as the host material of the emission layer EML, anthracene derivatives represented by Formula 7 may be used:

[Formula 7]

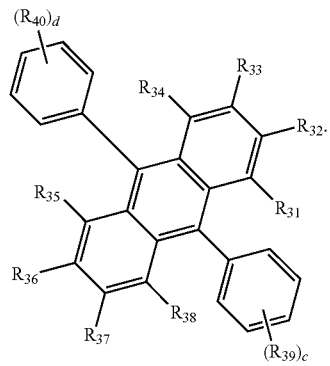

In Formula 7, $R_{31}$ to $R_{40}$ may each independently be a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring. In some embodiments, $R_{31}$ to $R_{40}$ may be combined with an adjacent group to form a saturated hydrocarbon ring or an unsaturated hydrocarbon ring.

In Formula 7, "c" and "d" may each independently be an integer of 0 to 5.

The compound represented by Formula 7 may be at least one represented by at least one of Formula 7-1 to Formula 7-16:

7-1

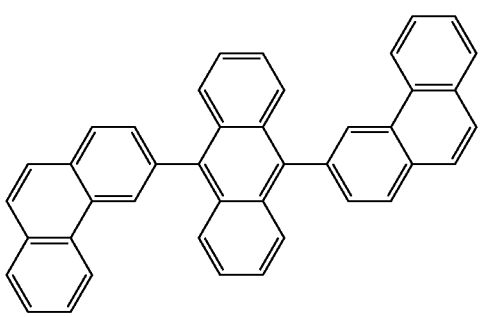

7-2

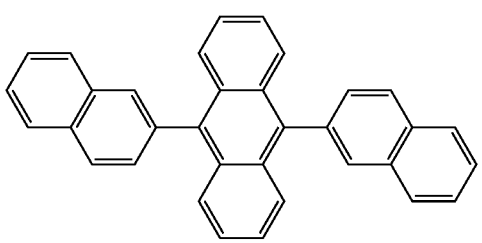

7-3

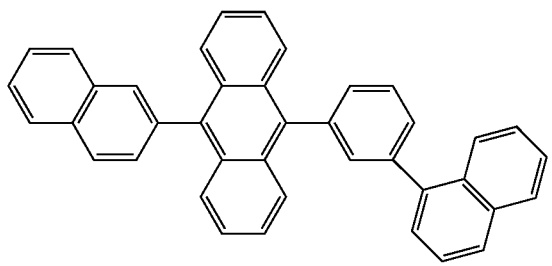

7-4

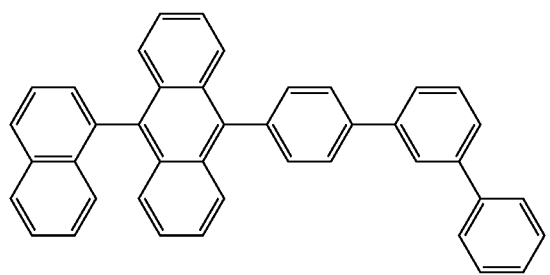

7-5

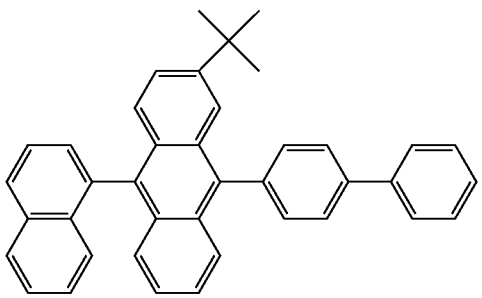

7-6
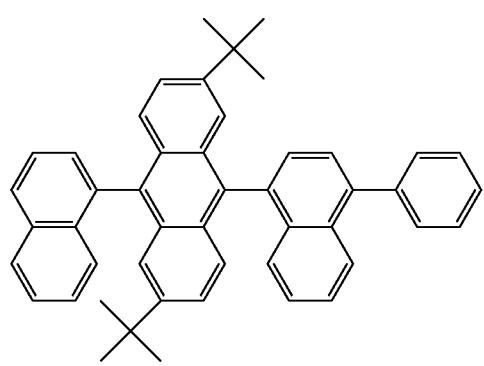
7-7
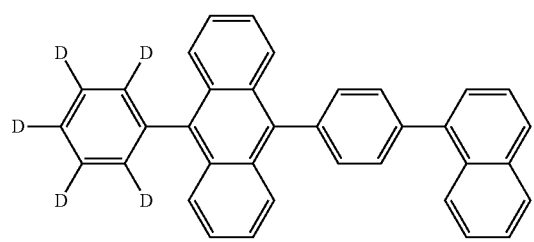
7-8
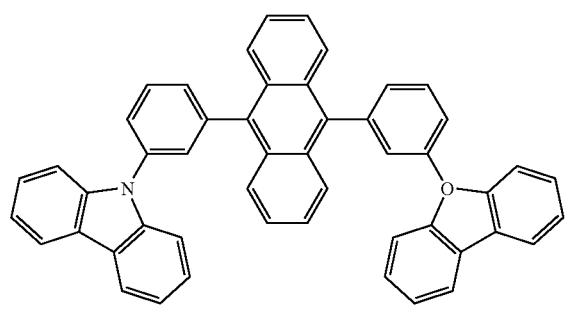
7-9
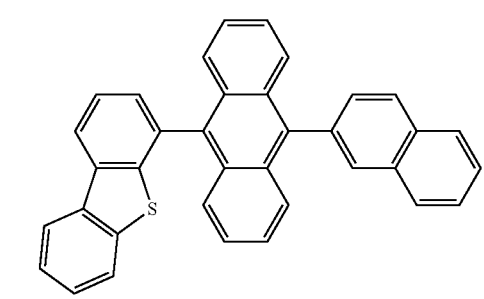
7-10
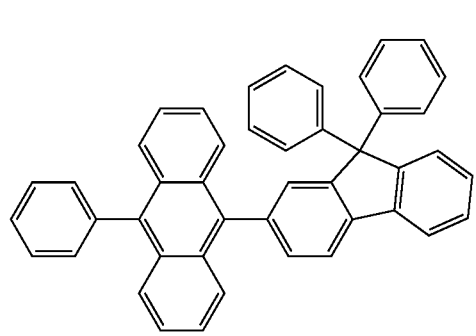
7-11
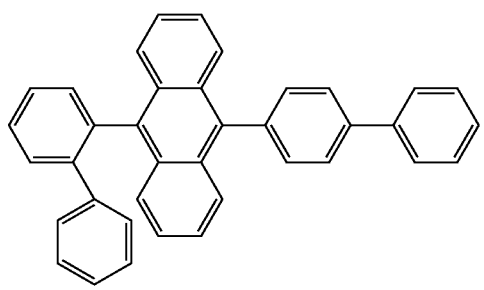
7-12
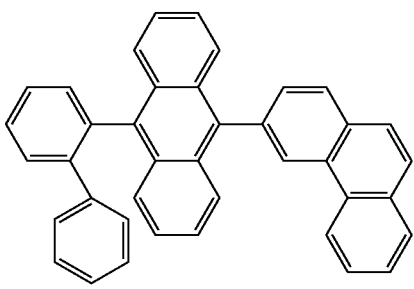
7-13
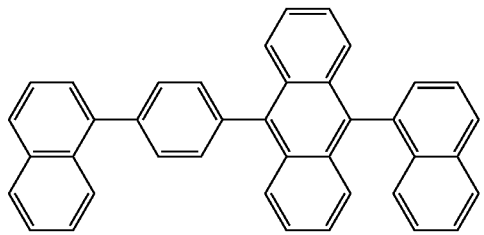
7-14
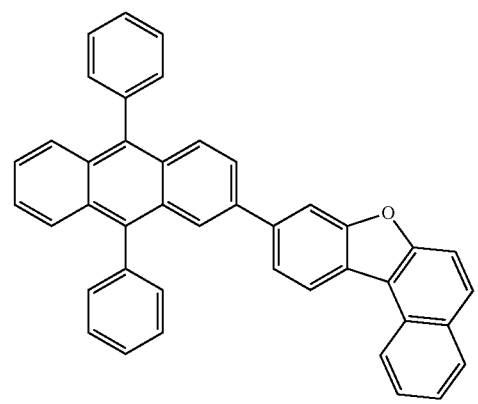

7-15

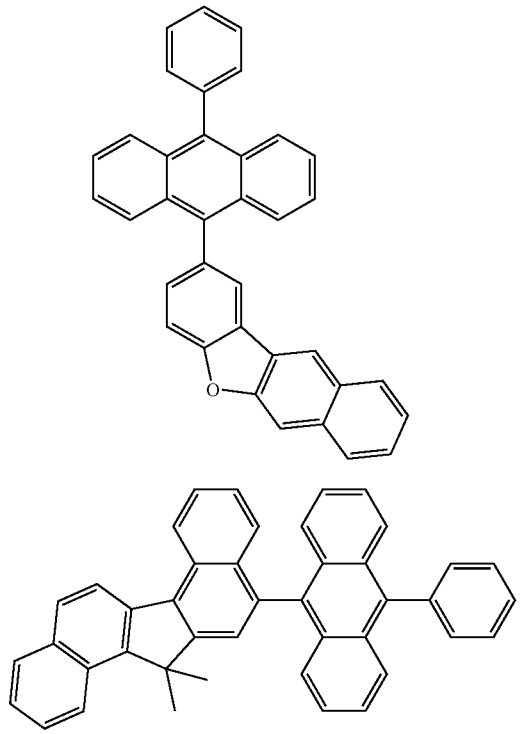

7-16

In an embodiment, the emission layer EML may include as a host material, tris(8-hydroxyquinolino) aluminum (Alq3), 4,4'-bis(N-carbazoyl)-1,1'-biphenyl (CBP), poly(N-vinylcarbazole) (PVK), 9,10-di(naphthalene-2-yl)anthracene (ADN), 4,4',4''-tris(carbazol-9-yl)-triphenylamine (TCTA), 1,3,5-tris(1-phenyl-1H-benz[d]imidazol-2-yl)benzene (TPBi), 3-tert-butyl-9,10-di(naphth-2-yl)anthracene (TBADN), distyrylarylene (DSA), 4,4'-bis(9-carbazolyl)-2,2''-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO₃), octaphenylcyclotetrasiloxane (DPSiO₄), 2,8-bis(diphenylphosphoryl)dibenzofuran (PPF), 3,3'-bis(N-carbazolyl)-1,1'-biphenyl (mCBP), 1,3-bis(N-carbazolyl)benzene (mCP), 9,10-di(naphthalen-2-yl)anthracene (DNA), etc. However, embodiments of the present disclosure are not limited thereto. Any suitable host materials to emit delayed fluorescence other than or in addition to those described above may be included.

In the organic electroluminescence device 10 of an embodiment, the emission layer EML may further include any suitable dopant material. In an embodiment, the emission layer EML may include as a dopant, styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino)styryl)naphthalen-2-Avinyl)phenyl)-N-phenyl-benzenamine (N-BDAVBi)), perylene and derivatives thereof (for example, 2,5,8,11-tetra-t-butylperylene (TBP)), pyrene and derivatives thereof (for example, 1,1-dipyrene, 1,4-dipyrenylbenzene, 1,4-bis(N,N-diphenylamino)pyrene), etc.

In some embodiments, the emission layer EML may include two dopant materials having different lowest triplet excitation energy levels (T1 levels) from each other. In the organic electroluminescence device 10 of an embodiment, the emission layer EML may include a host having a first lowest triplet excitation energy level, a first dopant having a second lowest triplet excitation energy level that is lower than the first lowest triplet excitation energy level, and a second dopant having a third lowest triplet excitation energy level that is lower than the second lowest triplet excitation energy level. In an embodiment, the emission layer EML may include the above-described fused polycyclic compound of an embodiment as the first dopant.

In the organic electroluminescence device 10 of an embodiment, including the host, the first dopant, and the second dopant in the emission layer EML, the first dopant may be a delayed fluorescence dopant, and the second dopant may be a fluorescence dopant. In some embodiments, in the organic electroluminescence device 10 of an embodiment, the fused polycyclic compound represented by Formula 1 may play the role of an assistant dopant.

For example, when the emission layer EML of the organic electroluminescence device 10 of an embodiment includes a plurality of dopants, the emission layer EML may include the polycyclic compound of an embodiment as the first dopant, and the above-described dopant material as the second dopant. For example, when the emission layer EML is to emit blue light, the emission layer EML may further include as the second dopant, any one selected from the group consisting of spiro-DPVBi, spiro-6P, distyryl-benzene (DSB), distyryl-arylene (DSA), a polyfluorene (PFO)-based polymer, and a poly(p-phenylene vinylene (PPV)-based polymer. In some embodiments, metal complexes or organometallic complexes (such as (4,6-F2ppy)₂Irpic), perylene and derivatives thereof, etc., may be used as the second dopant.

In the organic electroluminescence device 10 of an embodiment including the fused polycyclic compound as the first dopant of the emission layer EML, the emission layer EML may be to emit green light or red light, and in this case, the second dopant material may be any one of the above-described dopants, any suitable green fluorescence dopant, or any suitable red fluorescence dopant.

In the organic electroluminescence device 10 of an embodiment, the emission layer EML may be a phosphorescence emission layer. For example, the fused polycyclic compound according to an embodiment may be included in the emission layer EML as a phosphorescence host material.

In the organic electroluminescence device 10 of an embodiment, as shown in FIGS. 1 to 4, the electron transport region ETR is disposed on the emission layer EML. The electron transport region ETR may include at least one of an electron blocking layer HBL, an electron transport layer ETL, or an electron injection layer EIL. However, an embodiment of the present disclosure is not limited thereto.

The electron transport region ETR may be a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. In some embodiments, the electron transport region ETR may have a single layer structure having a plurality of different materials, or a structure laminated from the emission layer EML of electron transport layer ETL/electron injection layer EIL, or hole blocking layer HBL/ electron transport layer ETL/electron injection layer EIL, without limitation. The thickness of the electron transport region ETR may be, for example, about 100 Å to about 1,500 Å.

The electron transport region ETR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

When the electron transport region ETR includes an electron transport layer ETL, the electron transport region ETR may include an anthracene-based compound. The electron transport region may include, for example, tris(8-hydroxyquinolinato) aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzimidazolyl-1-ylphenyl)-9,10-dinaphthylanthracene, 1,3,5-tris(1-phenyl-1H-benz [d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), beryllium bis(benzoquinolin-10-olate (Bebq$_2$), 9,10-di(naphthalene-2-yl)anthracene (ADN), diphenyl(4-(triphenylsilyl)phenyl)phosphine oxide (TSPO1), or a mixture thereof, without limitation. The thickness of the electron transport layer ETL may be about 100 Å to about 1,000 Å and may be, for example, about 150 Å to about 500 Å. When the thickness of the electron transport layer ETL satisfies the above-described range, satisfactory electron transport properties may be obtained without substantial increase of a driving voltage.

When the electron transport region ETR includes the electron injection layer EIL, the electron transport region ETR may include, a metal halide such as LiF, NaCl, CsF, RbCl, RbI, and CuI, a lanthanide metal (such as Yb), a metal oxide (such as Li$_2$O and/or BaO), or lithium quinolate (LiQ). However, an embodiment of the present disclosure is not limited thereto. In some embodiments, the electron injection layer EIL may be formed using a mixture of an electron transport material and an insulating organo metal salt. The organo metal salt may have an energy band gap of about 4 eV or more. The organo metal salt may include, for example, metal acetates, metal benzoates, metal acetoacetates, metal acetylacetonates, and/or metal stearates. The thickness of the electron injection layer EIL may be about 1 Å to about 500 Å, or about 3 Å to about 300 Å. When the thickness of the electron injection layer EIL satisfies the above described range, satisfactory electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP) or 4,7-diphenyl-1,10-phenanthroline (Bphen). However, embodiments of the present disclosure are not limited thereto.

The second electrode EL2 is provided on the electron transport region ETR. The second electrode EL2 may be a common electrode and/or a cathode. The second electrode EL2 may be a transmissive electrode, a transflective electrode, or a reflective electrode. When the second electrode EL2 is a transmissive electrode, the second electrode EL2 may include a transparent metal oxide, for example, ITO, IZO, ZnO, ITZO, etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

In some embodiments, the second electrode EL2 may be connected with an auxiliary electrode. When the second electrode EL2 is connected with the auxiliary electrode, the resistance of the second electrode EL2 may decrease.

In some embodiments, the organic electroluminescence device 10 of an embodiment may further include a buffer layer between the emission layer EML and the electron transport region ETR. The buffer layer may control the concentration of excitons produced in the emission layer EML. For example, the buffer layer may include a portion of the material for the emission layer EML. The buffer layer may include the host material among the material for the emission layer EML. The lowest triplet excitation energy level of the material of the buffer layer may be controlled or selected to be greater than the lowest triplet excitation energy level of the second dopant, and lower than the lowest triplet excitation energy level of the host, depending on the combination of the host and dopant materials included in the emission layer EML.

In some embodiments, a capping layer CPL may be further disposed on the second electrode EL2 of the organic electroluminescence device 10 of an embodiment. The capping layer CPL may include, for example, α-NPD, NPB, TPD, m-MTDATA, Alq3, CuPc, N4,N4,N4',N4'-tetra(biphenyl-4-yl) biphenyl-4,4'-diamine (TPD15), 4,4',4"-tris(carbazol-9-yl) triphenylamine (TCTA), etc.

Compared with a conventional polycyclic compound including a nitrogen atom and a boron atom in a core, the fused polycyclic compound of an embodiment includes two fused polycyclic heterocycles, which each include at least one boron atom, one nitrogen atom, and five fused rings. The two fused polycyclic heterocycles are connected via a five-member or six-member aromatic ring as a linker, and a heteroatom (such as an oxygen atom, a sulfur atom, and/or a nitrogen atom) is provided as a connecting group between the two fused polycyclic heterocycles and the five-member or six-member aromatic ring linker. The fused polycyclic compound of an embodiment may have a structure in which the positions of the boron atoms, linking heteroatoms, and aromatic rings are optimized or suitable, as represented by Formula 1, and accordingly, when the fused polycyclic compound of an embodiment is applied as a light-emitting material of an organic electroluminescence device, the long life of the organic electroluminescence device may be achieved.

Hereinafter, the fused polycyclic compound according to an embodiment of the present disclosure and the organic electroluminescence device of an embodiment will be explained in more detail by referring to particular embodiments and comparative embodiments. The following embodiments are only illustrations to assist the understanding of the present disclosure, and the scope of the present disclosure is not limited thereto.

EXAMPLES

1. Synthesis of Fused Polycyclic Compound

First, the synthetic method of the fused polycyclic compound according to an embodiment will be explained in more detail by referring to the synthetic methods of Compound A-3, Compound A-4, and Compound G-9. The synthetic methods of the fused polycyclic compounds explained below are only embodiments, and the synthetic method of the fused polycyclic compound according to an embodiment of the present disclosure is not limited thereto.

(1) Synthesis of Compound A-3
(Synthesis of Intermediate Compound I-1)
[Reaction 1]

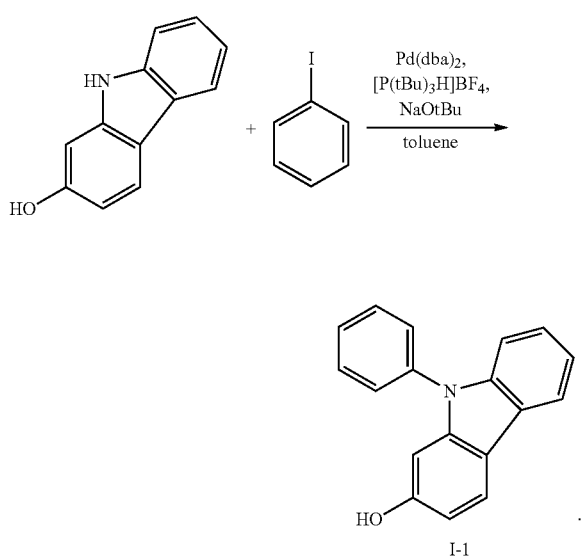

A toluene (350 mL) solution including 9H-carbazol-2-ol (20 g), iodobenzene (25 g), sodium butoxide (26 g), Pd$_2$(dba)$_3$ (2 g), and [P(tBu)$_3$H]BF$_4$ (2.5 g) was heated and refluxed for about 6 hours under heating conditions in an oil bath. After cooling to room temperature, the reaction solution was poured into water. A target material was extracted with toluene, dried with magnesium sulfate, and then concentrated under reduced pressure. The mixture thus obtained was separated by silica gel chromatography to obtain 24 g of Intermediate Compound I-1 (yield 85%).

(Synthesis of Intermediate I-2)

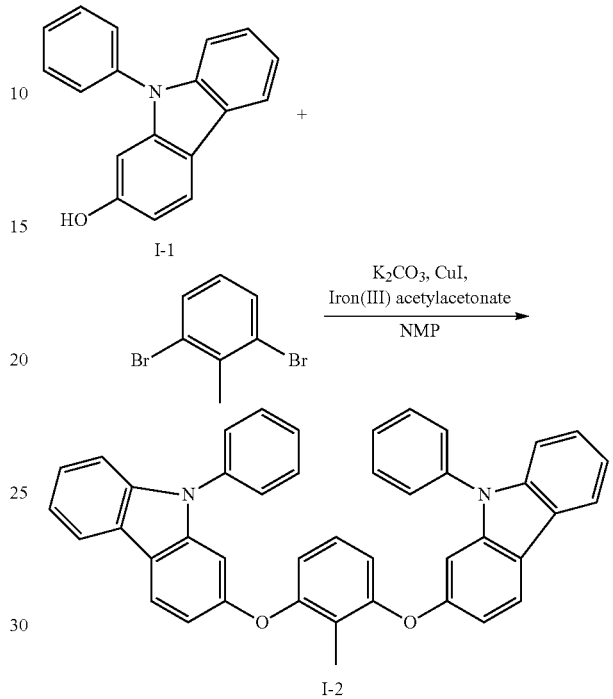

An NMP (120 mL) solution including Intermediate I-1 (24 g), 2,6-dibromotoluene (11 g), potassium carbonate (24 g), copper iodide (0.4 g), and iron(III) acetylacetonate (1.5 g) was heated and stirred for about 8 hours at about 150° C. After cooling to room temperature, the reaction solution was poured into water. A target material was extracted with ethyl acetate, dried with magnesium sulfate, and then concentrated under reduced pressure. The mixture thus obtained was separated by silica gel chromatography to obtain 16 g of Intermediate Compound I-2 (yield 60%).

(Synthesis of Compound A-3)

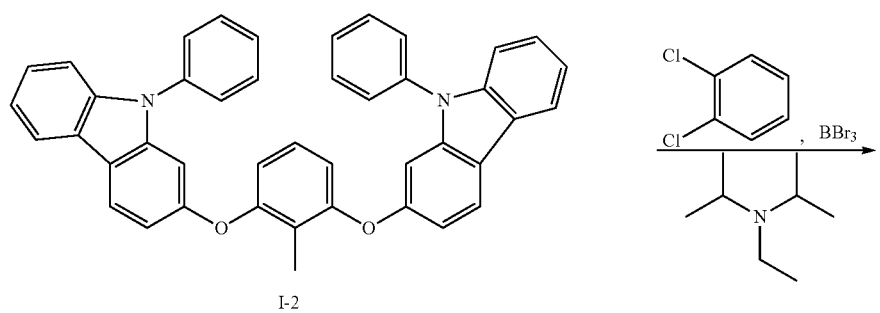

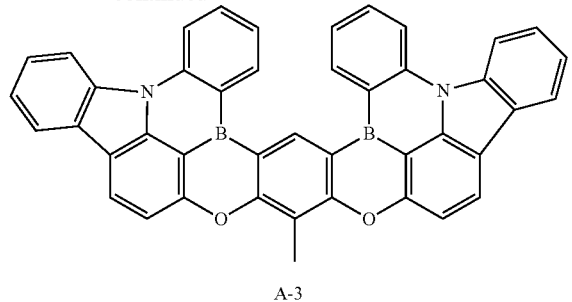

A-3

To a 1,2-dichlorobenzene (100 mL) solution including Intermediate I-2 (5 g), boron tribromide (3.1 mL) was added. After finishing the dropwise addition, heating and stirring was performed for about 20 hours under heating conditions of about 180° C. After cooling to room temperature, N,N-diisopropylethylamine (10 mL) was added. After stirring for a while, the reaction solvent was removed by distillation under reduced pressure. The mixture thus obtained was separated by silica gel chromatography, and 2 g (yield 40%) of a target material was obtained. The molecular weight of Compound A-3 measured by FAB-MS measurement was 622. The Compound A-3 thus obtained was separated again by sublimation and used as a specimen for evaluation.

(2) Synthesis of Compound A-4
(Synthesis of Intermediate Compound II-11)

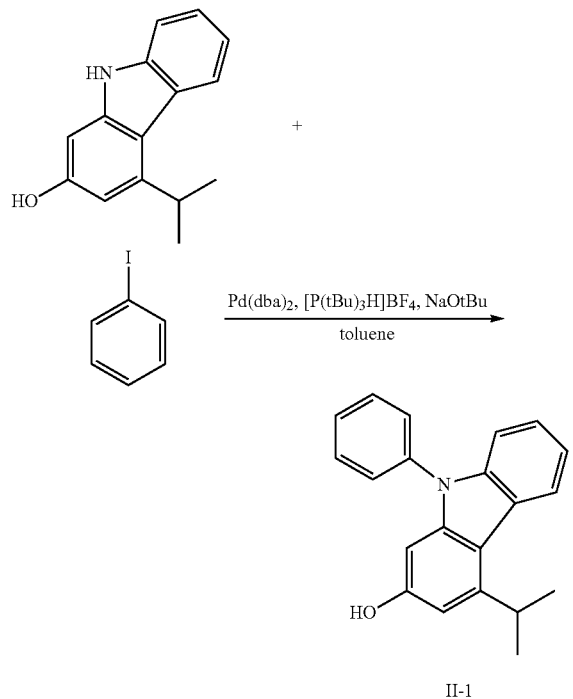

II-1

The reaction was performed under substantially the same conditions for synthesizing Intermediate I-1 in the synthesis of Compound A-3, except for using 4-isopropyl-9H-carbazole-2-ol (24.6 g) instead of 9H-carbazole-2-ol. As a result, 30 g of Intermediate Compound II-1 was obtained (yield 90%).

(Synthesis of Intermediate Compound II-2)

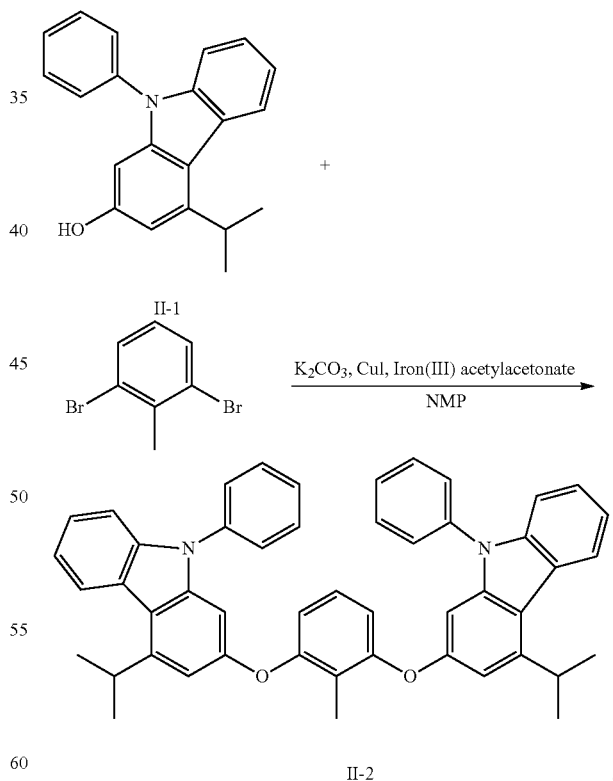

II-2

The reaction was performed under substantially the same conditions for synthesizing Intermediate I-2 in the synthesis of Compound A-3 except for using Intermediate II-1 (28 g) obtained above instead of Intermediate I-1. As a result, 18 g of Intermediate Compound II-2 was obtained (yield 58%).

(Synthesis of Compound A-4)

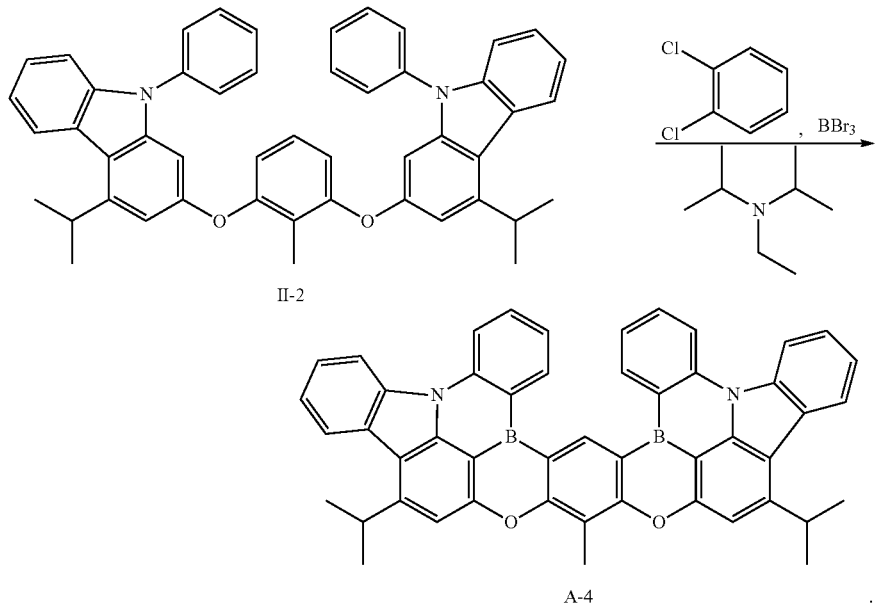

The reaction was performed under substantially the same conditions for synthesizing Compound A-3 except for using Intermediate II-2 (5.7 g) obtained above instead of Intermediate I-2. As a result, 2 g (yield 34%) of a target material was obtained. The molecular weight of Compound A-4 measured by FAB-MS measurement was 706. The Compound A-4 thus obtained was separated again by sublimation and used as a specimen for evaluation.

(3) Synthesis of Compound G-9
(Synthesis of Intermediate Compound III-1)

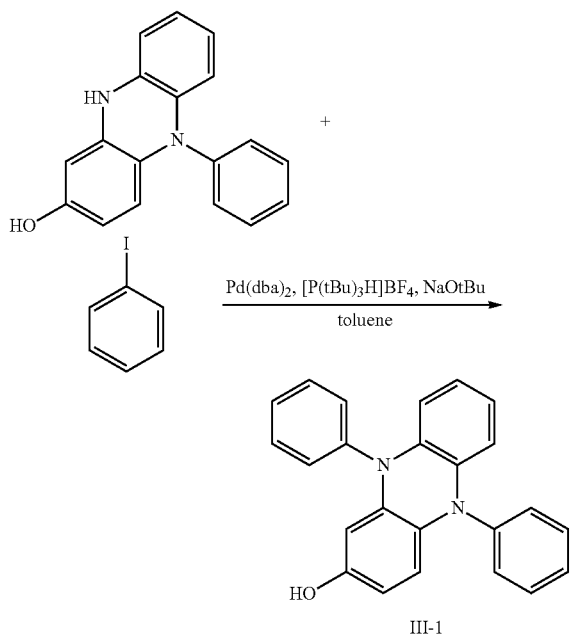

The reaction was performed under substantially the same conditions for synthesizing Intermediate I-1 in the synthesis of Compound A-3, except for using 5-phenyl-5,10-dihydrophenazine-2-ol (30 g) instead of 9H-carbazole-2-ol. As a result, 32 g of Intermediate Compound III-1 was obtained (yield 83%).

(Synthesis of Intermediate Compound III-2)

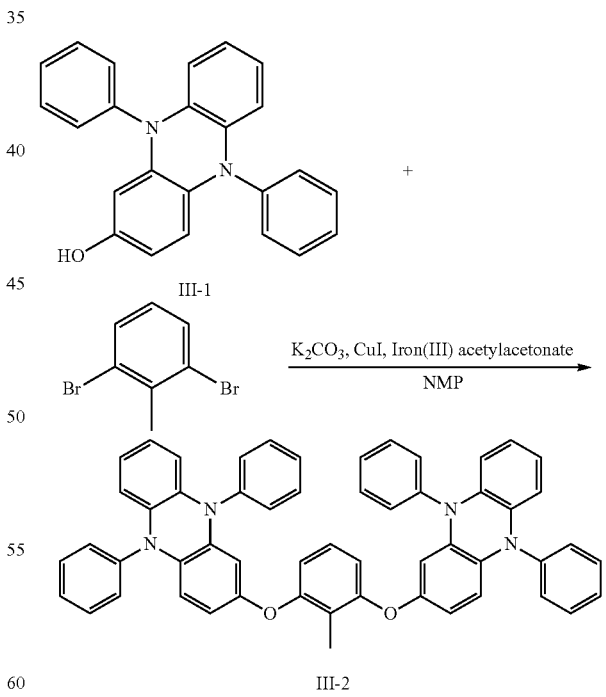

The reaction was performed under substantially the same conditions for synthesizing Intermediate I-2 in the synthesis of A-3, except for using Intermediate III-1 (32 g) obtained above instead of Intermediate I-1. As a result, 25 g of Intermediate Compound III-2 was obtained (yield 72%).

(Synthesis of Compound G-9)

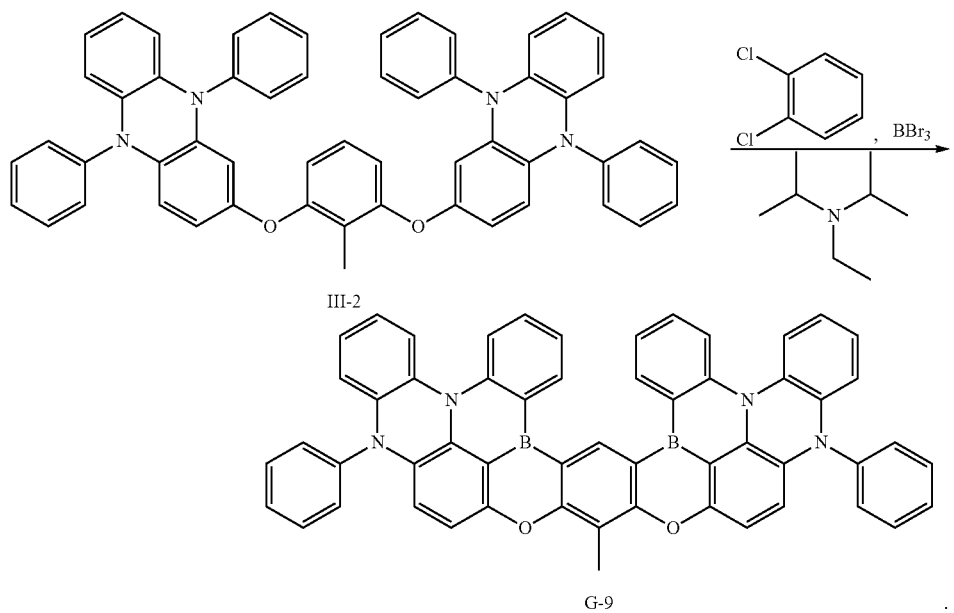

The reaction was performed under substantially the same conditions for synthesizing Compound A-3, except for using Intermediate III-2 (6.5 g) obtained above instead of Intermediate I-2. As a result, 2 g (yield 30%) of a target material was obtained. The molecular weight of Compound G-9 measured by FAB-MS measurement was 804. The Compound G-9 thus obtained was separated again by sublimation and used as a specimen for evaluation.

(4) Synthesis of Compound B-1

(Synthesis of Intermediate Compound IV-1)

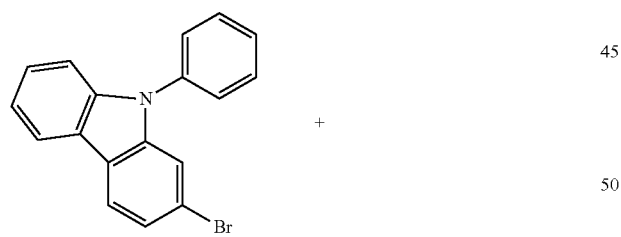

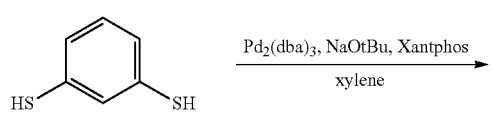

-continued

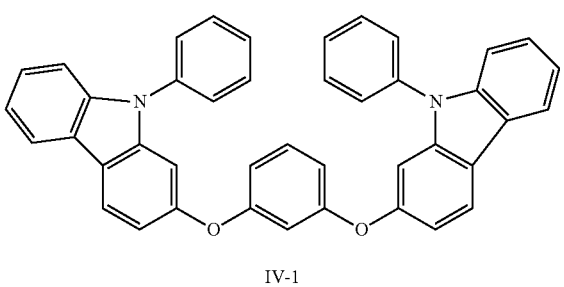

A xylene (200 mL) solution including 2-bromo-9-phenyl-9H-carbazole (20 g), 1,3-benzenedithiol (3.8 g), sodium butoxide (7.8 g), $Pd_2(dba)_3$ (0.5 g), and XantPhos (4,5-bis (diphenylphosphino)-9,9-dimethylxanthene, 0.6 g) was heated and refluxed for about 5 hours in an oil bath. After cooling to room temperature, the reaction solution was poured into water. A target material was extracted with toluene, dried with magnesium sulfate, and then concentrated under reduced pressure. The mixture thus obtained was separated by silica gel chromatography to obtain 12 g of Intermediate Compound IV-1 (yield 72%).

(Synthesis of Compound B-1)

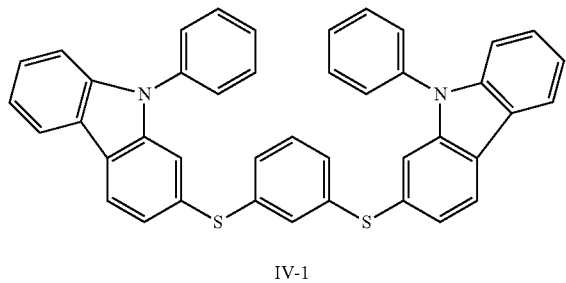 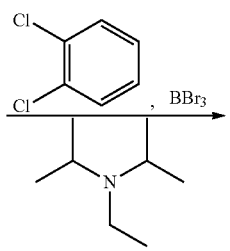

IV-1

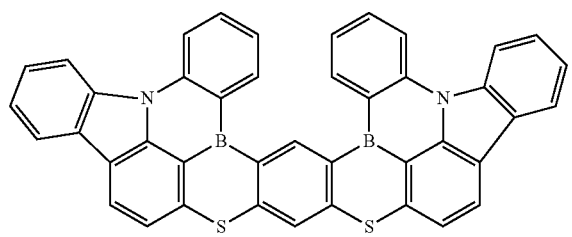

B-1

The reaction was performed under substantially the same conditions for synthesizing Compound A-3 except for using Intermediate IV-1 (9 g) obtained above instead of Intermediate I-2. As a result, 2.8 g (yield 30%) of a target material was obtained. The molecular weight of Compound B-1 measured by FAB-MS measurement was 640. The Compound B-1 thus obtained was separated again by sublimation and used as a specimen for evaluation.

(5) Synthesis of Compound C-1

(Synthesis of Intermediate Compound V-1)

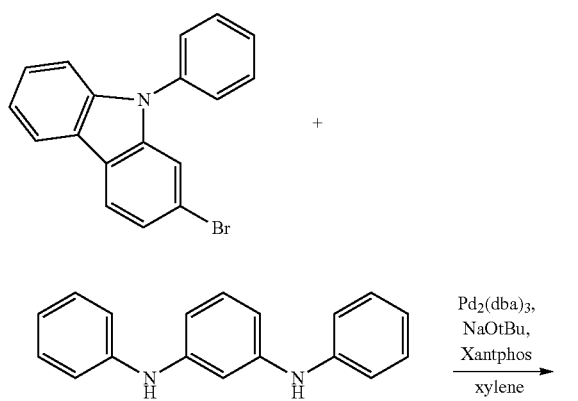

-continued

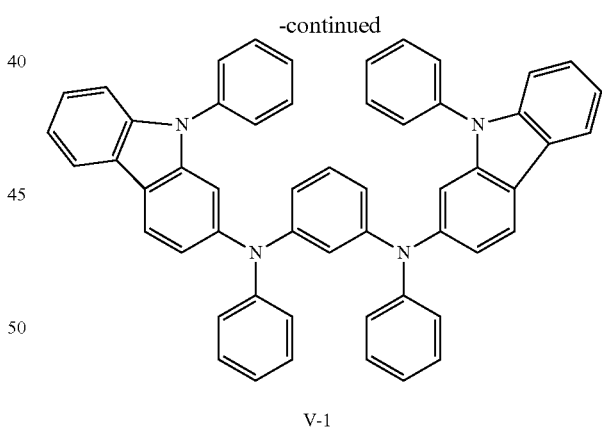

V-1

A toluene (200 mL) solution including 2-bromo-9-phenyl-9H-carbazole (20 g), N1,N3-diphenylbenzene-1,3-diamine (7 g), sodium butoxide (7.8 g), $Pd_2(dba)_3$ (0.5 g), and XantPhos (0.6 g) was heated and refluxed for about 12 hours in an oil bath. After cooling to room temperature, the reaction solution was poured into water. A target material was extracted with toluene, dried with magnesium sulfate, and then concentrated under reduced pressure. The mixture thus obtained was separated by silica gel chromatography to obtain 13 g of Intermediate Compound V-1 (yield 65%).

(Synthesis of Compound C-1)

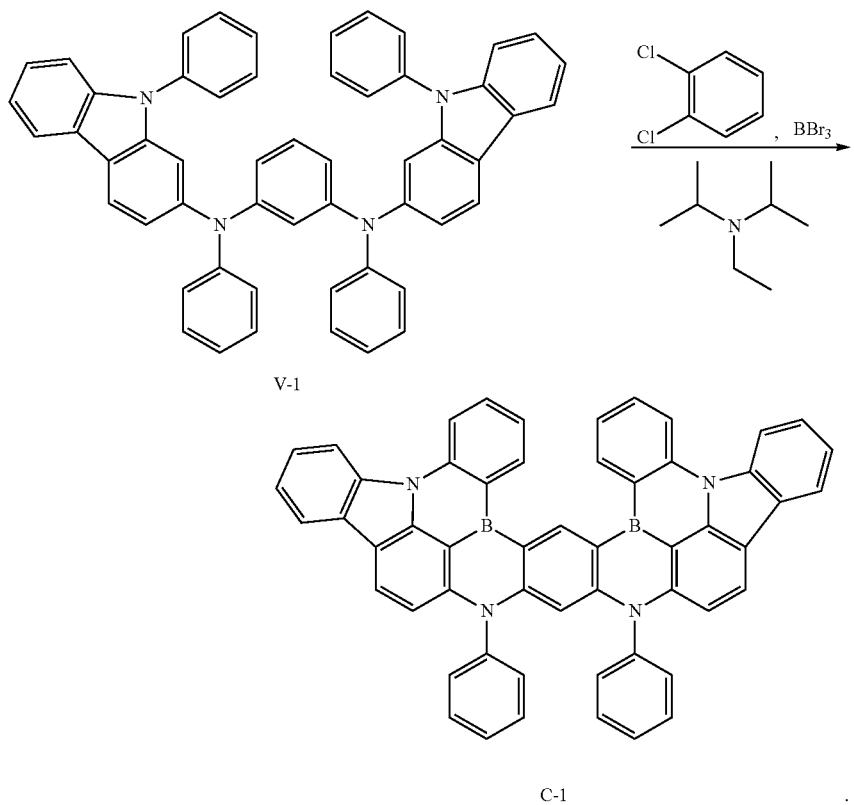

The reaction was performed under substantially the same conditions for synthesizing Compound A-3, except for using Intermediate V-1 (10 g) obtained above instead of Intermediate I-2. As a result, 2.6 g (yield 25%) of a target material was obtained. The molecular weight of Compound C-1 measured by FAB-MS measurement was 758. The Compound C-1 thus obtained was separated again by sublimation and used as a specimen for evaluation.

(6) Synthesis of Compound E-1

(Synthesis of Intermediate Compound VI-1)

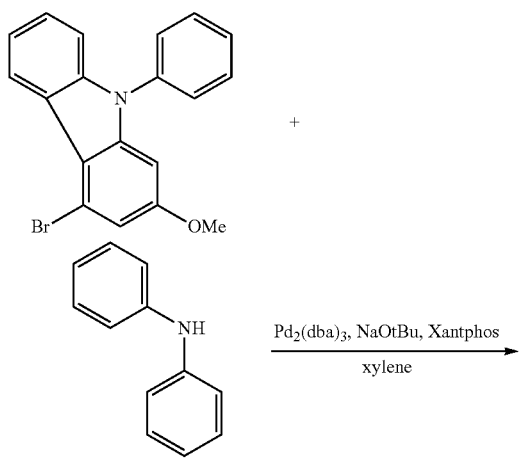

-continued

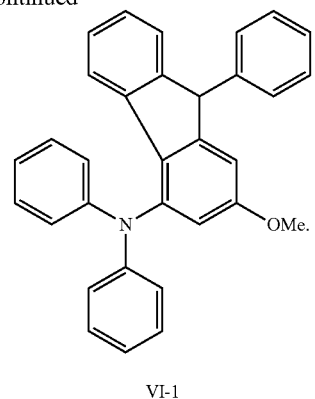

VI-1

A toluene (150 mL) solution including 4-bromo-2-methoxy-9-phenyl-9H-carbazole (15 g), diphenylamine (6 g), sodium butoxide (6.8 g), $Pd_2(dba)_3$ (0.4 g), and XantPhos (0.5 g) was heated and refluxed for about 10 hours in an oil bath. After cooling to room temperature, the reaction solution was poured into water. A target material was extracted with toluene, dried with magnesium sulfate, and then concentrated under reduced pressure. The mixture thus obtained was separated by silica gel chromatography to obtain 13 g of Intermediate Compound VI-1 (yield 83%).

(Synthesis of Intermediate Compound VI-2)

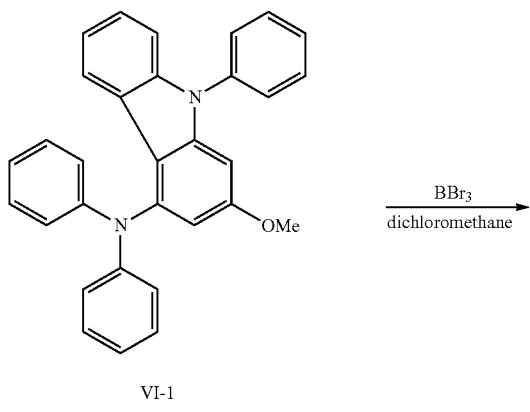

(Synthesis of Intermediate Compound VI-3)

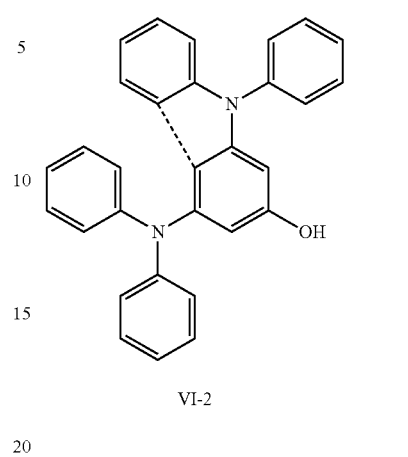

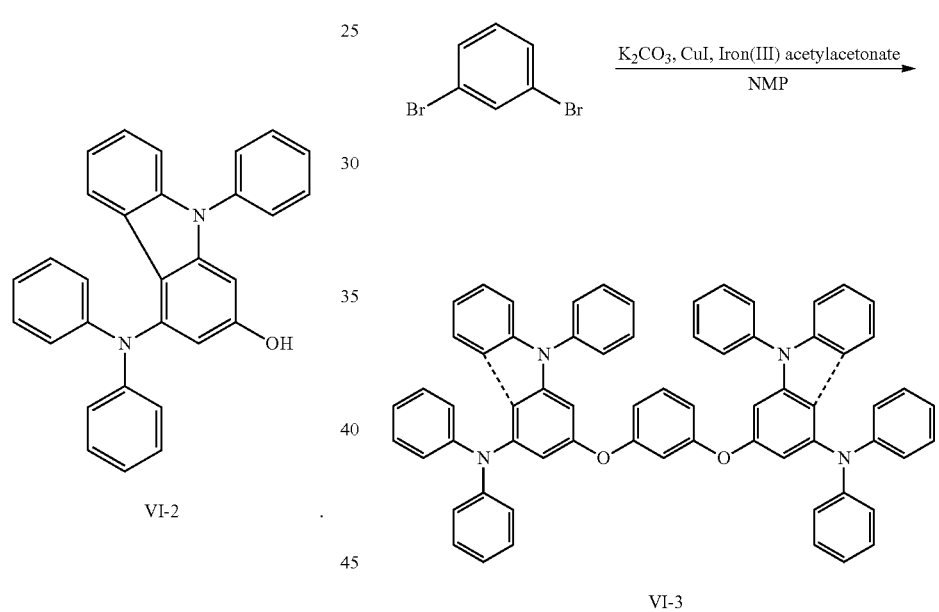

To a dichloromethane solution (100 mL) of Intermediate IV-1 (13 g) obtained above, a 1 M BBr$_3$/dichloromethane solution (60 mL) was added dropwise at a temperature of about −78° C. After finishing the dropwise addition, the temperature of the reaction solution was restored to room temperature, and the reaction solution was stirred at room temperature. After finishing the reaction, the reaction solution was poured into a NaHCO$_3$ aqueous solution. A target material was extracted with dichloromethane, dried with magnesium sulfate, and concentrated under reduced pressure. The mixture thus obtained was separated by silica gel chromatography to obtain 11 g of Intermediate Compound VI-2 (yield 90%).

An N-methyl pyrrolidone (NMP) (80 mL) solution including Intermediate VI-2 (11 g), 1,3-dibromobenzene (2.6 g), potassium carbonate (7 g), copper iodide (0.2 g), and iron(III) acetylacetonate (0.75 g) was heated and stirred for about 8 hours at about 150° C. After cooling to room temperature, the reaction solution was poured into water. A target material was extracted with ethyl acetate, dried with magnesium sulfate, and then concentrated under a reduced pressure. The mixture thus obtained was separated by silica gel chromatography to obtain 6.4 g of Intermediate Compound VI-3 (yield 63%).

(Synthesis of Compound E-1)

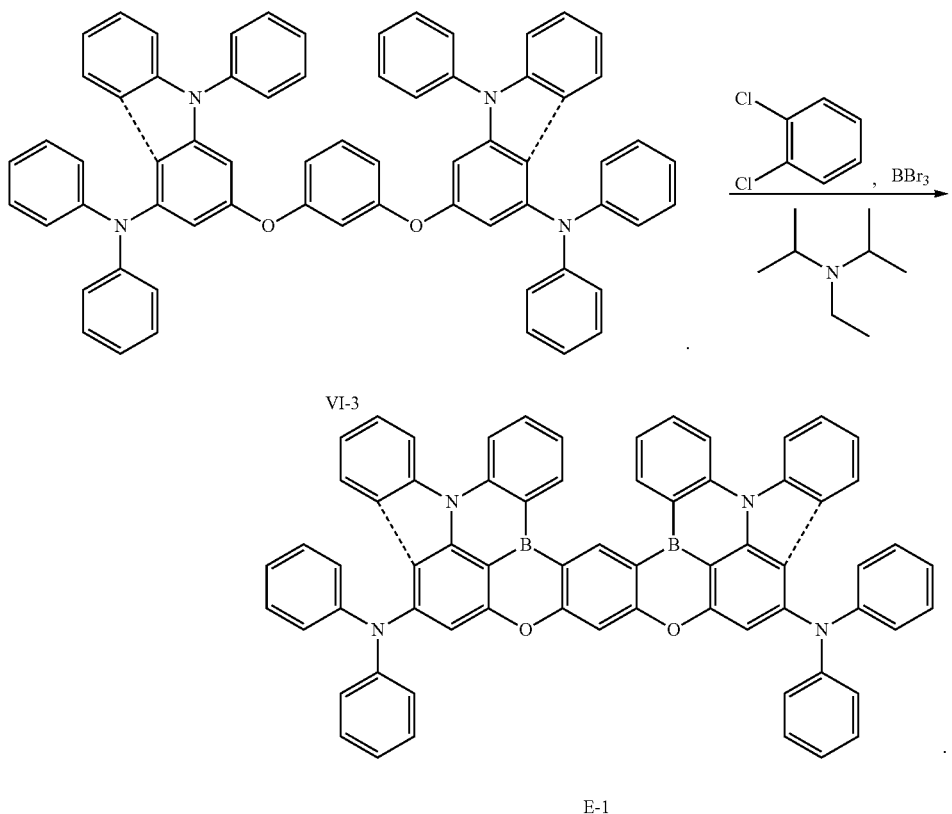

E-1

The reaction was performed under substantially the same conditions for synthesizing Compound A-3 except for using Intermediate VI-3 (6.4 g) obtained above. As a result, 2 g (yield 30%) of a target material was obtained instead of Intermediate I-2. The molecular weight of Compound E-1 measured by FAB-MS measurement was 942. The Compound E-1 thus obtained was separated again by sublimation and used as a specimen for evaluation.

2. Manufacture and Evaluation of Organic Electroluminescence Device Including Fused Polycyclic Compound (Manufacture of Organic Electroluminescence Device)

Organic electroluminescence devices of Examples 1 to 6 were manufactured using Compounds A-3, A-4, B-1, C-1, E-1 and G-9, respectively, as the dopant material of an emission layer.

[Example Compounds]

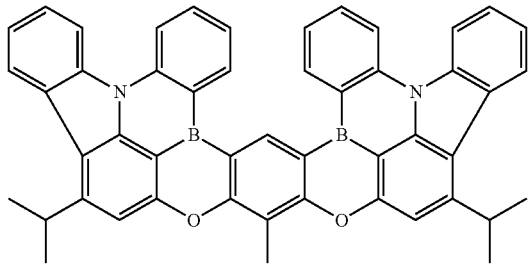

A-4

-continued

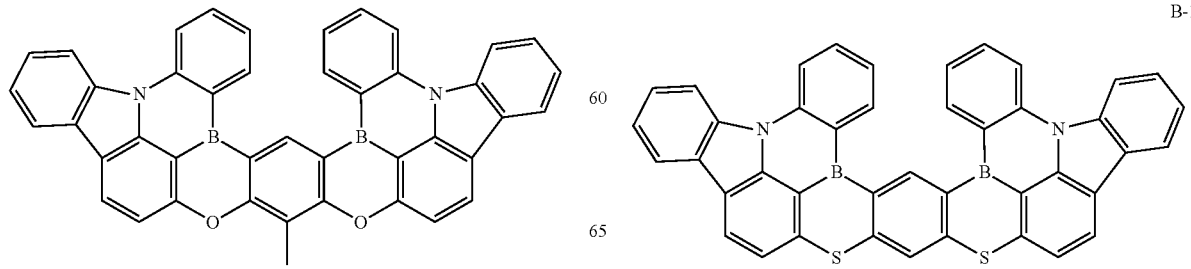

A-3

B-1

C-1

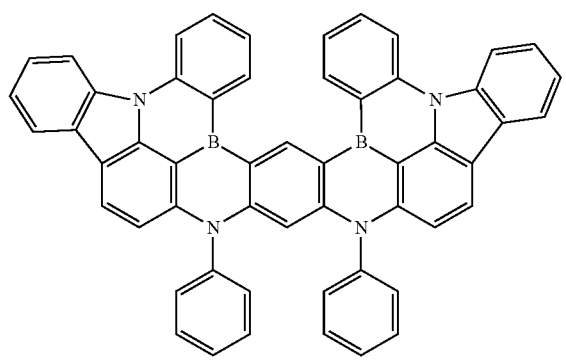

E-1

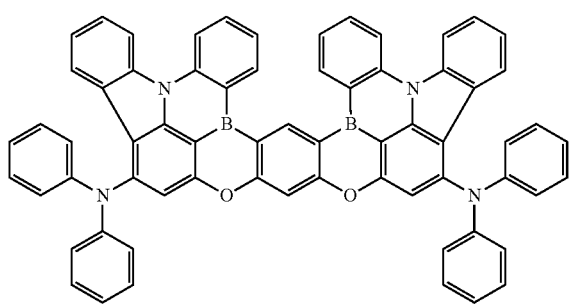

G-9

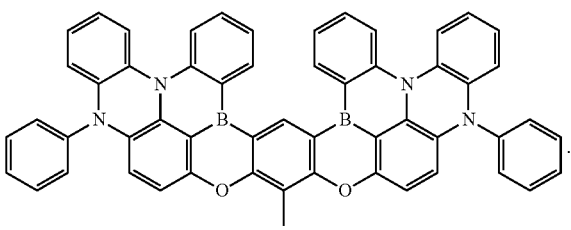

Comparative Compounds X-1 and X-2 were used to manufacture Comparative Example devices 1 and 2, respectively.

[Comparative Compounds]

X-1

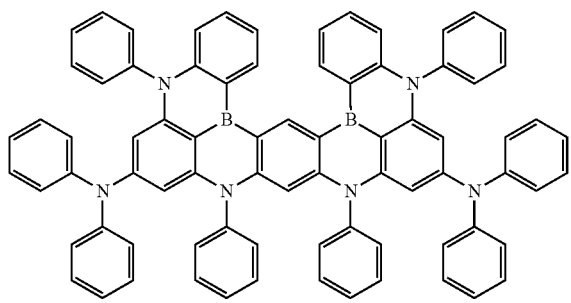

X-2

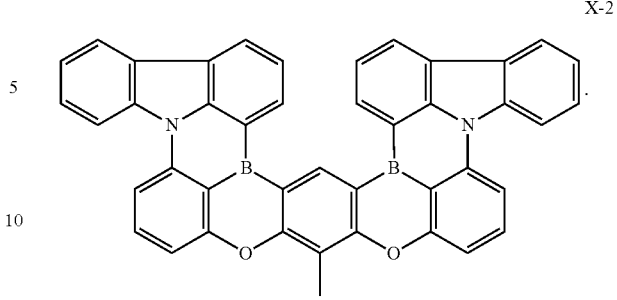

The organic electroluminescence device of an embodiment including the fused polycyclic compound of an embodiment in an embodiment was manufactured by the method below. Example 1 to Example 6 are organic electroluminescence devices manufactured using Compound A-3, Compound A-4, Compound B-1, Compound C-1, Compound E-1, and Compound G-9, respectively, as light-emitting materials. Comparative Example 1 and Comparative Example 2 are organic electroluminescence devices manufactured using Comparative Compound X-1 and Comparative Compound X-2, respectively, as light-emitting materials.

A first electrode having a thickness of about 150 nm was formed using ITO, a hole injection layer having a thickness of about 10 nm was formed using 1,4,5,8,9,11-hexaazatriphenylene hexacarbonitrile (HAT-CN), a first hole transport layer having a thickness of about 80 nm was formed using N,N'-di(1-naphthyl)-N,N'-diphenyl-(1,1'-biphenyl)-4,4'-diamine (α-NPD), a second hole transport layer having a thickness of about 5 nm was formed using 1,3-bis(N-carbazolyl)benzene (mCP), an emission layer having a thickness of about 20 nm was formed using 3,3'-bis(N-carbazolyl)-1,1'-biphenyl doped with 1% of the Example Compound or the Comparative Compound, an electron transport layer having a thickness of about 30 nm was formed using 1,3,5-tris(N-phenylbenzimidazol-2-yl)benzene (TPBi), an electron injection layer having a thickness of about 0.5 nm was formed using LiF, and a second electrode having a thickness of about 100 nm was formed using Al. All layers were formed by a deposition method under a vacuum atmosphere.

The compounds used for the manufacture of the organic electroluminescence devices of the Examples and Comparative Examples are as follows.

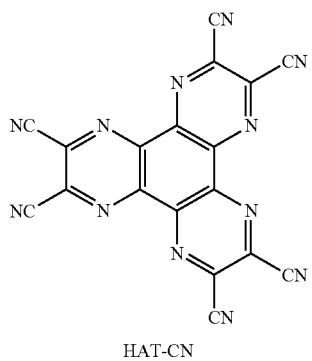

HAT-CN

-continued

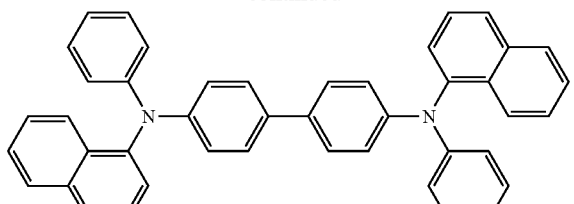

α-NPD

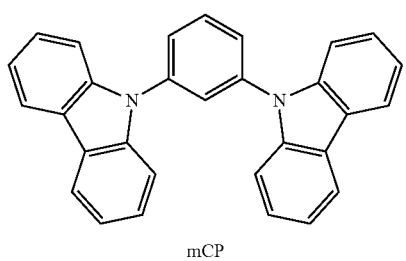

mCP

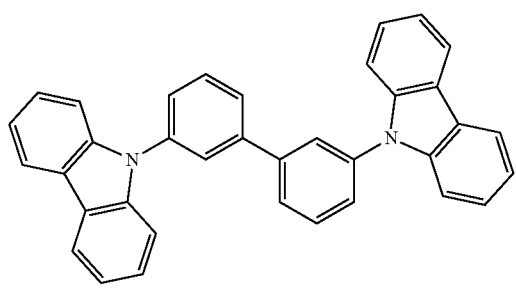

mCBP

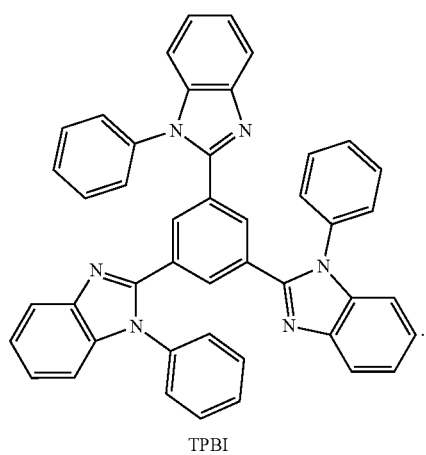

TPBI

Experimental Example

The device life spans of the organic electroluminescence devices manufactured using Example Compound A-3, Compound A-4, Compound B-1, Compound C-1, Compound E-1, and Compound G-9 and Comparative Compound X-1 and Comparative Compound X-2 were evaluated. The evaluation results are shown in Table 1. The device life spans are reported relative to the device life span of Comparative Example 2, which was set to about 100%.

TABLE 1

| Device manufacturing example | Dopant compound | Full width at half maximum (nm) | Emission wavelength (nm) | Device life (%) |
| --- | --- | --- | --- | --- |
| Example 1 | Compound A-3 | 30 | 455 | 163 |
| Example 2 | Compound A-4 | 28 | 453 | 158 |
| Example 3 | Compound B-1 | 27 | 463 | 155 |
| Example 4 | Compound C-1 | 33 | 462 | 170 |
| Example 5 | Compound E-1 | 23 | 458 | 165 |
| Example 6 | Compound G-9 | 32 | 460 | 172 |
| Comparative Example 1 | Comparative Compound X-1 | 18 | 467 | 135 |
| Comparative Example 2 | Comparative Compound X-2 | 26 | 465 | 100 |

Referring to the results of Table 1, it could be confirmed that the Examples of the organic electroluminescence devices using the fused polycyclic compounds according to embodiments of the present disclosure as light-emitting materials all showed increased device life while maintaining blue emission wavelength.

The Example compounds include two or more boron atoms, and the positions of boron atoms, heteroatoms, and aromatic rings may be optimized or selected so that a full width at half maximum and a wavelength range suitable to a blue light-emitting material may be selected, and the stability of the compound may be improved. Accordingly, the organic electroluminescence devices of the Examples may show improved device life span, compared to the organic electroluminescence devices of the Comparative Examples. For example, the organic electroluminescence device of an embodiment may achieve high device life in a blue emission wavelength region by including the fused polycyclic compound of an embodiment as a thermally activated delayed fluorescence (TADF) dopant in an organic electroluminescence device.

Comparative Compound X-1 included in Comparative Example 1 included a benzene ring linker between two boron-containing fused polycyclic groups, but did not include an additional connection (bond) between a boron- and nitrogen-substituted benzene ring and another benzene ring. Accordingly, when compared with the Example Compounds, the light-emitting material did not have a suitable full width at half maximum, the stability of a compound molecule was decreased when compared with the Example Compounds, and the device life span of Comparative Example 1 was decreased when compared with the Example.

In Comparative Compound X-2 included in Comparative Example 2, an additional connection (bond) was included between a boron- and nitrogen-substituted benzene ring and another benzene ring, but the position of the bond was different from that of the Example Compound, and the positions of boron atoms, heteroatoms, and aromatic rings were not optimized or suitable. Accordingly, when compared with the Example Compounds, the stability of the compound was decreased, and the device of Comparative Example 2 had a decreased device life when compared with the Examples.

The organic electroluminescence device of an embodiment may show improved device characteristics with high efficiency.

The fused polycyclic compound of an embodiment may be included in the emission layer of an organic electroluminescence device and may contribute to increasing the efficiency of the organic electroluminescence device.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the example embodiments of the present disclosure have been described, it is understood that the present disclosure should not be limited to these example embodiments, but various changes and modifications can be made by one ordinary skilled in the art within the spirit and scope of the present disclosure as set forth in the following claims and their equivalents.

What is claimed is:

1. An organic electroluminescence device, comprising:
a first electrode;
a second electrode opposite the first electrode; and
a plurality of organic layers between the first electrode and the second electrode,
wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, or an oxide of one or more thereof,
wherein at least one organic layer among the plurality of organic layers comprises a fused polycyclic compound represented by Formula 1:

[Formula 1]

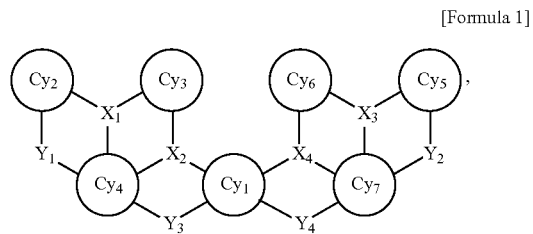

wherein, in Formula 1,
Cy$_1$ to Cy$_7$ are each independently a substituted or unsubstituted aromatic hydrocarbon ring, or a substituted or unsubstituted aromatic heterocycle, and/or are optionally combined with an adjacent group to form a ring;
X$_1$ to X$_4$ are each independently B or N;
at least one of X$_1$ or X$_2$ is B;
at least one of X$_3$ or X$_4$ is B;
Y$_1$ and Y$_2$ are each independently a direct linkage, O, S, or NAr$_1$;

Y$_3$ and Y$_4$ are each independently O, S, or NAr$_2$; and
Ar$_1$ and Ar$_2$ are each independently a substituted or unsubstituted aryl group of 6 to 60 carbon atoms for forming a ring, or a substituted or unsubstituted heteroaryl group of 2 to 60 carbon atoms for forming a ring.

2. The organic electroluminescence device of claim 1, wherein the plurality of organic layers comprise:
a hole transport region on the first electrode;
an emission layer on the hole transport region; and
an electron transport region on the emission layer, and
the emission layer comprises the fused polycyclic compound represented by Formula 1.

3. The organic electroluminescence device of claim 2, wherein the emission layer is to emit delayed fluorescence.

4. The organic electroluminescence device of claim 2,
wherein the emission layer is a delayed fluorescence emission layer comprising a host and a dopant, and
the dopant comprises the fused polycyclic compound represented by Formula 1.

5. The organic electroluminescence device of claim 1, wherein the fused polycyclic compound represented by Formula 1 is represented by at least one of Formula 2-1 to Formula 2-5:

[Formula 2-1]

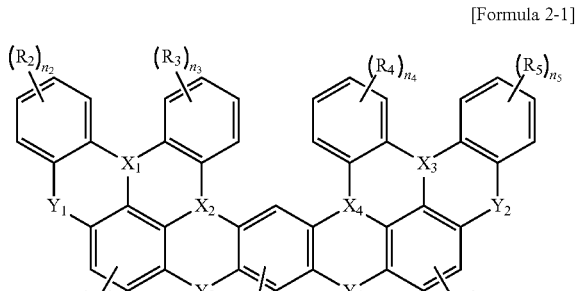

[Formula 2-2]

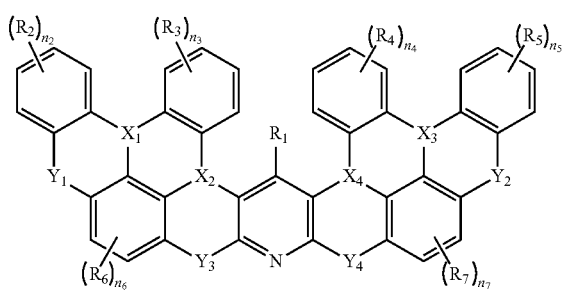

[Formula 2-3]

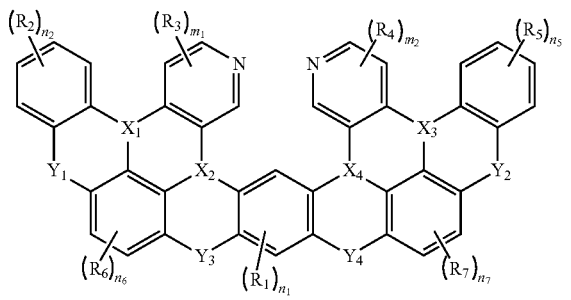

-continued

[Formula 2-4]

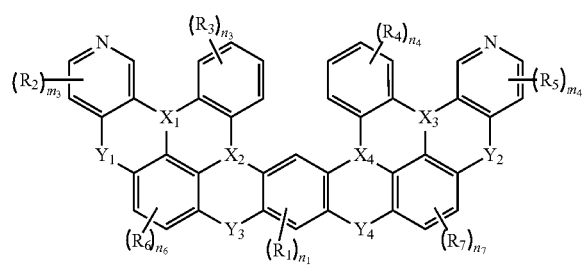

[Formula 2-5]

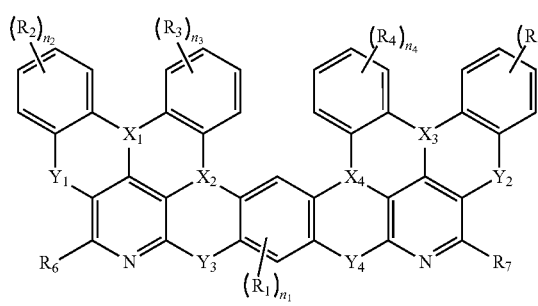

wherein, in Formulae 2-1 to 2-5, $R_1$ to $R_7$ are each independently a hydrogen atom, a deuterium atom, a halogen atom, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 60 carbon atoms for forming a ring, or a substituted or unsubstituted heteroaryl group of 2 to 60 carbon atoms for forming a ring, and/or are optionally combined with an adjacent group to form a ring;

$n_1$ is an integer of 0 to 2;

$n_2$ to $n_5$ are each independently an integer of 0 to 4;

$n_6$ and $n_7$ are each independently an integer of 0 to 2;

$m_1$ to $m_4$ are each independently an integer of 0 to 3; and $X_1$ to $X_4$ and $Y_1$ to $Y_4$ are each independently the same as defined in Formula 1.

6. The organic electroluminescence device of claim 5, wherein the fused polycyclic compound represented by Formula 1 is represented by at least one of Formula 3-1 or Formula 3-2:

[Formula 3-1]

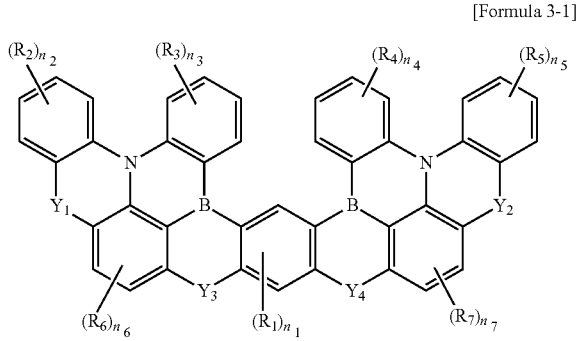

-continued

[Formula 3-2]

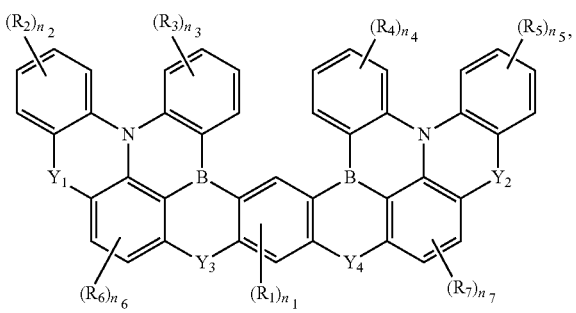

wherein, in Formula 3-1 and Formula 3-2, $Y_1$ to $Y_4$, $R_1$ to $R_7$, and $n_1$ to $n_7$ are each independently the same as defined in Formula 1 and Formula 2-1 to Formula 2-5.

7. The organic electroluminescence device of claim 5, wherein the fused polycyclic compound represented by Formula 1 is represented by Formula 4:

[Formula 4]

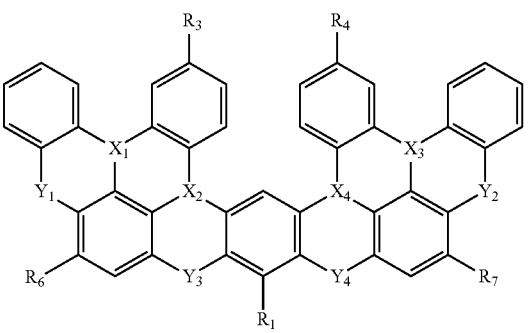

wherein, in Formula 4, $X_1$ to $X_4$, $Y_1$ to $Y_4$, $R_1$, $R_3$, $R_4$, $R_6$, and $R_7$ are each independently the same as defined in Formula 1 and Formula 2-1 to Formula 2-5.

8. The organic electroluminescence device of claim 5, wherein the fused polycyclic compound represented by Formula 1 is represented by at least one of Formula 5-1 to Formula 5-6:

[Formula 5-1]

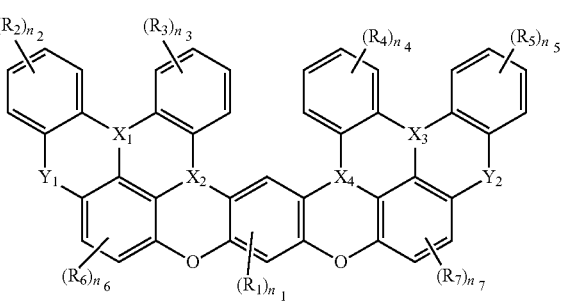

[Formula 5-2]

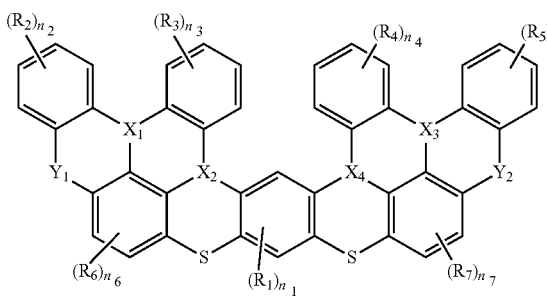

[Formula 5-3]

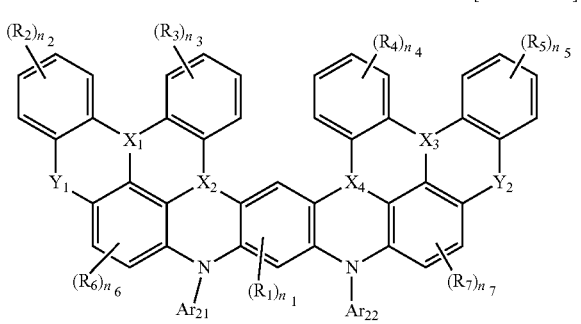

[Formula 5-4]

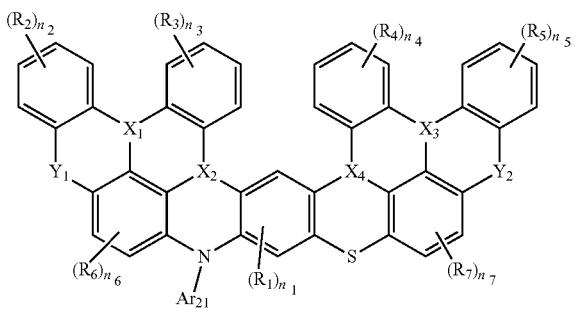

[Formula 5-5]

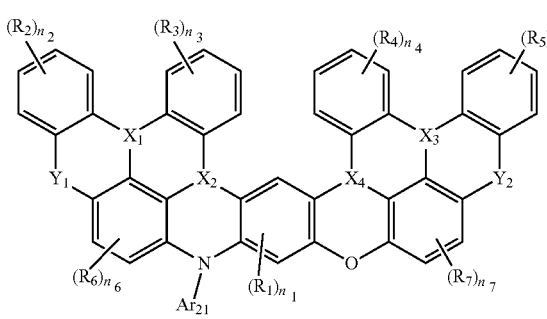

[Formula 5-6]

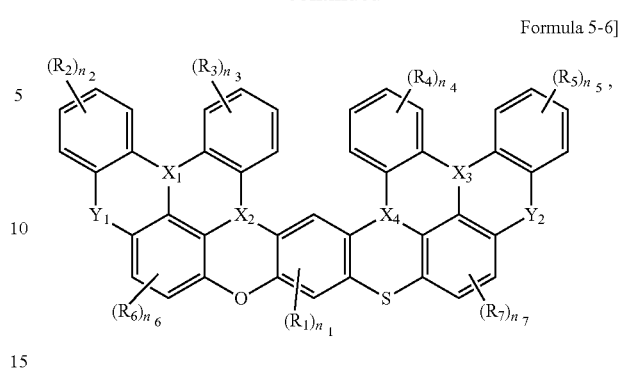

wherein, in Formula 5-1 to Formula 5-6,

Ar$_{21}$ and Ar$_{22}$ are each independently a substituted or unsubstituted aryl group of 6 to 60 carbon atoms for forming a ring, or a substituted or unsubstituted heteroaryl group of 2 to 60 carbon atoms for forming a ring, and X$_1$ to X$_4$, Y$_1$ and Y$_2$, R$_1$ to R$_7$, and n$_1$ to n$_7$ are each independently the same as defined in Formula 1 and Formula 2-1 to Formula 2-5.

9. The organic electroluminescence device of claim 5, wherein the fused polycyclic compound represented by Formula 1 is represented by at least one of Formula 6-1 to Formula 6-4:

[Formula 6-1]

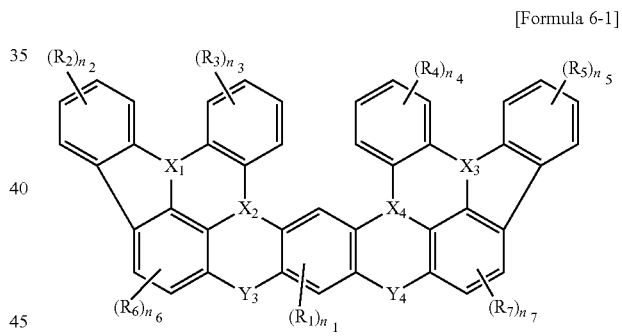

[Formula 6-2]

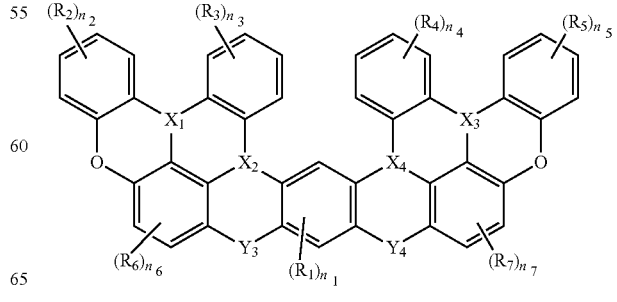

-continued

[Formula 6-3]

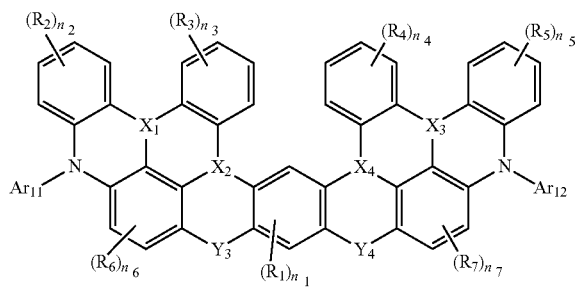

[Formula 6-4]

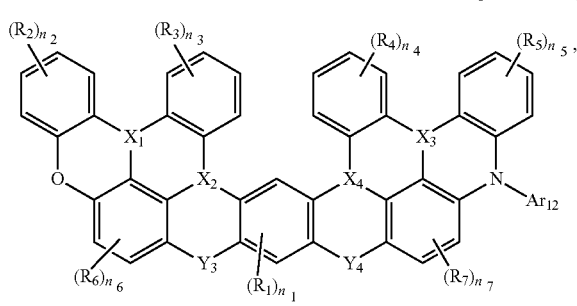

wherein, in Formula 6-1 to Formula 6-4,

Ar$_{11}$ and Ar$_{12}$ are each independently a substituted or unsubstituted aryl group of 6 to 60 carbon atoms for forming a ring, or a substituted or unsubstituted heteroaryl group of 2 to 60 carbon atoms for forming a ring, and X$_1$ to X$_4$, Y$_3$ and Y$_4$, R$_1$ to R$_7$, and n$_1$ to n$_7$ are each independently the same as defined in Formula 1 and Formula 2-1 to Formula 2-5.

10. The organic electroluminescence device of claim 5, wherein R$_1$ to R$_7$ are each independently a hydrogen atom, a substituted or unsubstituted methyl group, a substituted or unsubstituted isopropyl group, a substituted or unsubstituted arylamine group, a substituted or unsubstituted phenyl group, a substituted or unsubstituted pyridine group, a substituted or unsubstituted pyrimidine group, or a substituted or unsubstituted pyrazine group.

11. The organic electroluminescence device of claim 1, wherein Ar$_1$ and Ar$_2$ are each independently a substituted or unsubstituted phenyl group, or a substituted or unsubstituted pyridine group.

12. The organic electroluminescence device of claim 5, wherein at least one of R$_1$ to R$_3$ is a deuterium atom, a deuterium-substituted alkyl group of 1 to 20 carbon atoms, a deuterium-substituted alkenyl group of 2 to 20 carbon atoms, a deuterium-substituted aryl group of 6 to 30 carbon atoms for forming a ring, or a deuterium-substituted heteroaryl group of 2 to 30 carbon atoms for forming a ring.

13. The organic electroluminescence device of claim 1, wherein the fused polycyclic compound represented by Formula 1 is at least one selected from compounds represented in Compound Group A to Compound Group G:

[Compoun Group A]

A-1

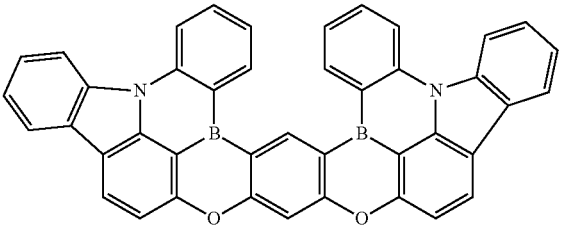

A-2

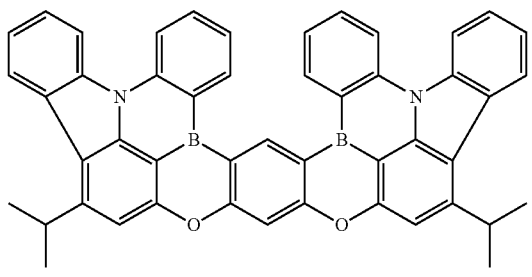

A-3

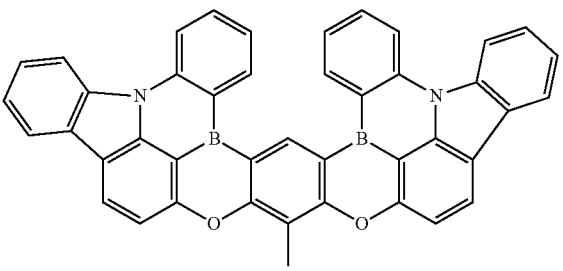

A-4

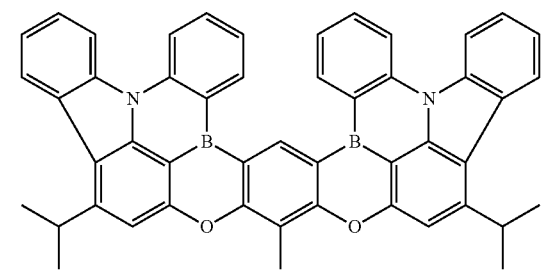

A-5

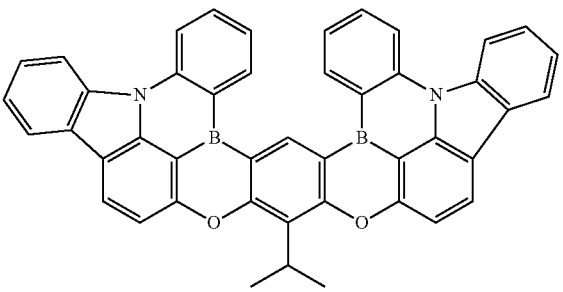

A-6
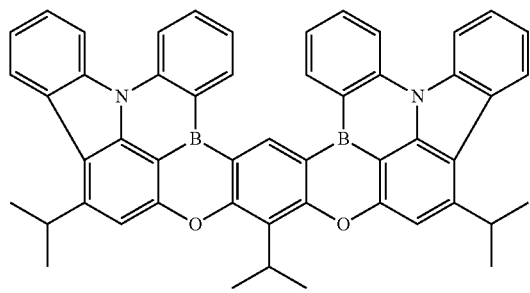
A-7
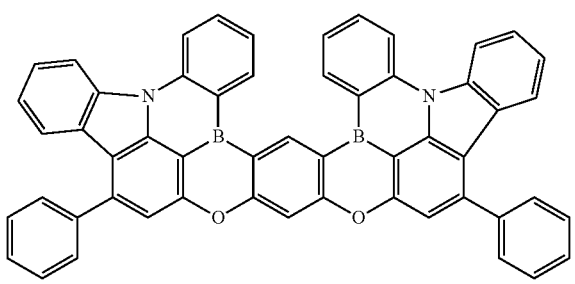
A-8
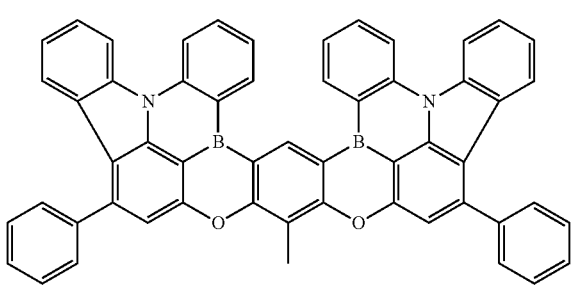
A-9
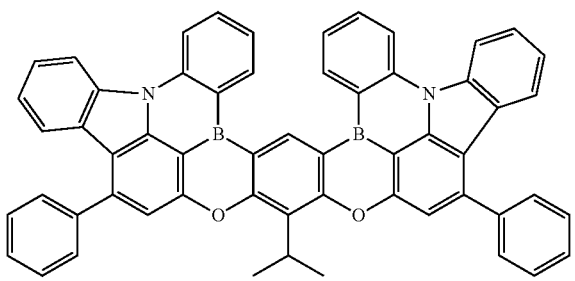
A-10
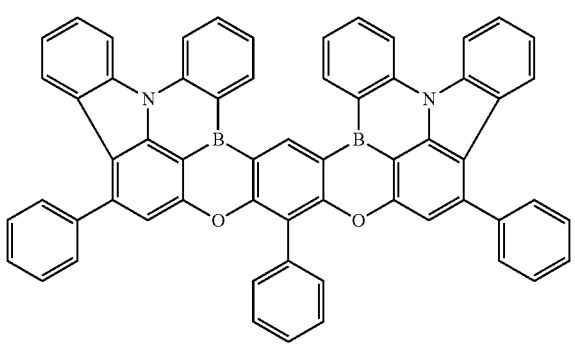
A-12
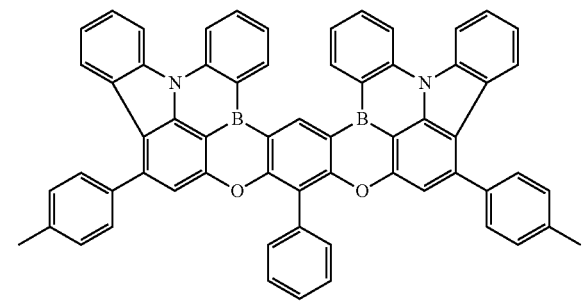
A-13
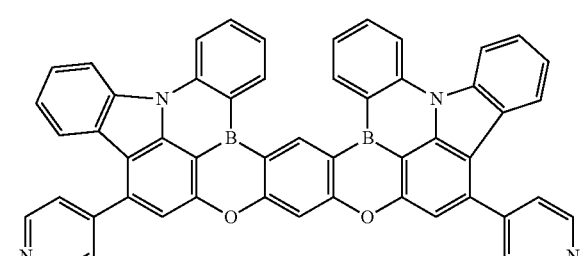
A-14
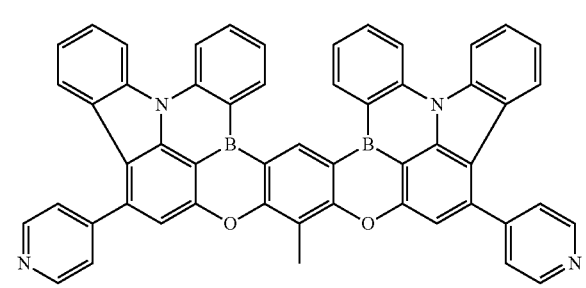
A-15
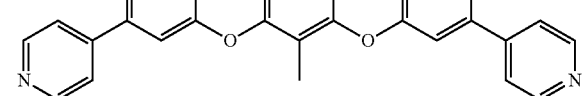
A-16
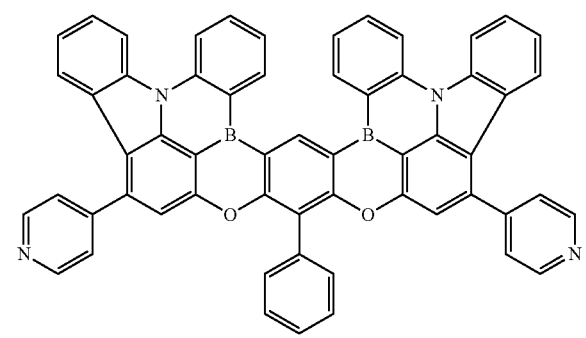

-continued
A-18
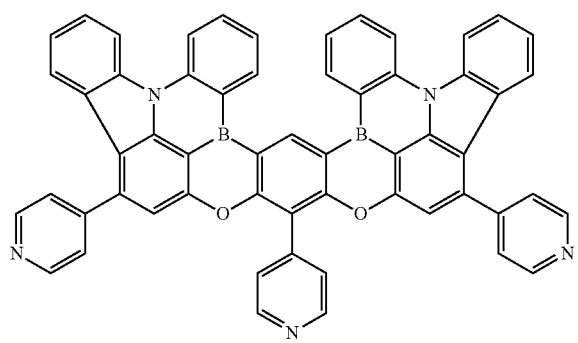
A-19
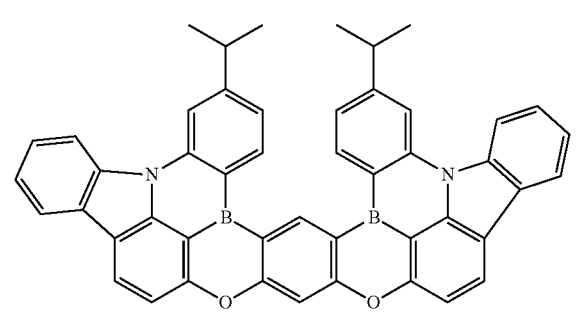
A-20
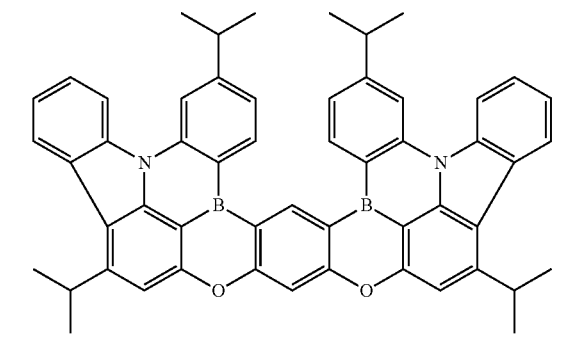
A-21
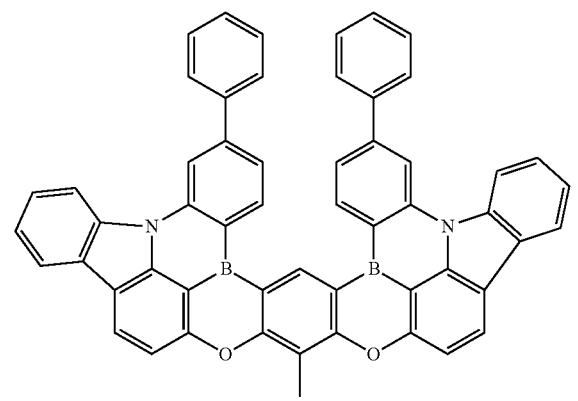
-continued
A-22
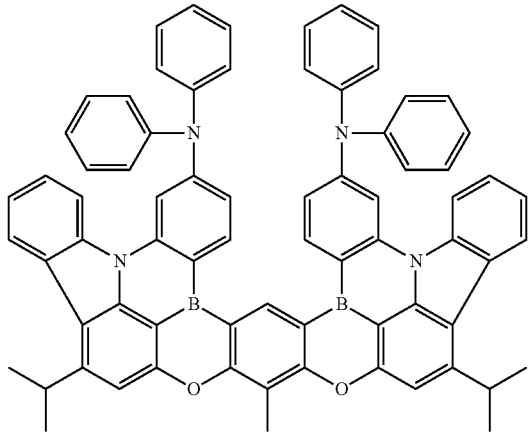
A-23
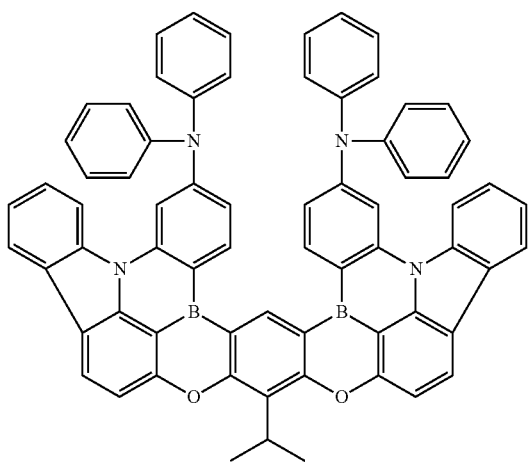
A-24
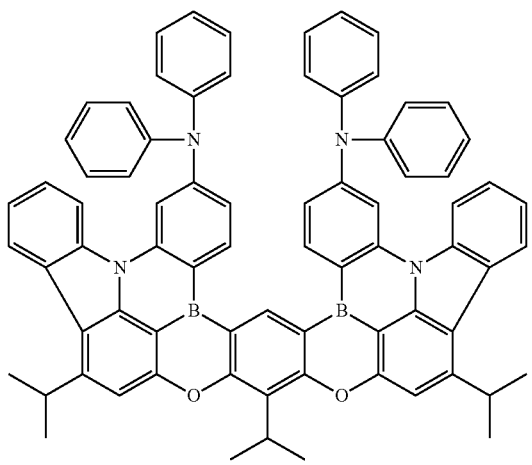

A-25
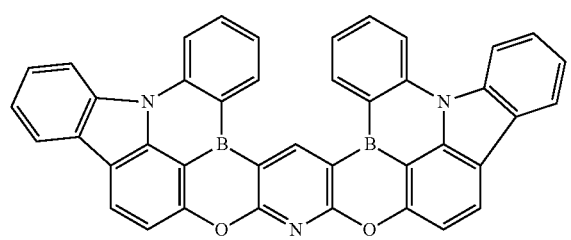
A-26
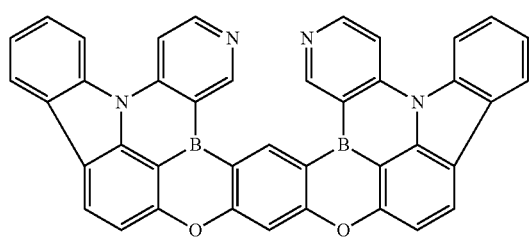
A-27
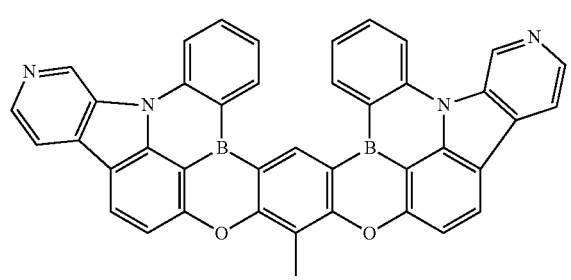
A-28
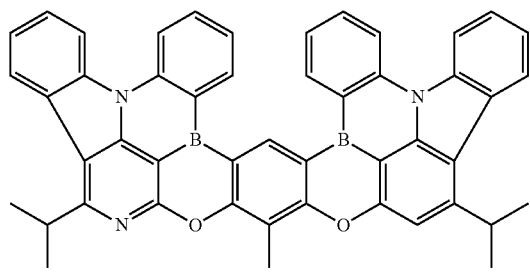
A-29
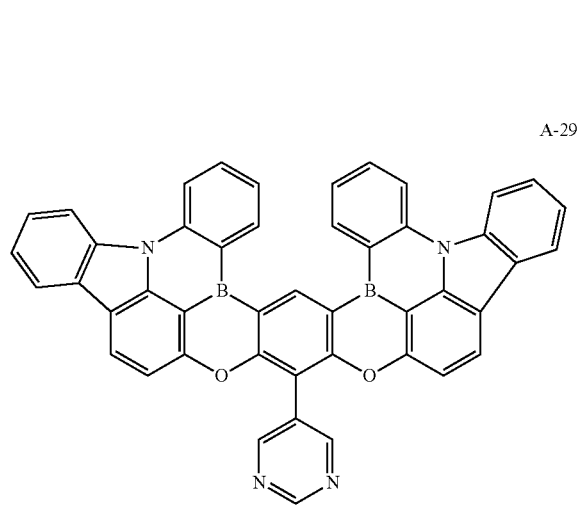
A-30
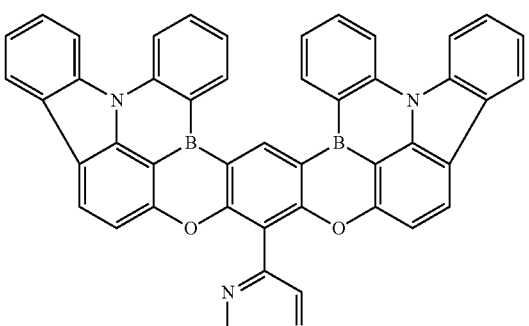
A-31
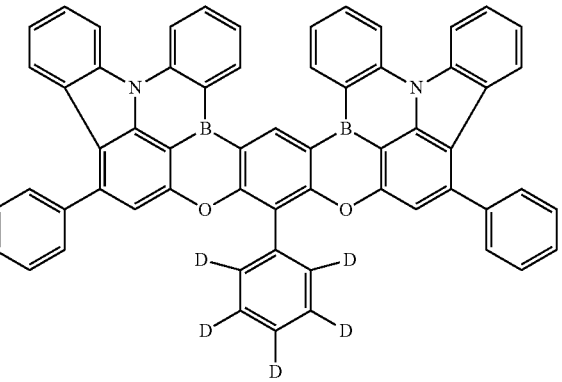
[Compound Group B]
B-1
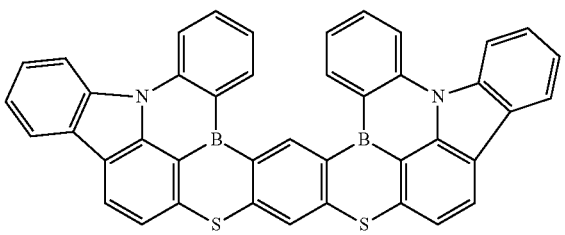
B-2
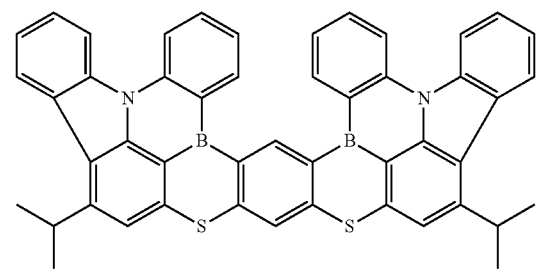

B-3
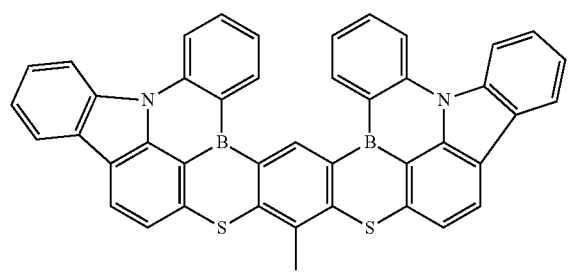
B-4
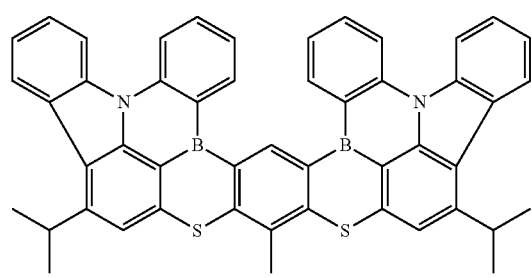
B-5
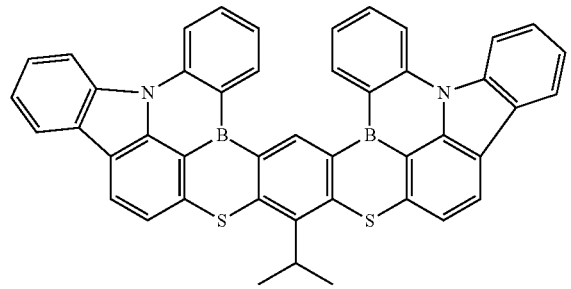
B-6
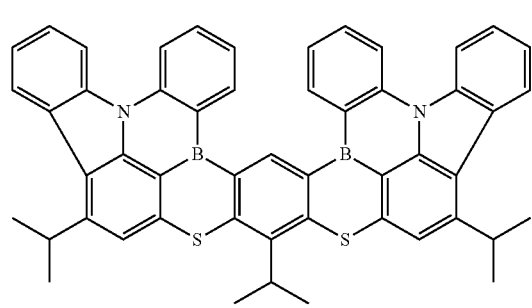
B-7
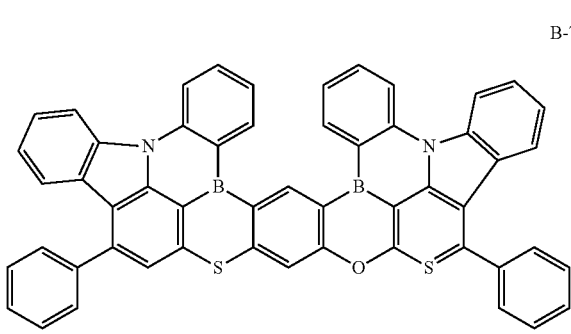
B-8
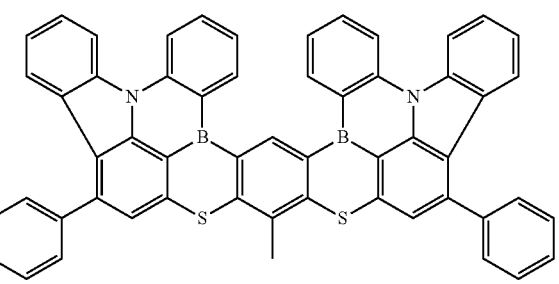
B-9
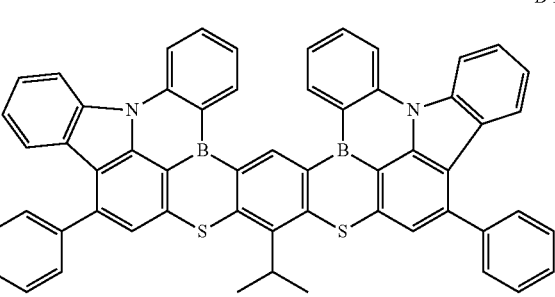
B-10
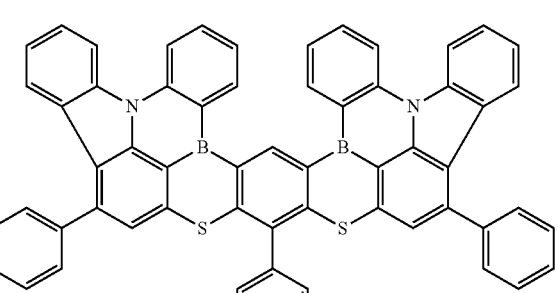
B-12
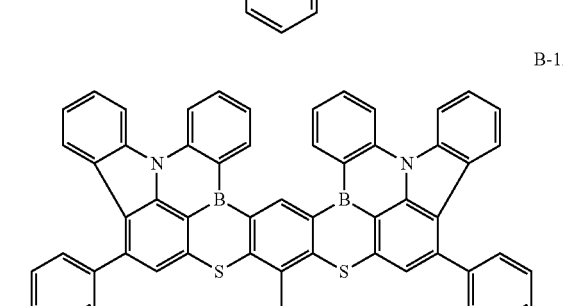
B-13
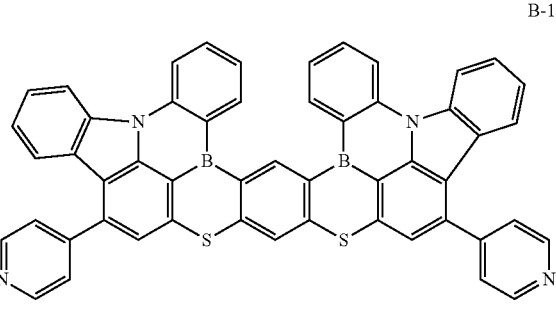

B-14
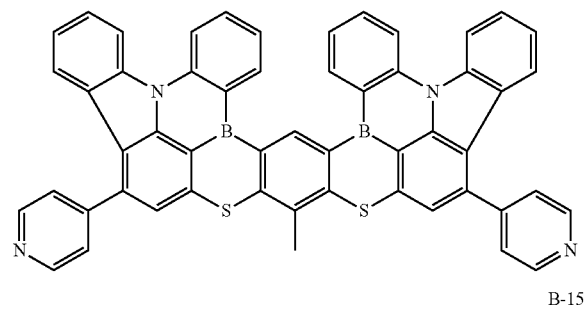
B-15
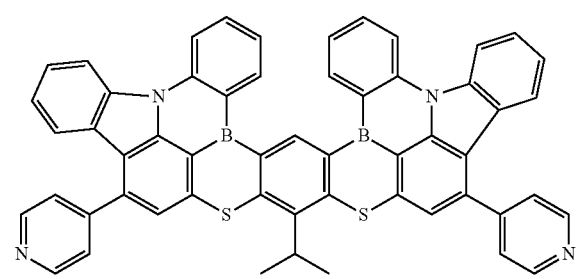
B-16
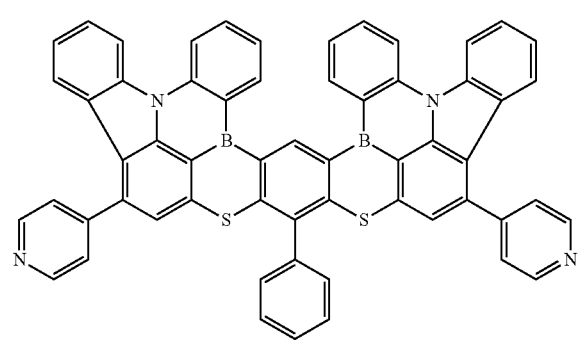
B-18
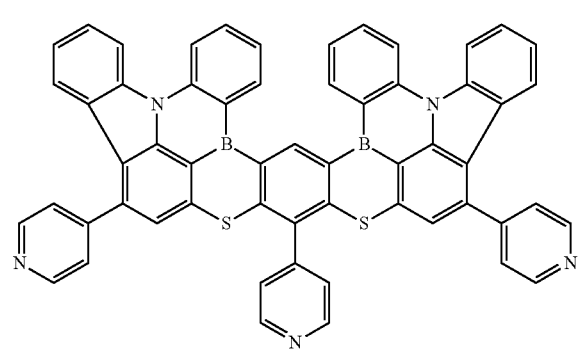
B-19
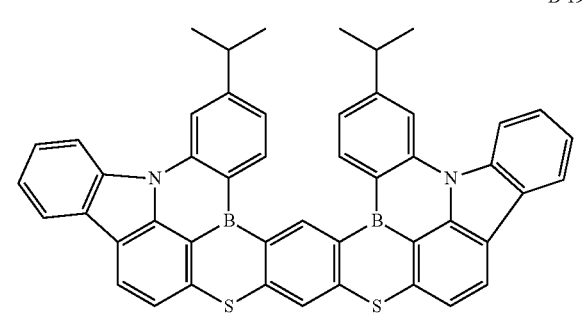
B-20
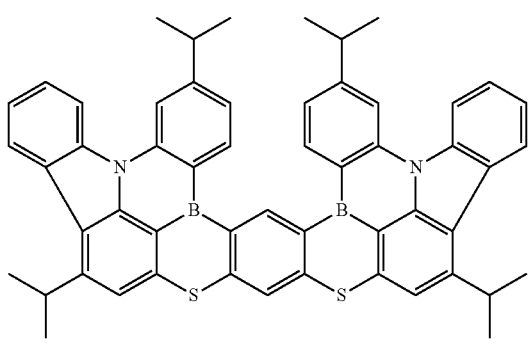
B-21
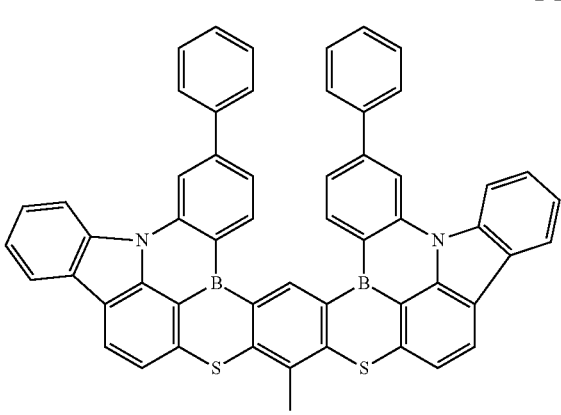
B-22
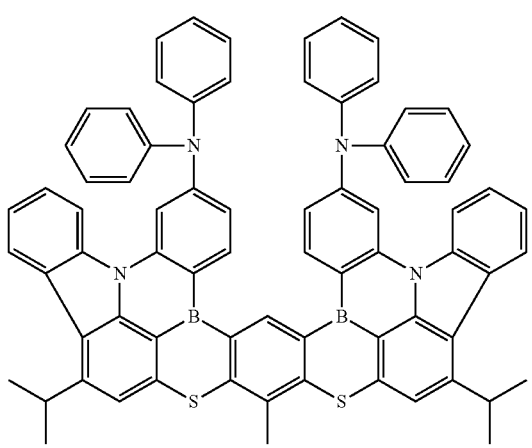

B-23
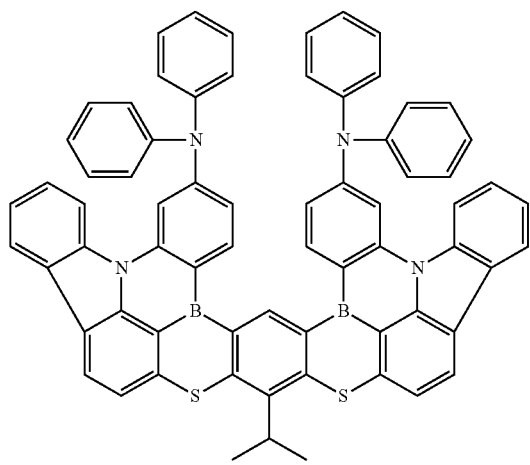
C-2
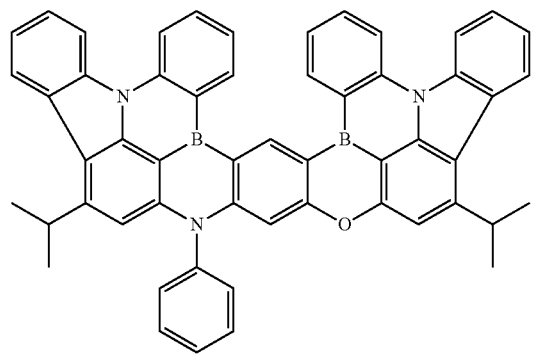
C-3
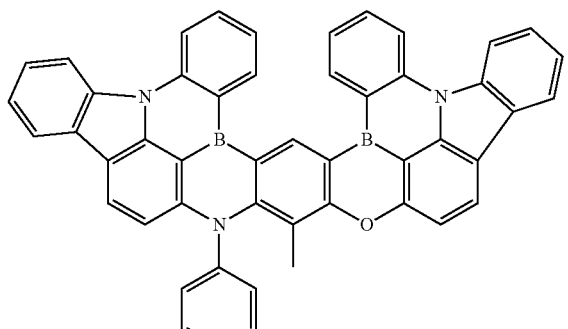
B-24
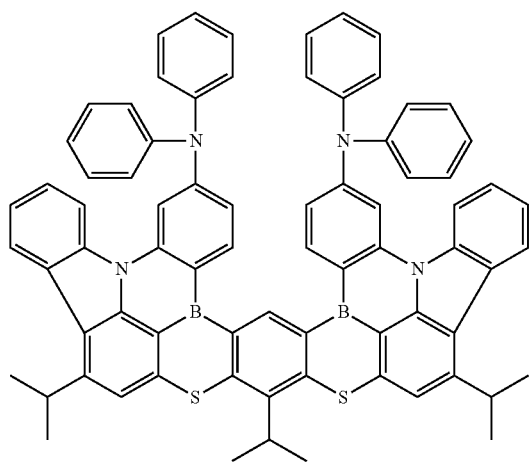
C-4
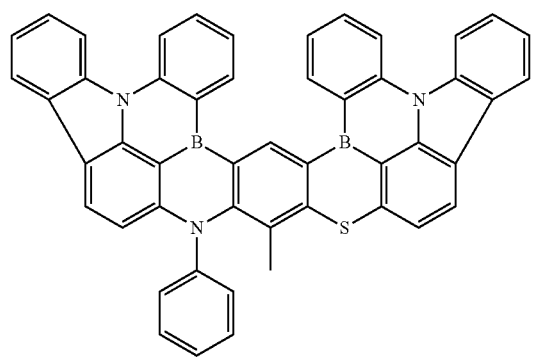
[Compound Group C]
C-1
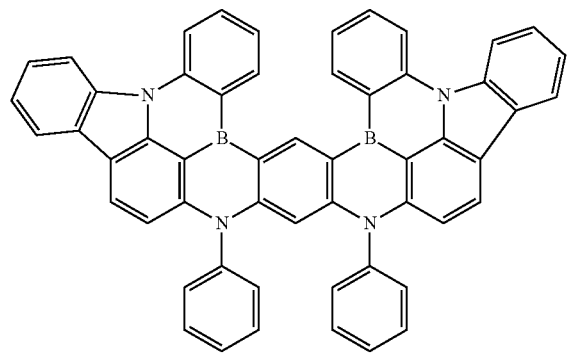
C-5
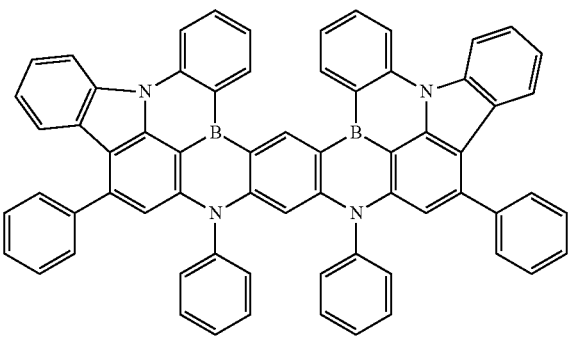

-continued
C-6
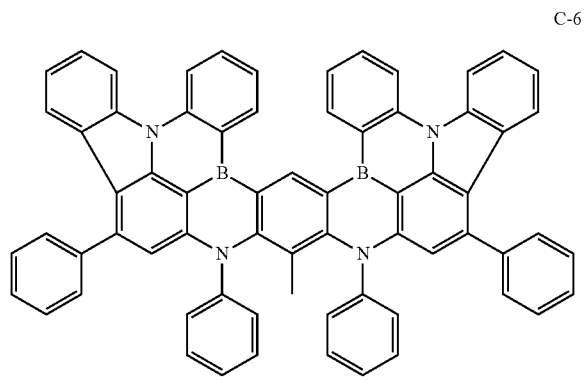
C-7
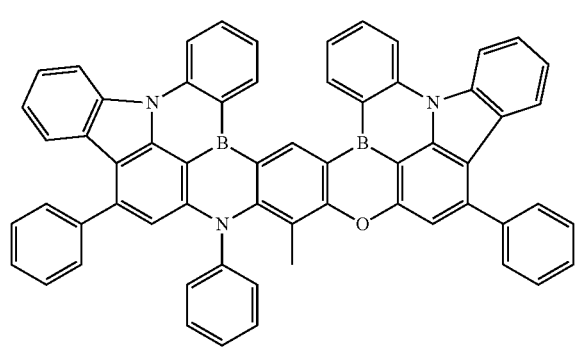
C-8
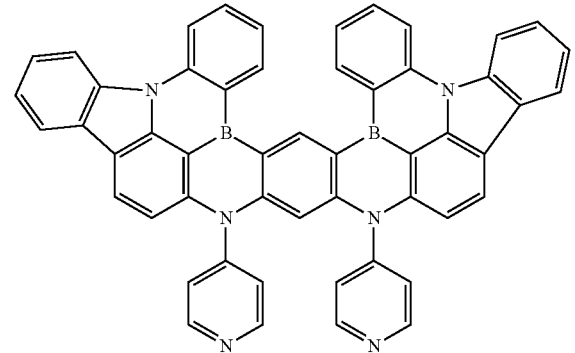
C-9
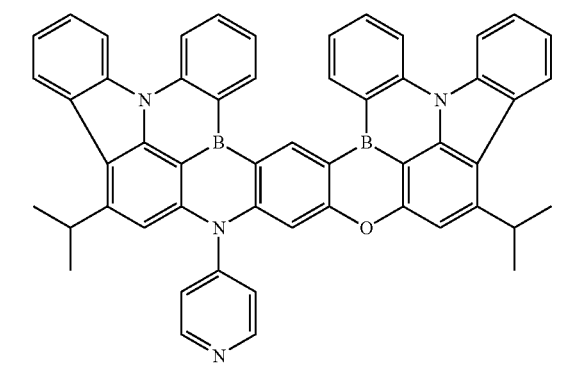
C-10
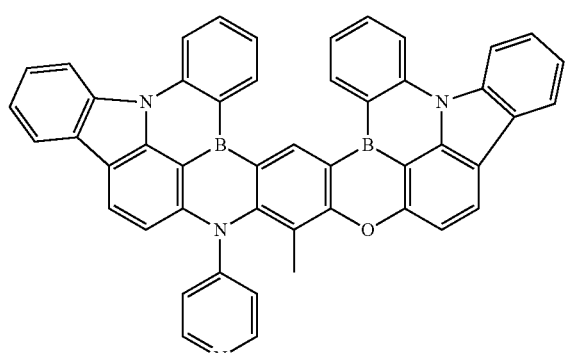
C-11
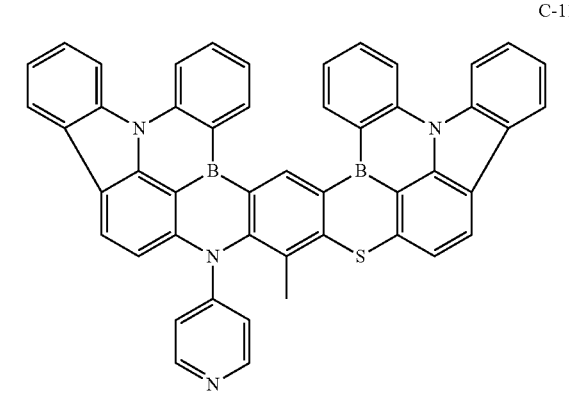
C-12
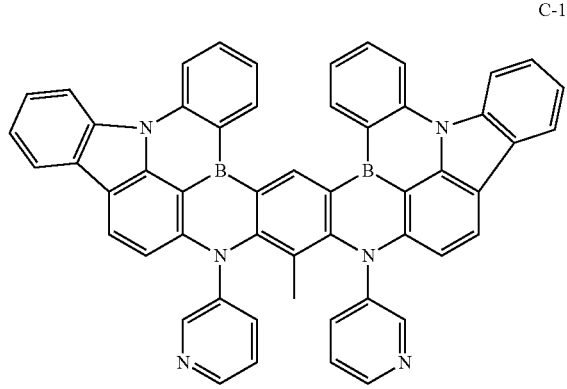
C-13
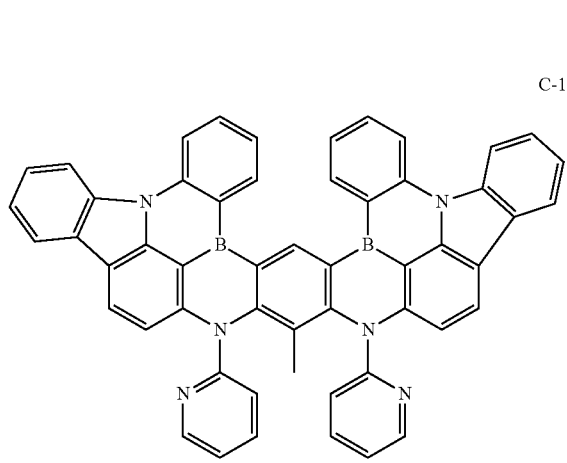

C-14
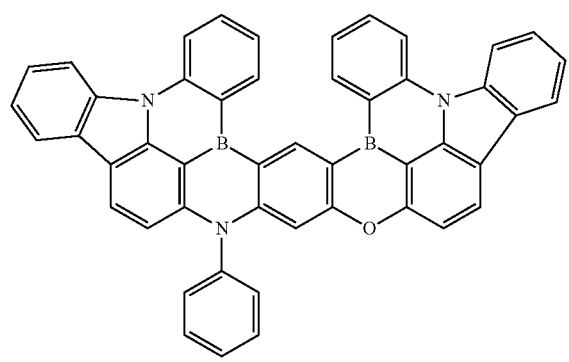
C-15
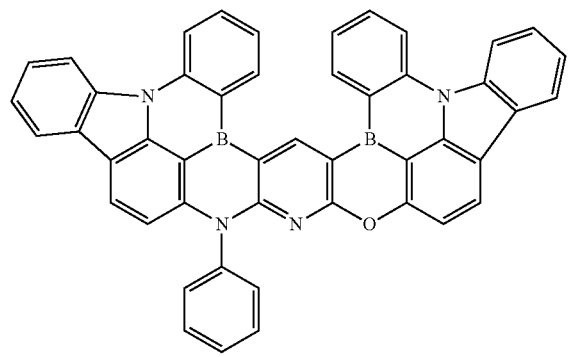
C-16
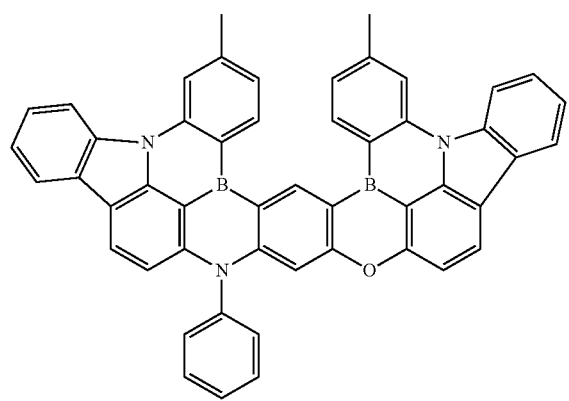
C-17
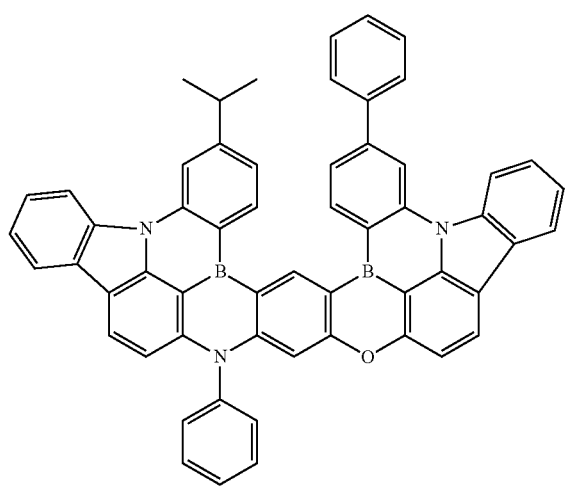
[Compound Group D]
D-1
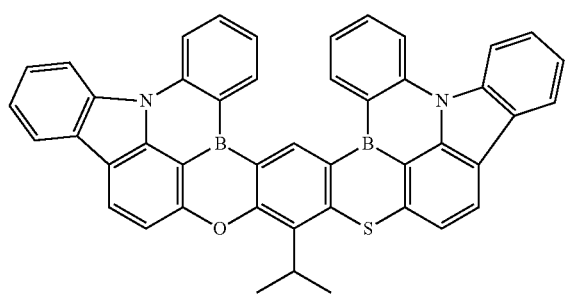
D-2
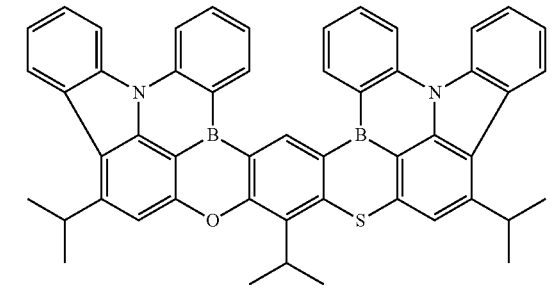
D-3
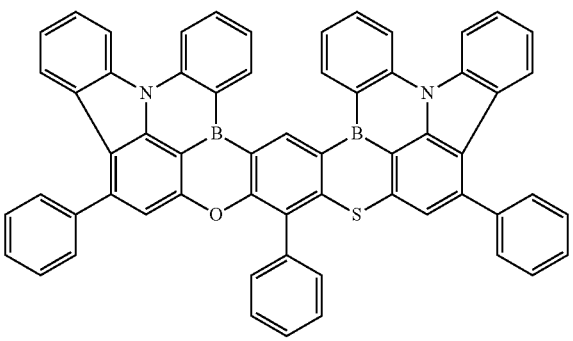

D-4
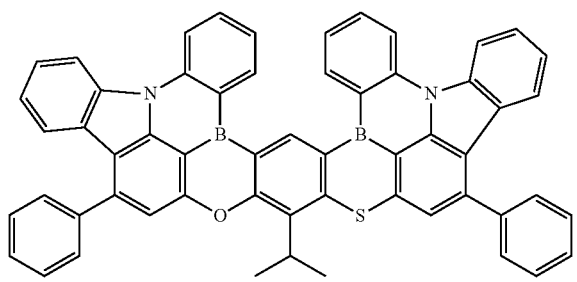
D-5
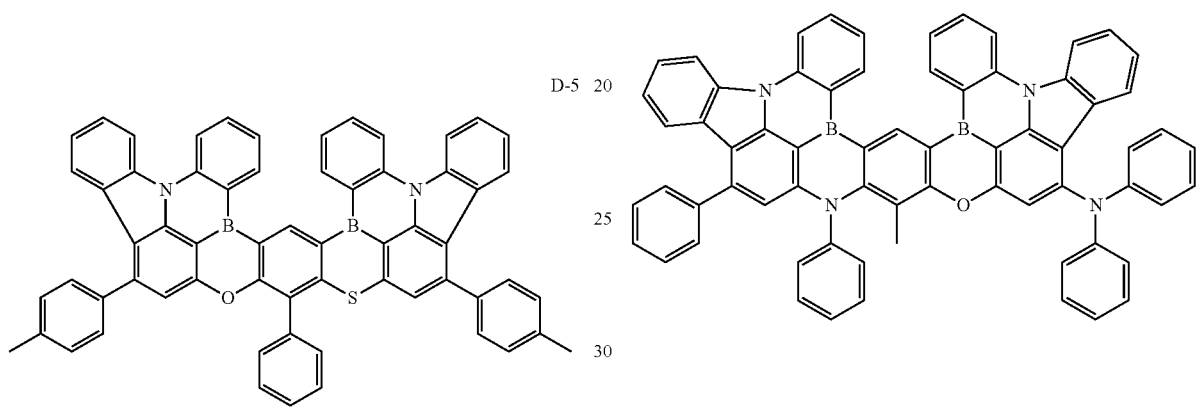
[Compound Group E]
E-1
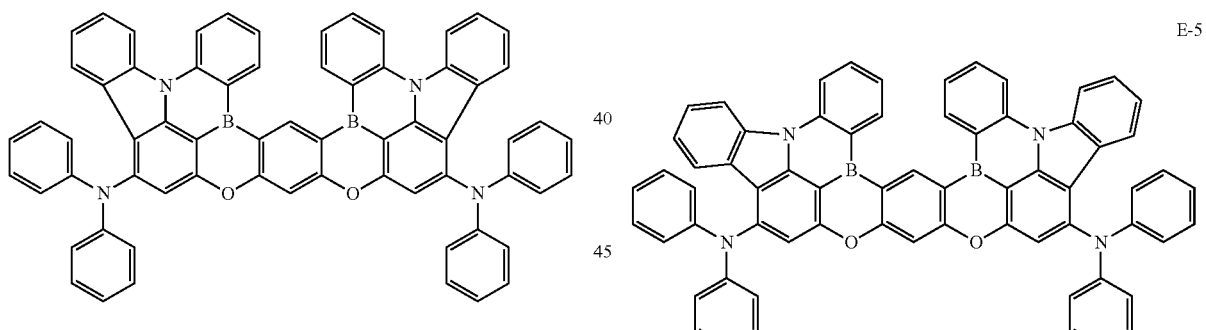
E-2
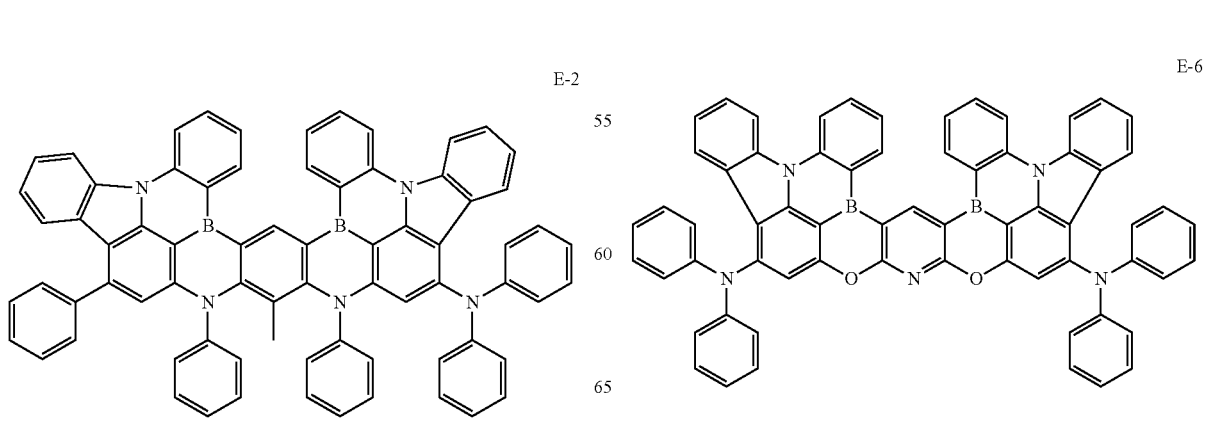
E-3
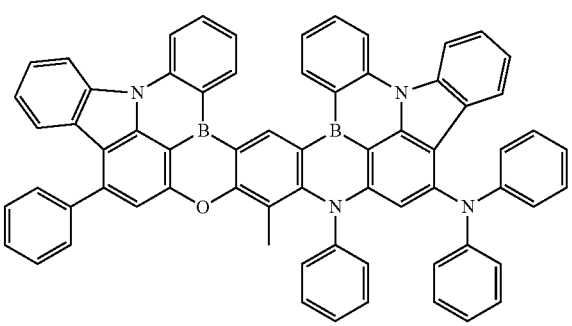
E-4
E-5
E-6

-continued
E-7
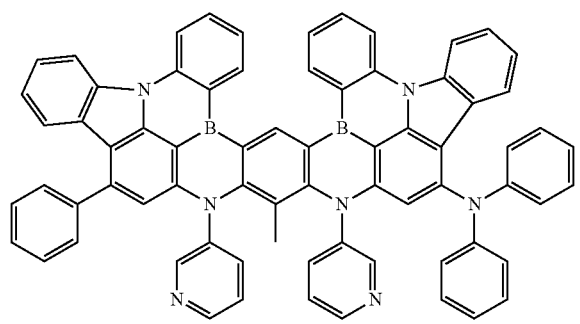
E-8
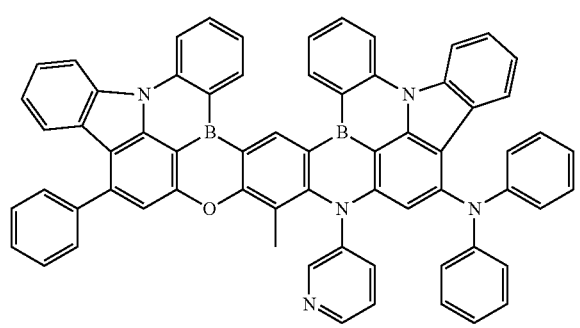
E-9
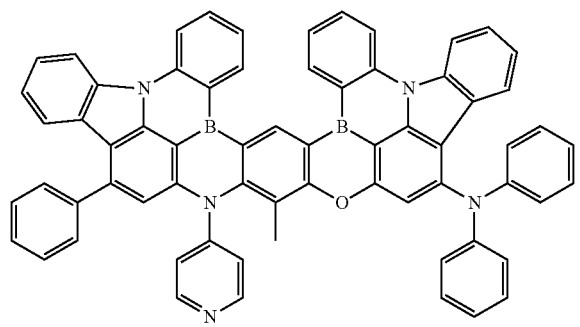
E-10
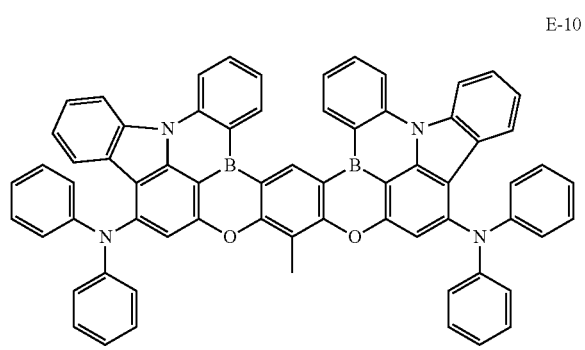
-continued
E-11
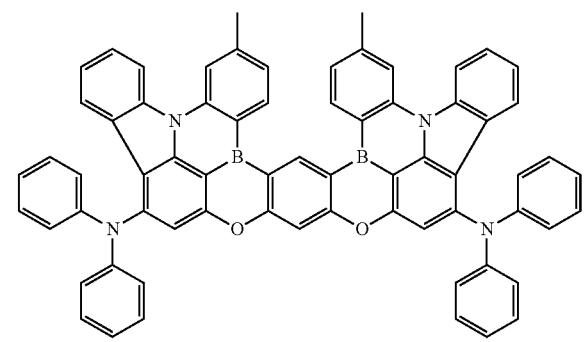
E-12
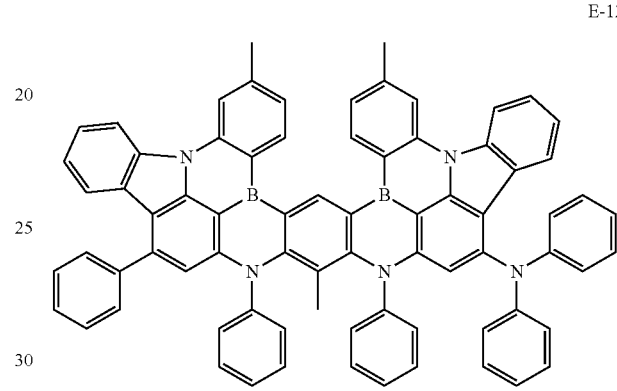
E-13
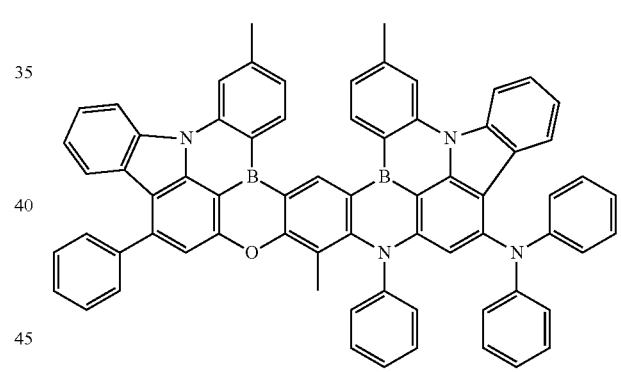
E-14
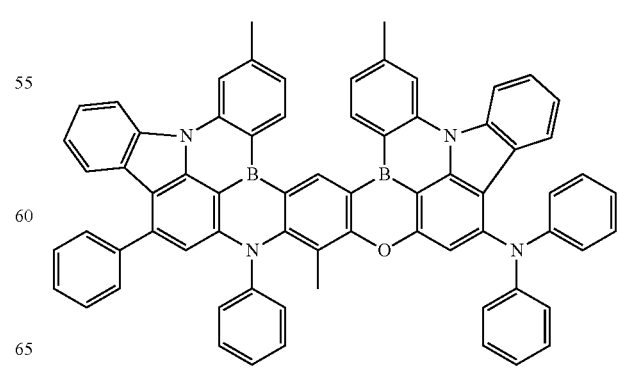

E-16
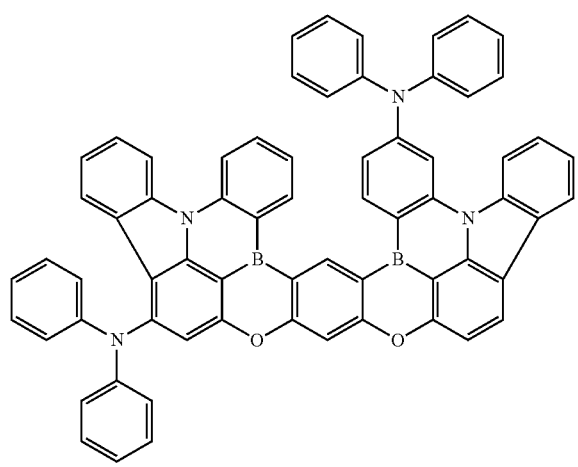
E-17
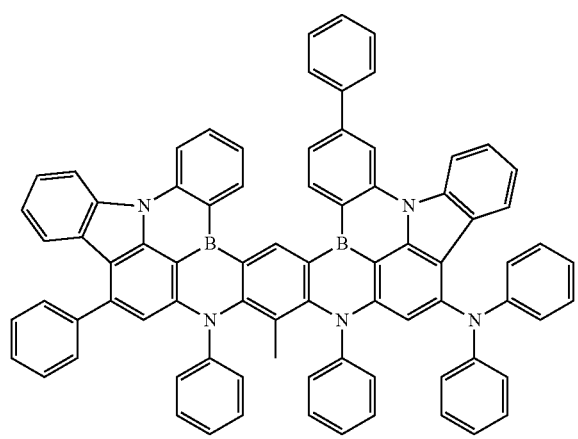
E-18
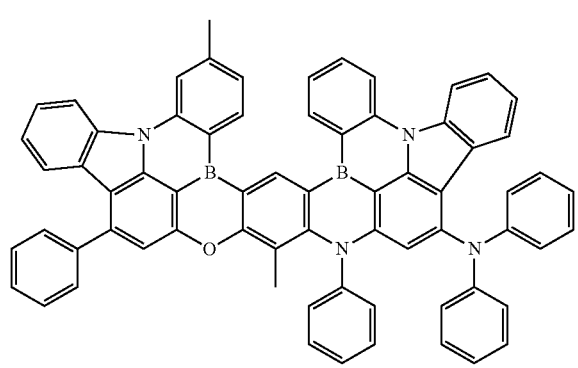
E-19
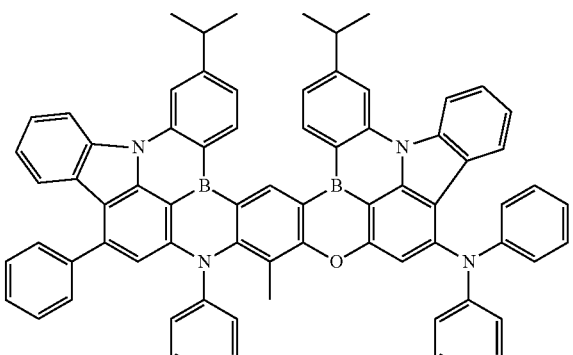
E-20
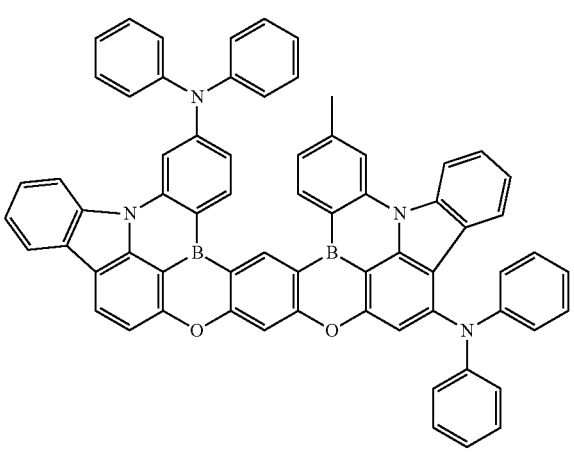
[Compound Group F]
F-1
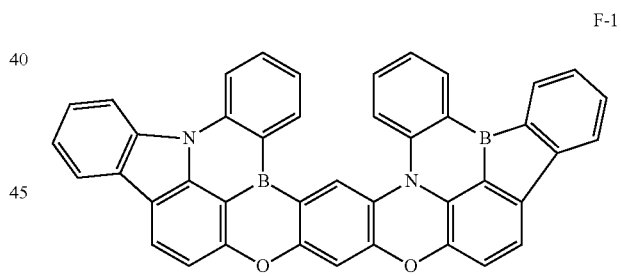
F-2
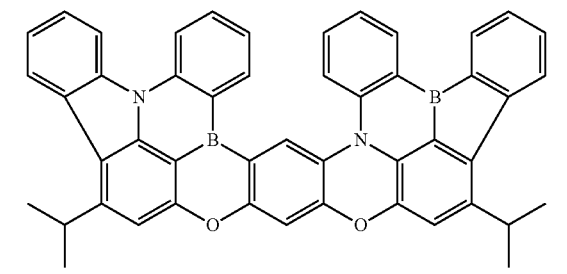

F-3
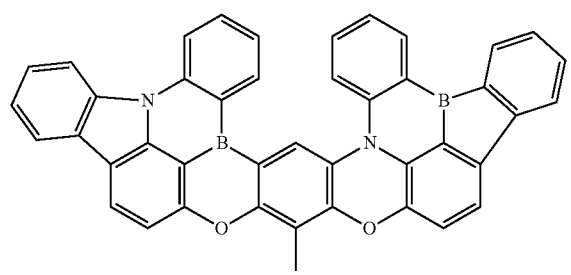
F-4
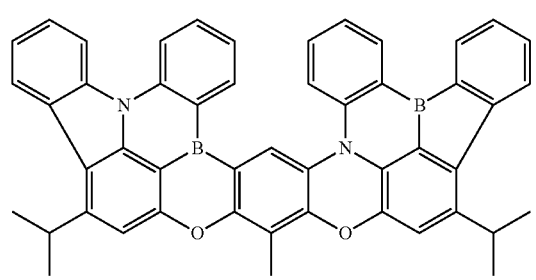
F-5
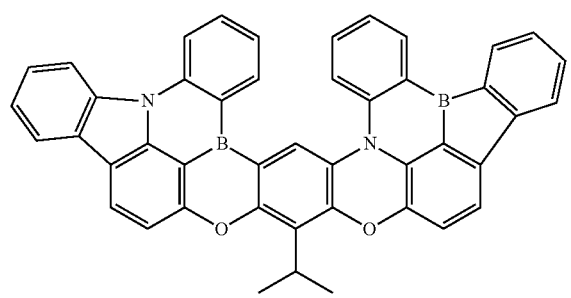
F-6
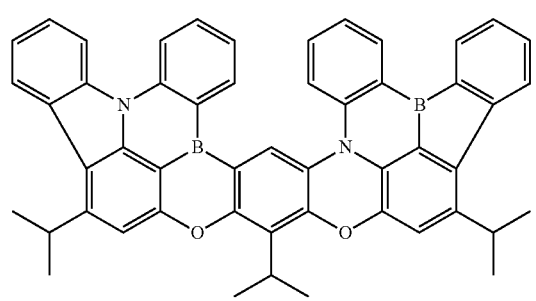
F-7
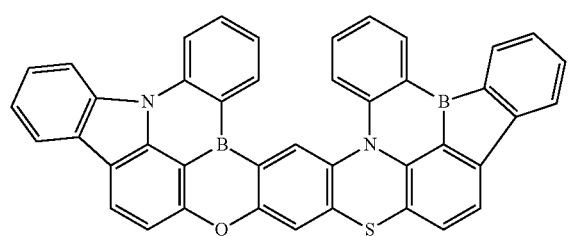
F-9
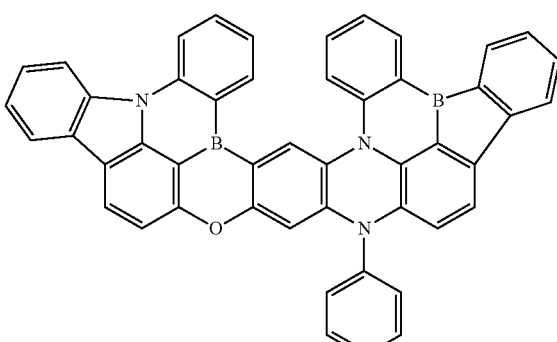
F-10
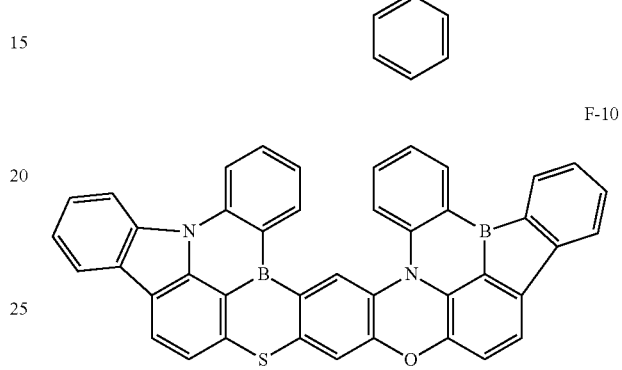
F-12
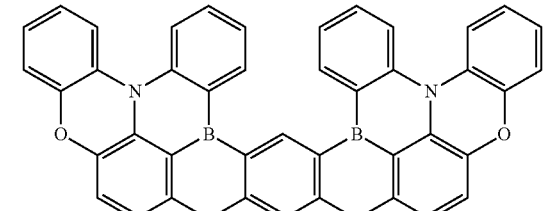
[Compound Group G]
G-1
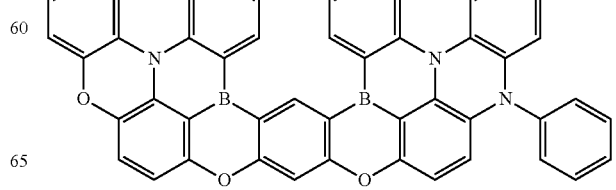
G-2

G-3
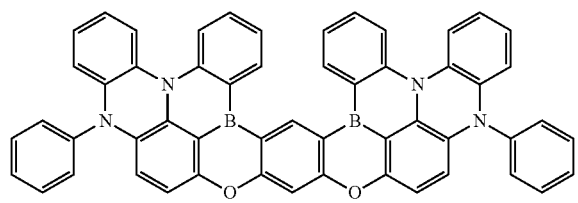
G-4
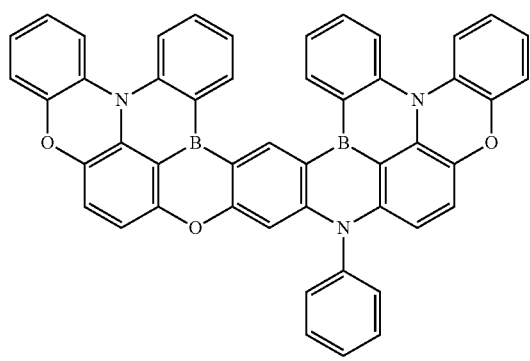
G-5
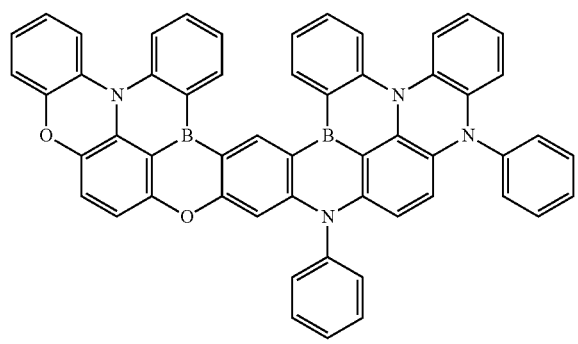
G-6
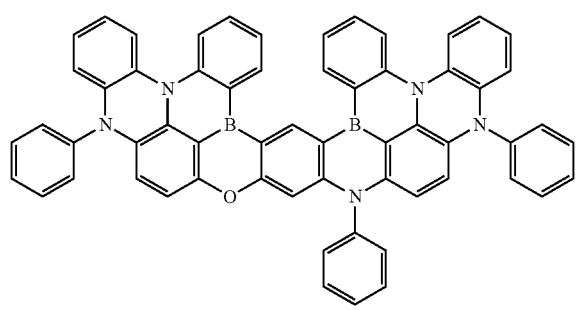
G-7
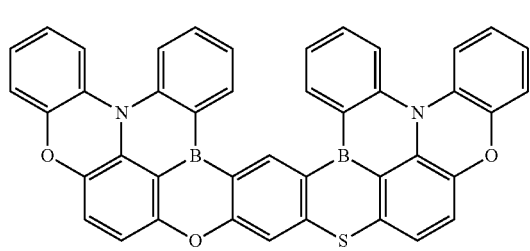
G-8
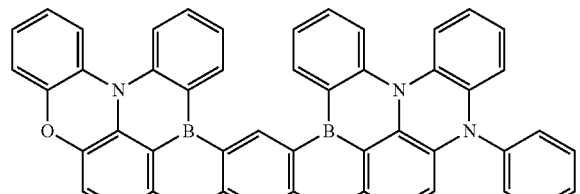
G-9
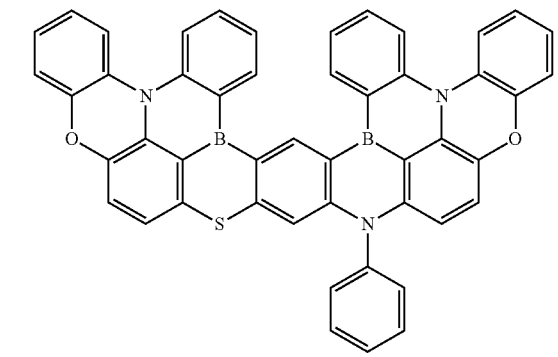
G-10
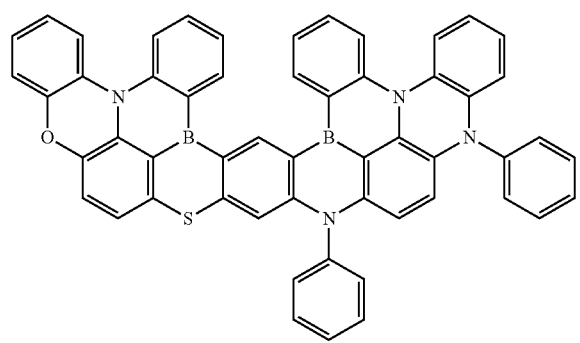
G-11
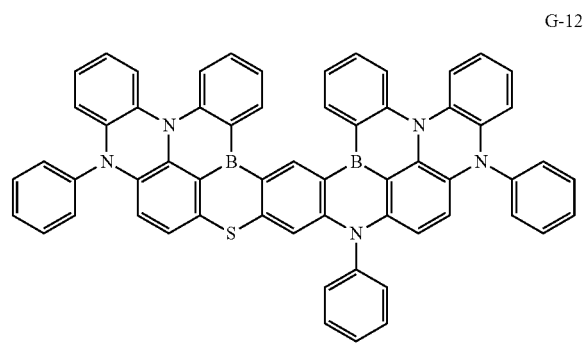
G-12

G-13
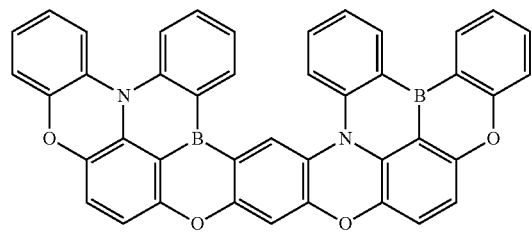
G-14
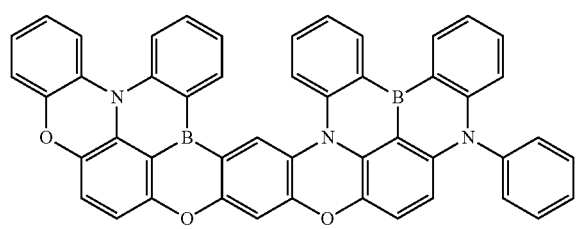
G-15
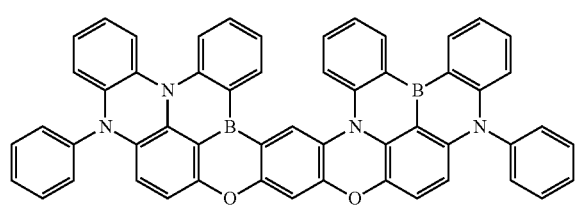
G-16
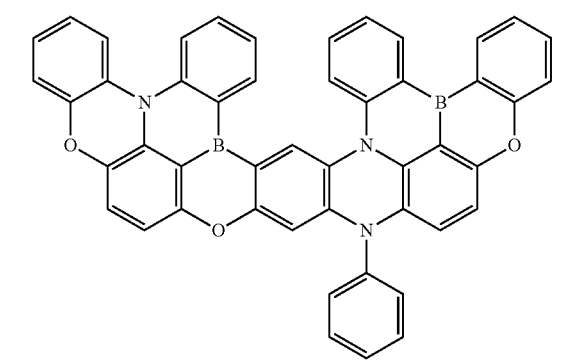
G-17
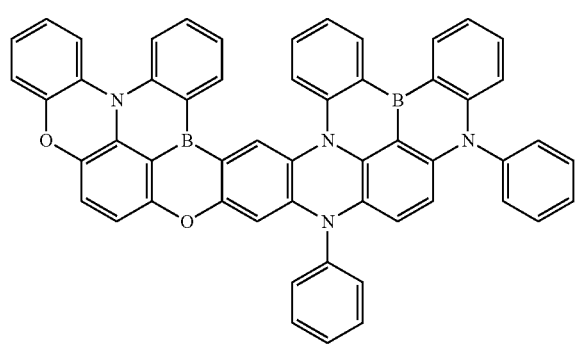
G-18
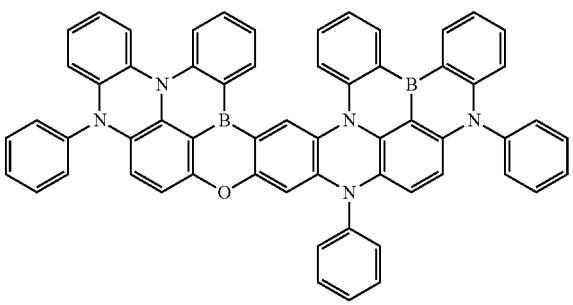
G-19
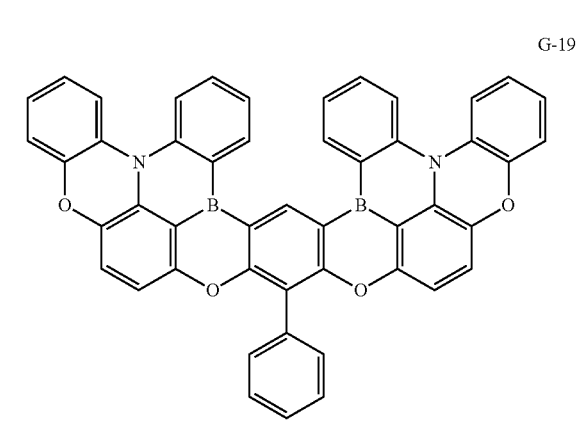
G-20
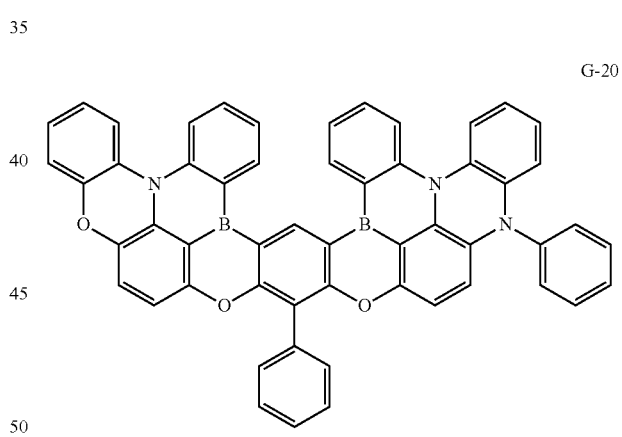
G-21
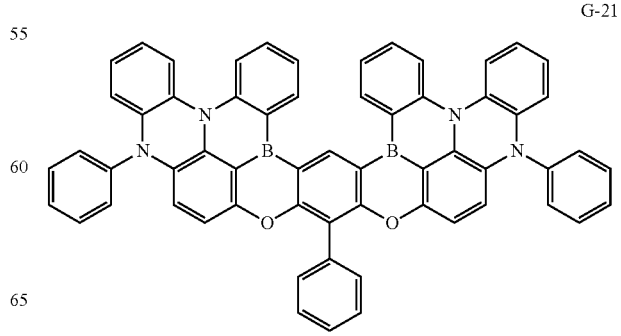

-continued

G-22

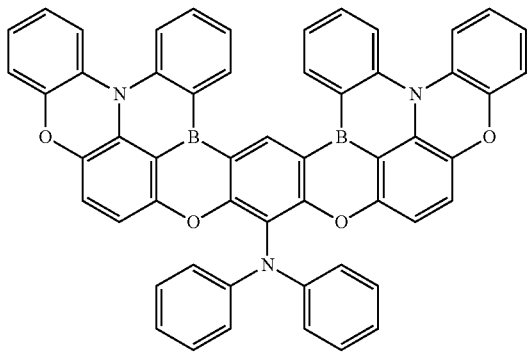

G-23

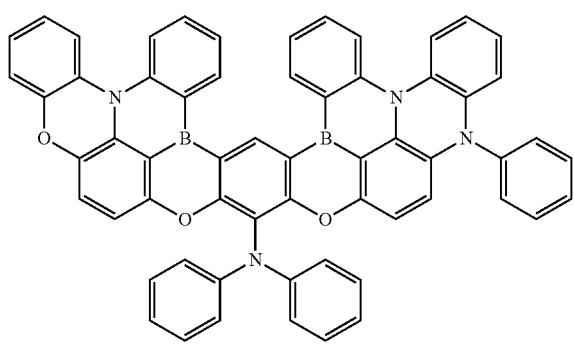

G-24

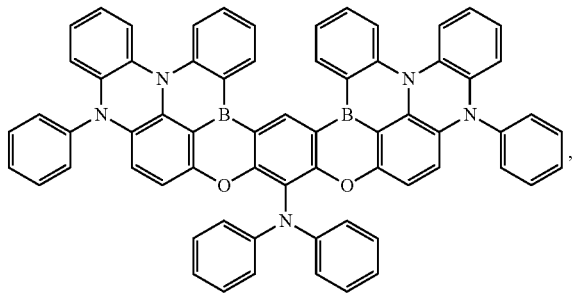

wherein in Compound A-31, D represents deuterium.

14. A fused polycyclic compound represented by Formula 1:

[Formula 1]

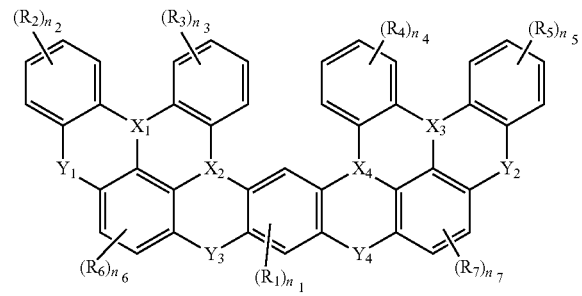

wherein, in Formula 1,
Cy$_1$ to Cy$_7$ are each independently a substituted or unsubstituted aromatic hydrocarbon ring, or a substituted or unsubstituted aromatic heterocycle, and/or are optionally combined with an adjacent group to form a ring;
X$_1$ to X$_4$ are each independently B or N;
at least one of X$_1$ or X$_2$ is B;
at least one of X$_3$ or X$_4$ is B;

Y$_1$ and Y$_2$ are each independently a direct linkage, O, S, or NAr$_1$;
Y$_3$ and Y$_4$ are each independently O, S, or NAr$_2$; and
Ar$_1$ and Ar$_2$ are each independently a substituted or unsubstituted aryl group of 6 to 60 carbon atoms for forming a ring, or a substituted or unsubstituted heteroaryl group of 2 to 60 carbon atoms for forming a ring.

15. The fused polycyclic compound of claim 14, wherein the fused polycyclic compound represented by Formula 1 is represented by at least one of Formula 2-1 to Formula 2-5:

[Formula 2-1]

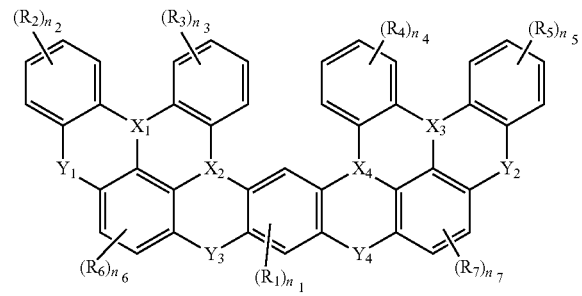

[Formula 2-2]

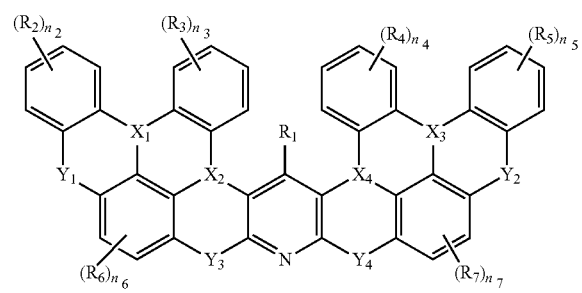

[Formula 2-3]

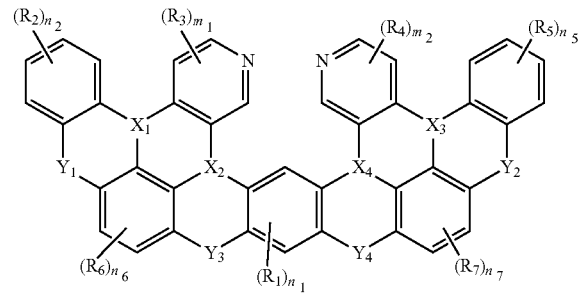

[Formula 2-4]

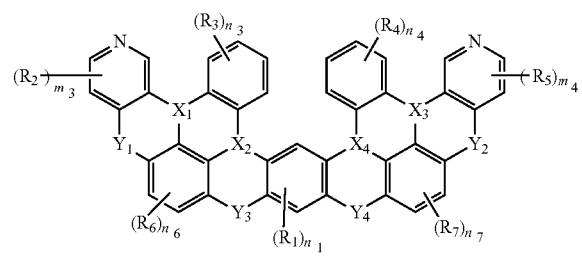

[Formula 2-5]

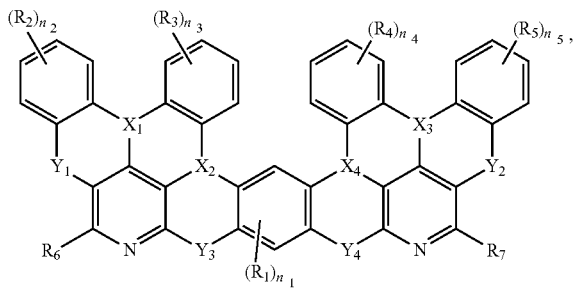

wherein, in Formulae 2-1 to Formula 2-5, $R_1$ to $R_7$ are each independently a hydrogen atom, a deuterium atom, a halogen atom, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 60 carbon atoms for forming a ring, or a substituted or unsubstituted heteroaryl group of 2 to 60 carbon atoms for forming a ring, and/or are optionally combined with an adjacent group to form a ring;

$n_1$ is an integer of 0 to 2;

$n_2$ to $n_5$ are each independently an integer of 0 to 4;

$n_6$ and $n_7$ are each independently an integer of 0 to 2;

$m_1$ to $m_4$ are each independently an integer of 0 to 3; and $X_1$ to $X_4$ and $Y_1$ to $Y_4$ are each independently the same as defined in Formula 1.

16. The fused polycyclic compound of claim 15, wherein the fused polycyclic compound represented by Formula 1 is represented by Formula 3-1 or Formula 3-2:

[Formula 3-1]

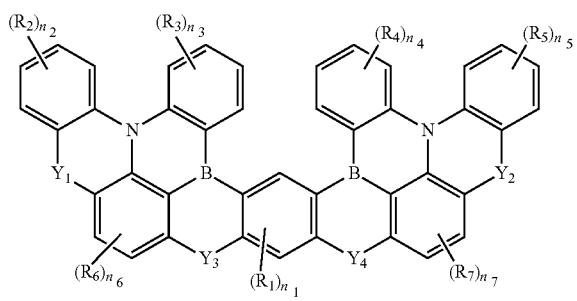

[Formula 3-2]

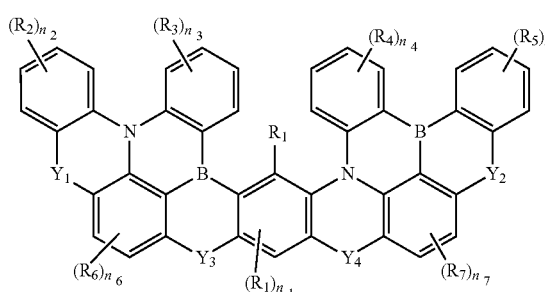

wherein, in Formula 3-1 and Formula 3-2, $Y_1$ to $Y_4$, $R_1$ to $R_7$, and $n_1$ to $n_7$ are each independently the same as defined in Formula 1 and Formula 2-1 to Formula 2-5.

17. The fused polycyclic compound of claim 15, wherein the fused polycyclic compound represented by Formula 1 is represented by Formula 4:

[Formula 4]

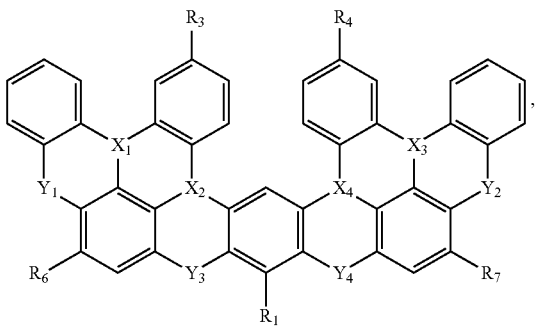

wherein, in Formula 4, $X_1$ to $X_4$, $Y_1$ to $Y_4$, $R_1$, $R_3$, $R_4$, $R_6$, and $R_7$ are each independently the same as defined in Formula 1 and Formula 2-1 to Formula 2-5.

18. The fused polycyclic compound of claim 15, wherein the fused polycyclic compound represented by Formula 1 is represented by at least one of Formula 5-1 to Formula 5-6:

[Formula 5-1]

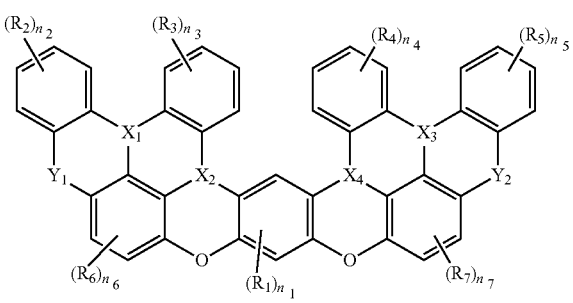

[Formula 5-2]

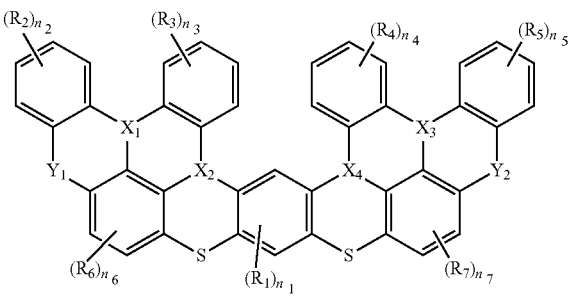

-continued

[Formula 5-3]

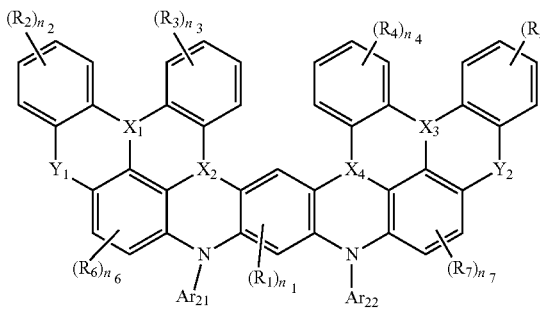

[Formula 5-4]

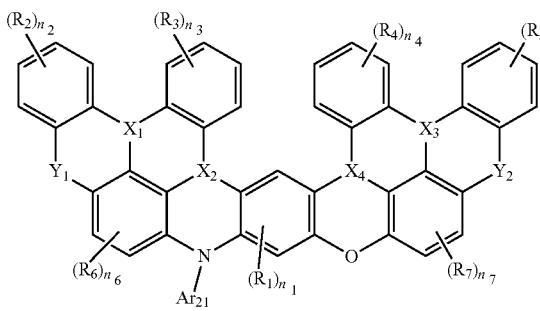

[Formula 5-5]

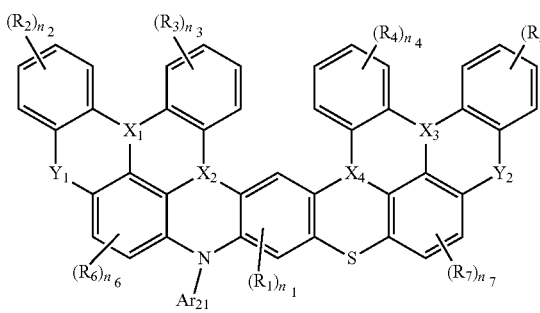

Formula 5-6]

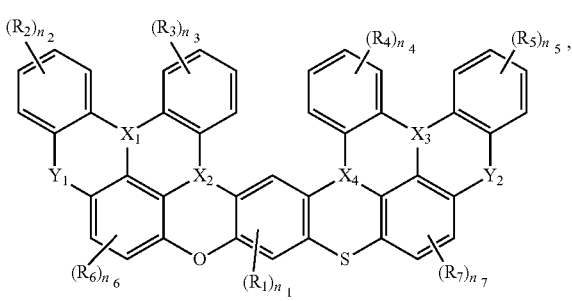

[Formula 6-1]

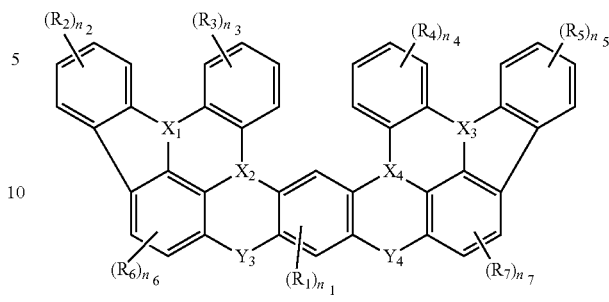

[Formula 6-2]

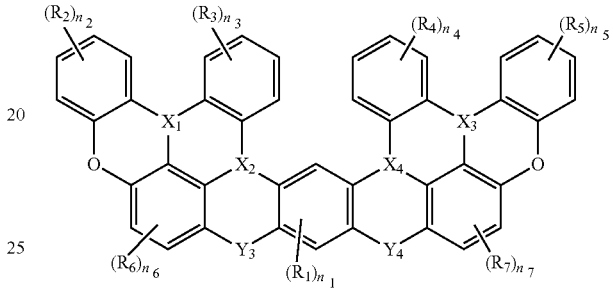

[Formula 6-3]

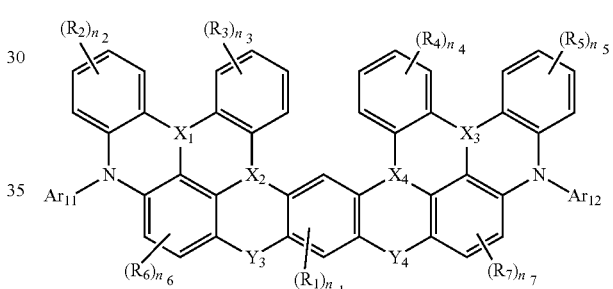

[Formula 6-4]

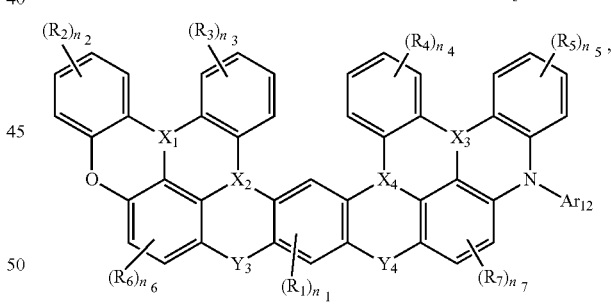

wherein, in Formula 5-1 to Formula 5-6, $Ar_{21}$ and $Ar_{22}$ are each independently a substituted or unsubstituted aryl group of 6 to 60 carbon atoms for forming a ring, or a substituted or unsubstituted heteroaryl group of 2 to 60 carbon atoms for forming a ring, and $X_1$ to $X_4$, $Y_1$ and $Y_2$, $R_1$ to $R_7$, and $n_1$ to $n_7$ are each independently the same as defined in Formula 1 and Formula 2-1 to Formula 2-5.

19. The fused polycyclic compound of claim 15, wherein the fused polycyclic compound represented by Formula 1 is represented by at least one of Formula 6-1 to Formula 6-4:

wherein, in Formula 6-1 to Formula 6-4, $Ar_{11}$ and $Ar_{12}$ are each independently a substituted or unsubstituted aryl group of 6 to 60 carbon atoms for forming a ring, or a substituted or unsubstituted heteroaryl group of 2 to 60 carbon atoms for forming a ring, and $X_1$ to $X_4$, $Y_3$ and $Y_4$, $R_1$ to $R_7$, and $n_1$ to $n_7$ are each independently the same as defined in Formula 1 and Formula 2-1 to Formula 2-5.

20. The fused polycyclic compound of claim 14, wherein the fused polycyclic compound represented by Formula 1 is at least one selected from compounds represented in Compound Group A to Compound Group G:

[Compoun Group A]
A-1
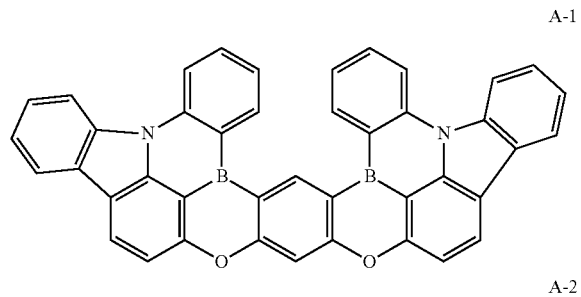
A-2
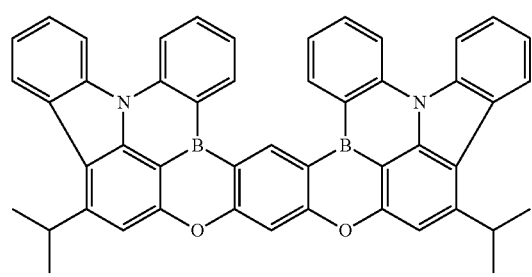
A-3
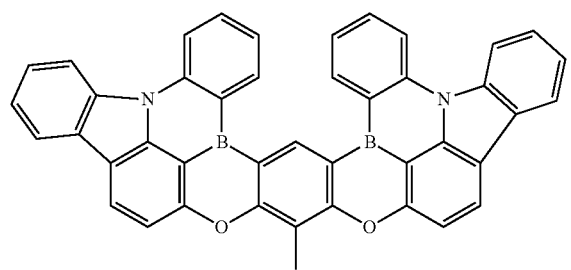
A-4
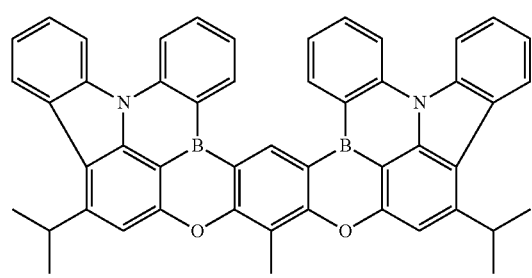
A-5
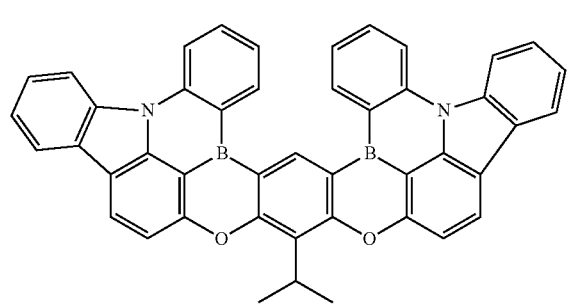
A-6
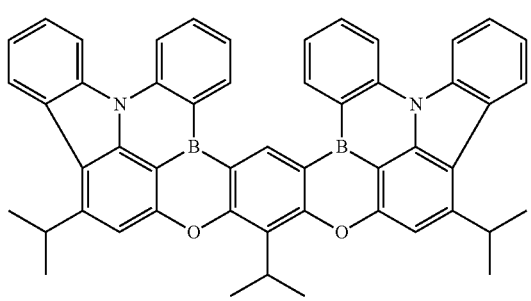
A-7
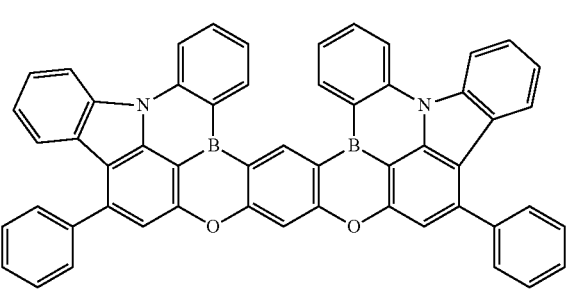
A-8
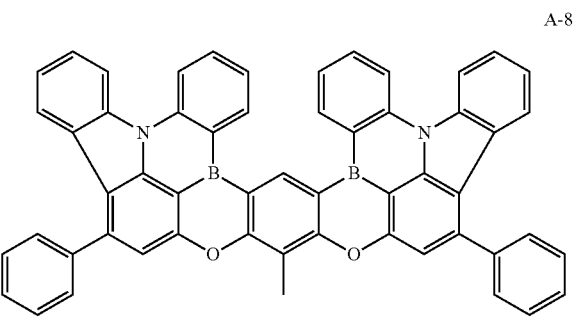
A-9
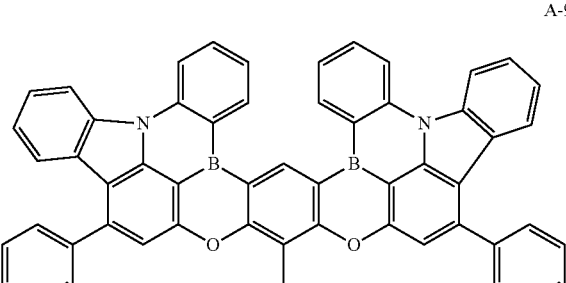
A-10
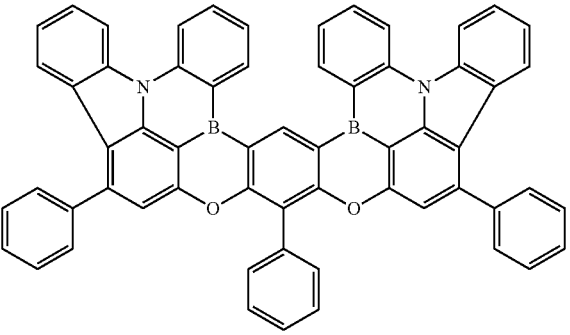

A-12
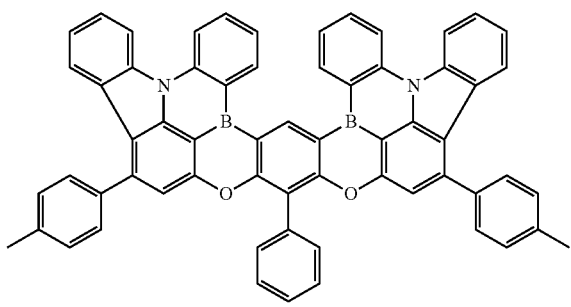
A-13
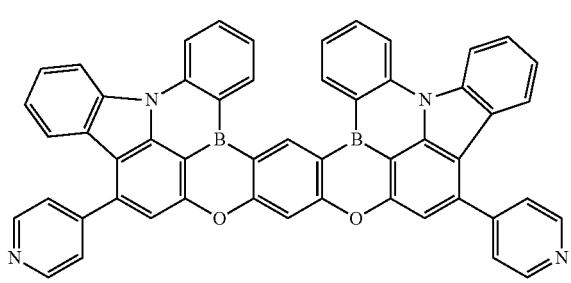
A-14
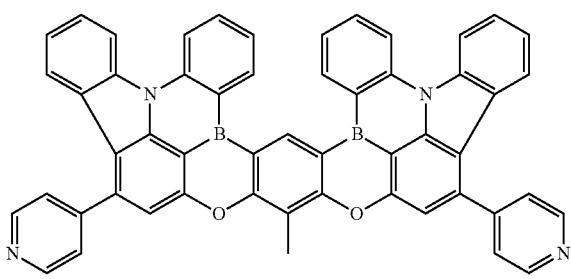
A-15
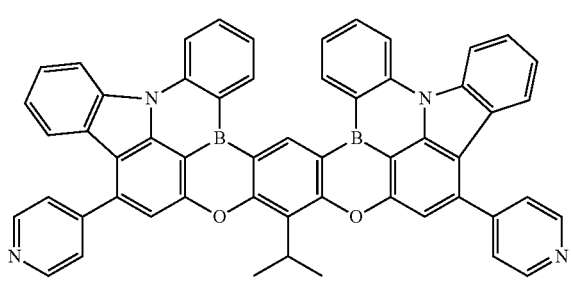
A-16
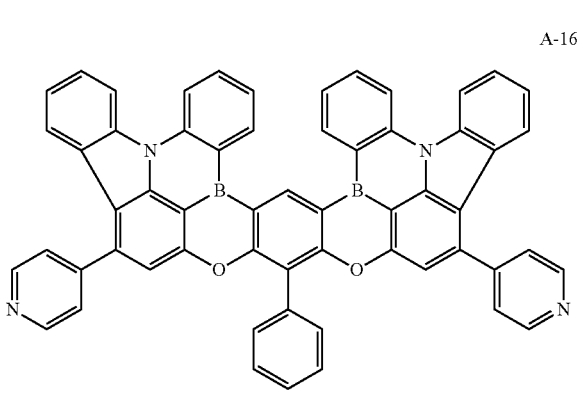
A-18
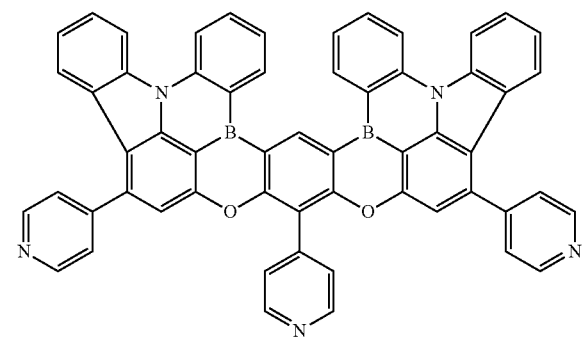
A-19
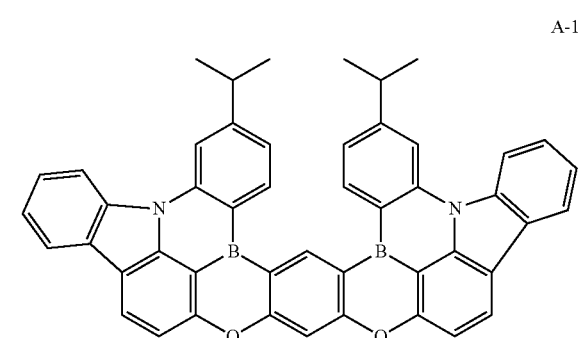
A-20
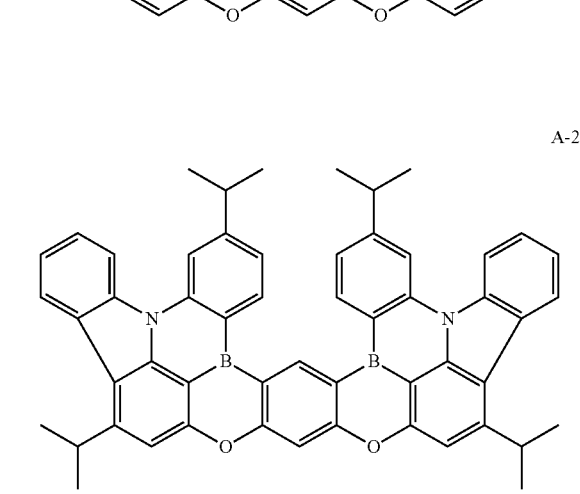
A-21
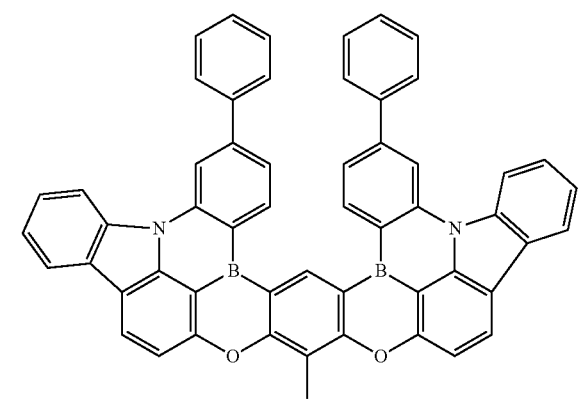

A-22
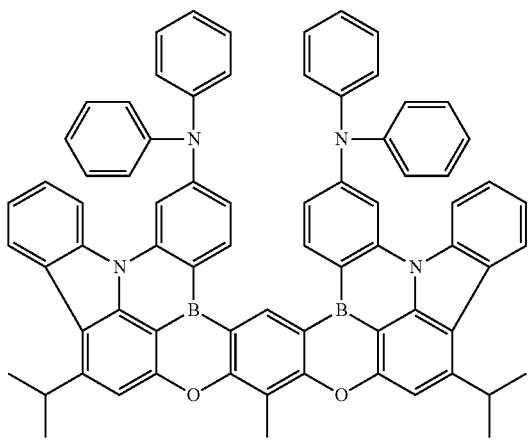
A-25
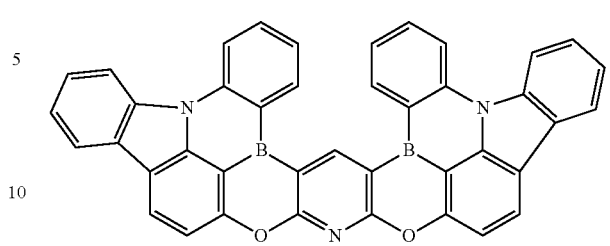
A-26
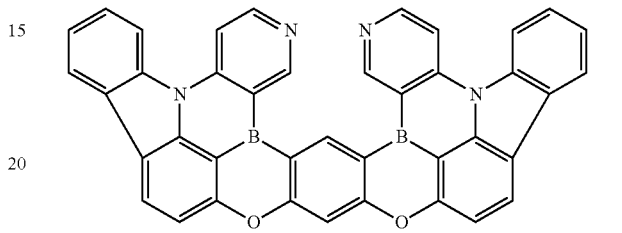
A-23
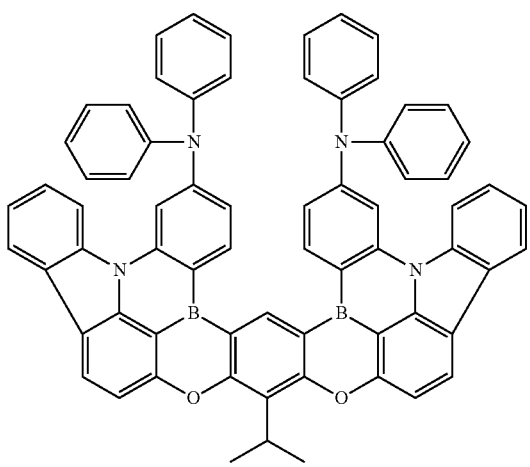
A-27
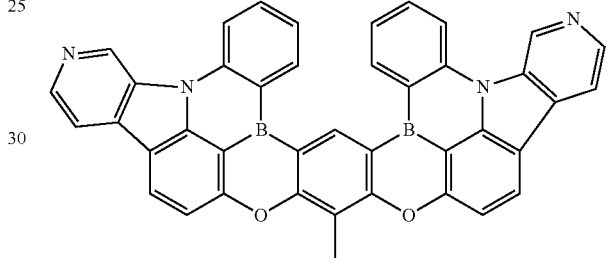
A-28
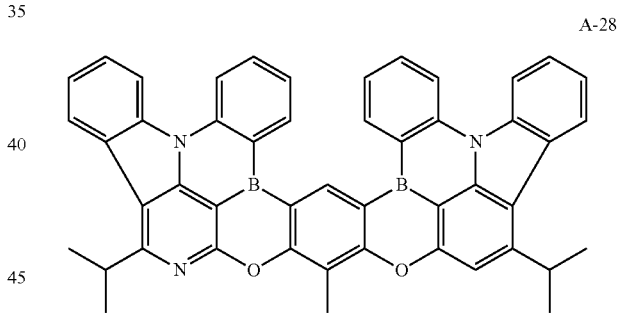
A-24
A-29
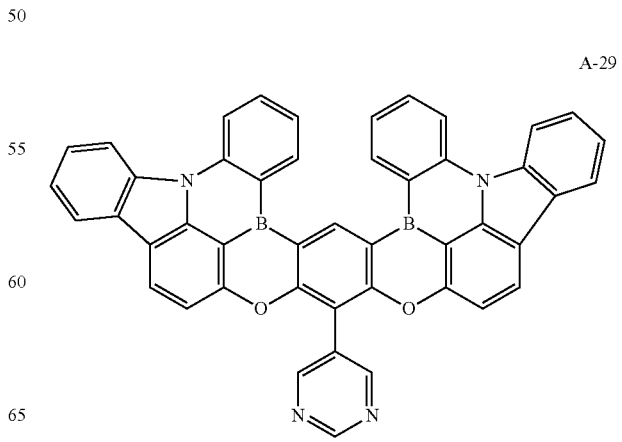

A-30
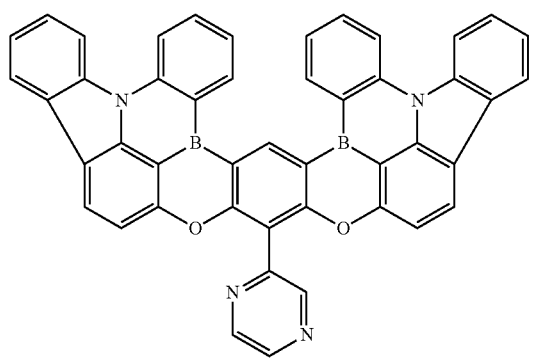
B-3
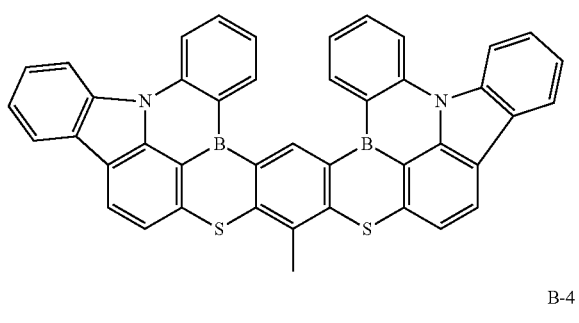
B-4
A-31
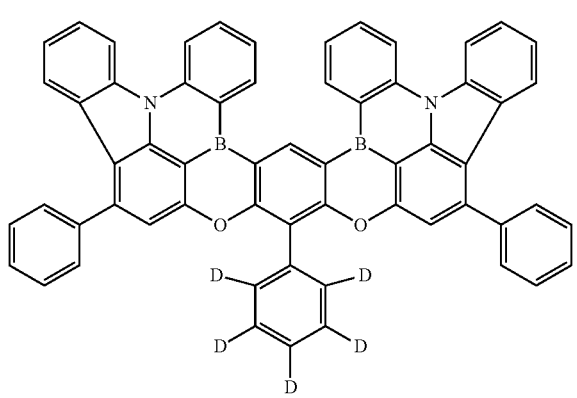
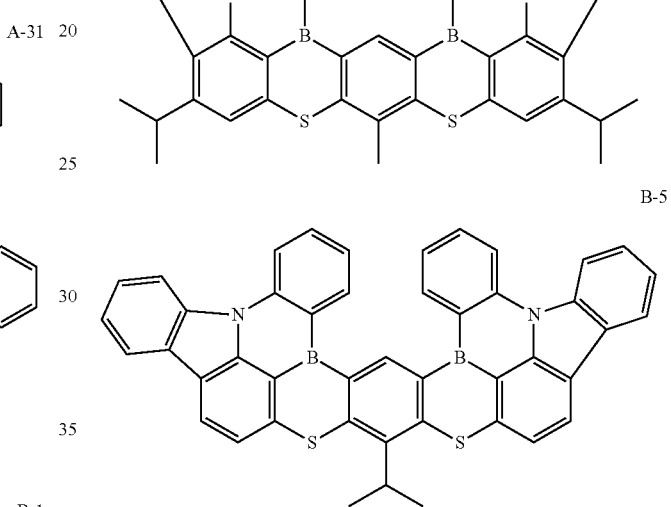
B-5
[Compound Group B]
B-1
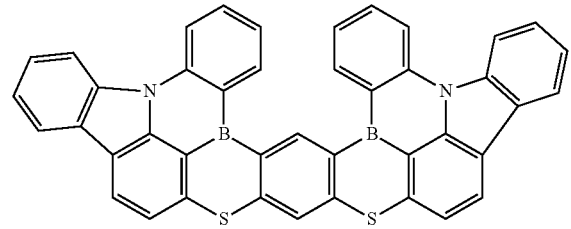
B-6
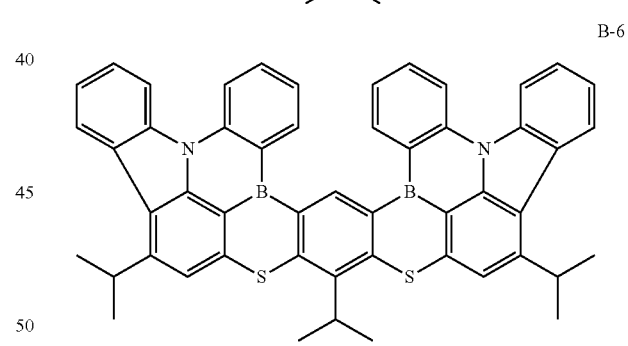
B-2
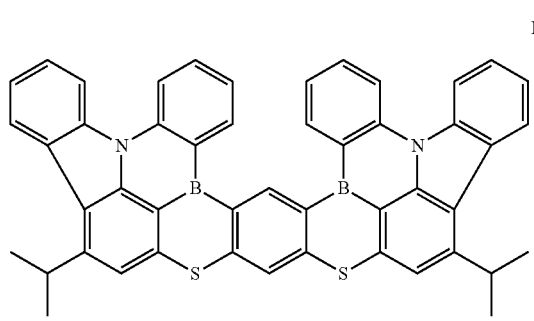
B-7
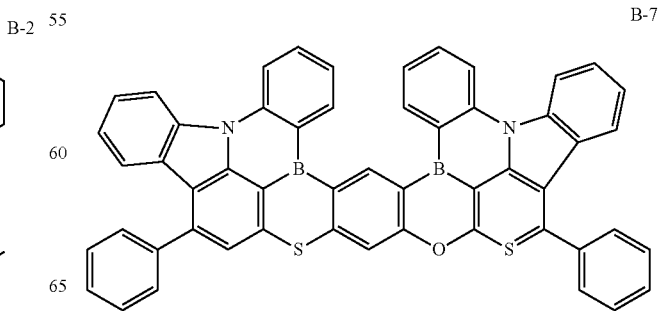

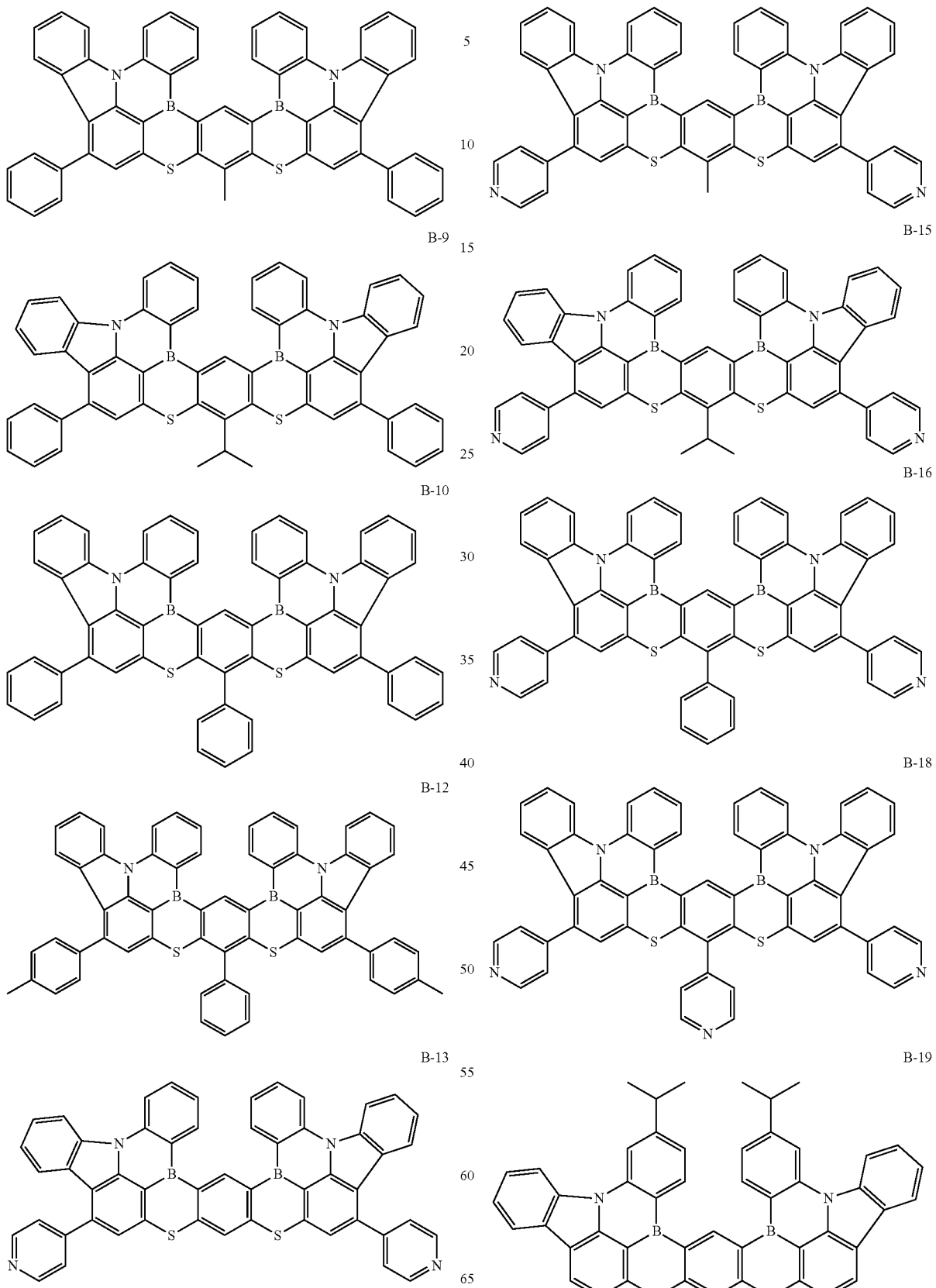

B-20
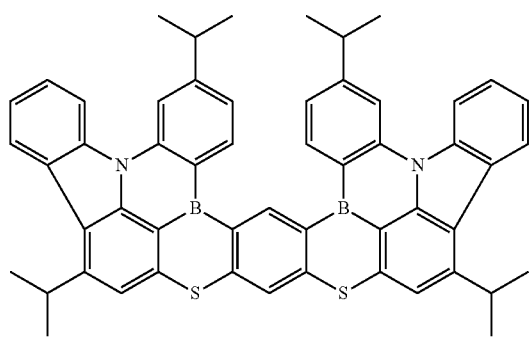
B-21
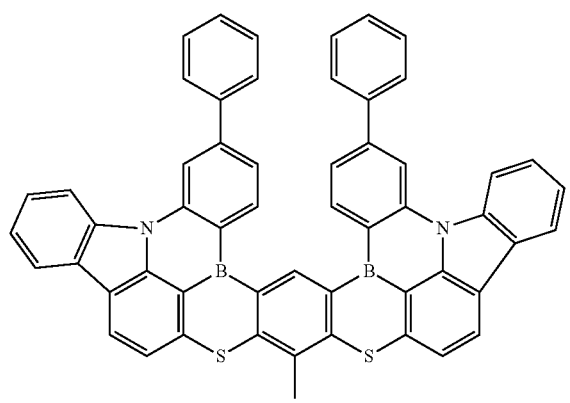
B-22
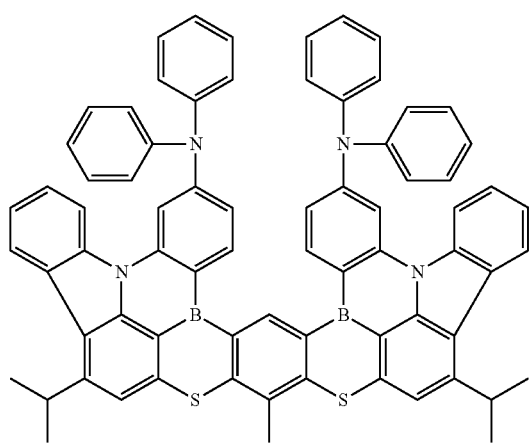
B-23
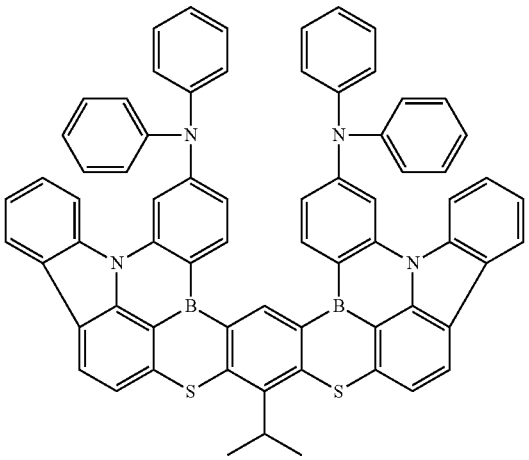
B-24
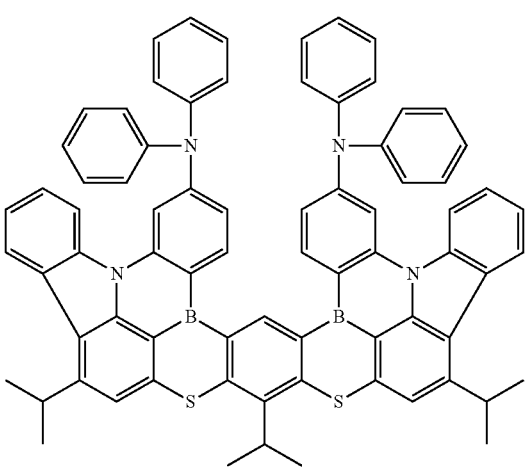
[Compound Group C]
C-1
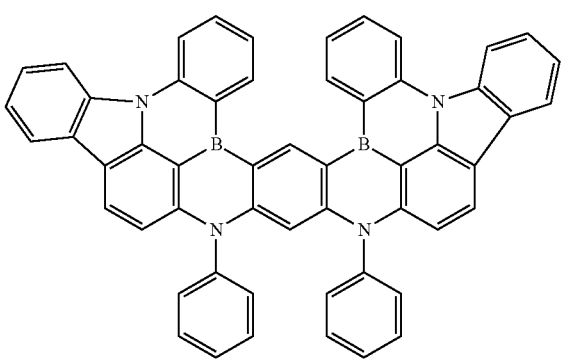

C-2
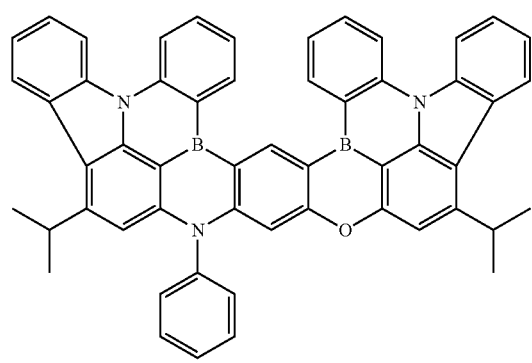
C-6
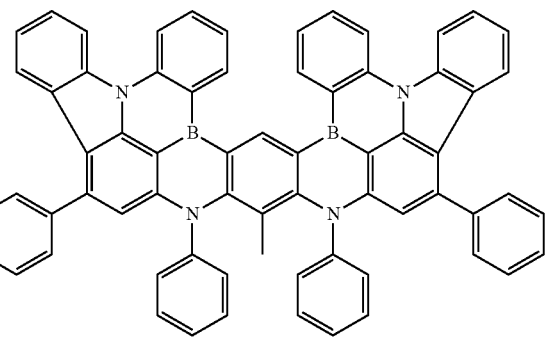
C-3
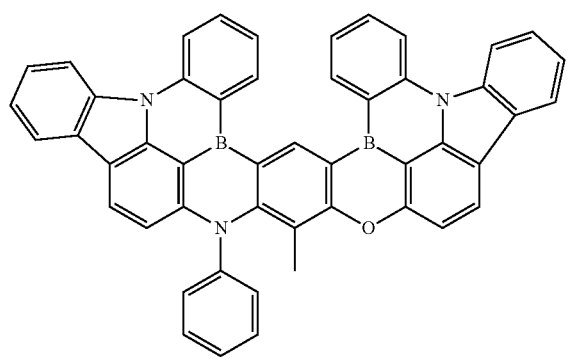
C-7
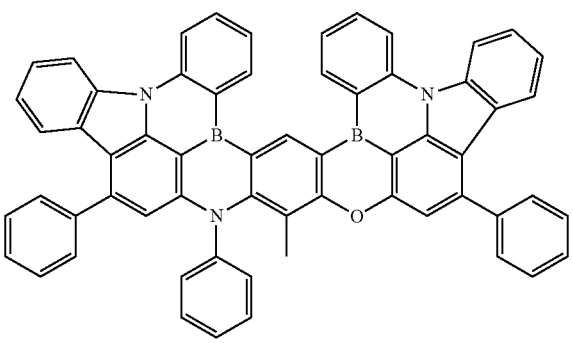
C-4
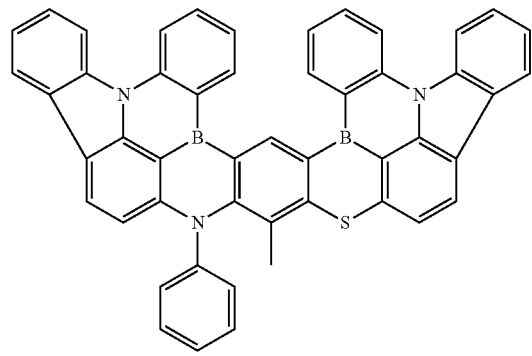
C-8
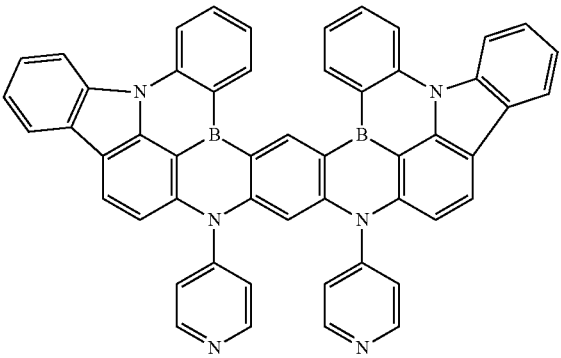
C-5
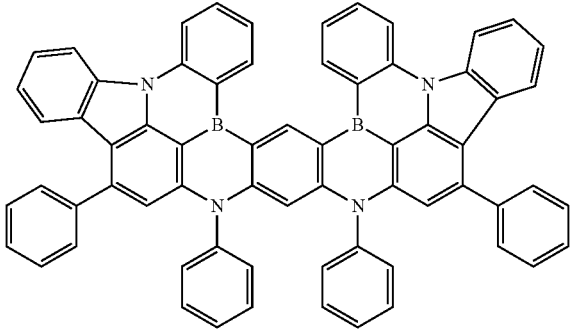
C-9
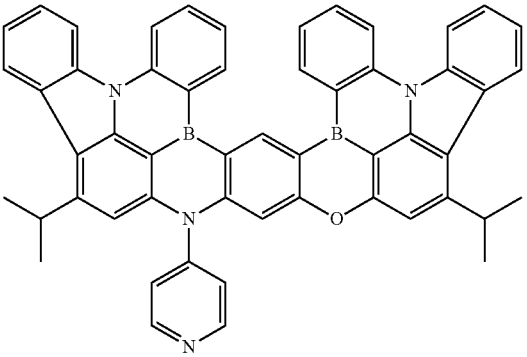

-continued
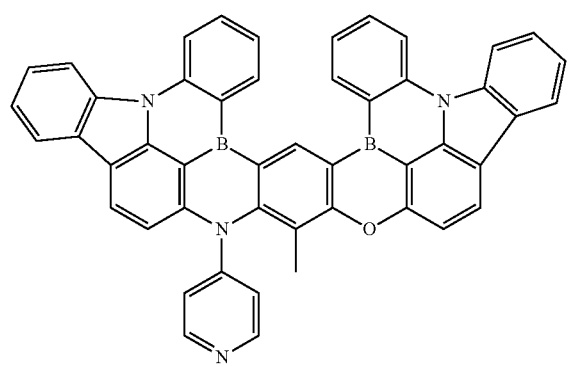
C-10
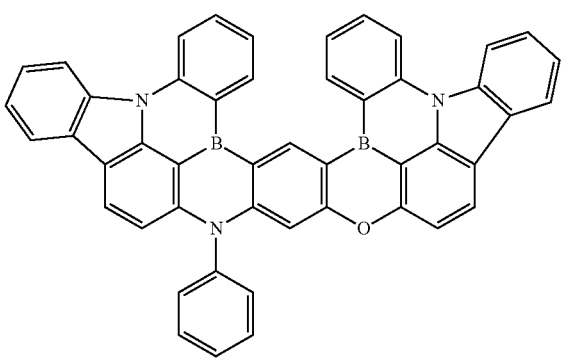
C-14
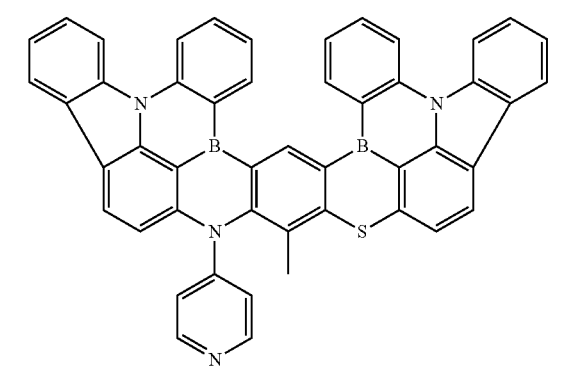
C-11
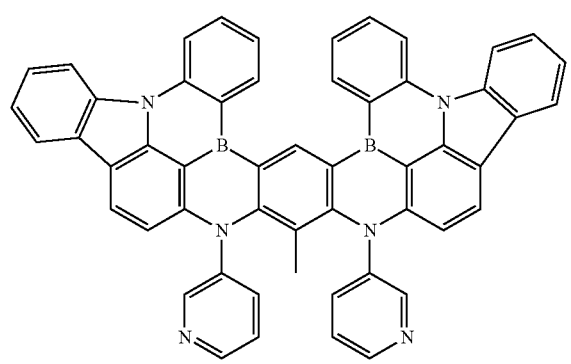
C-12
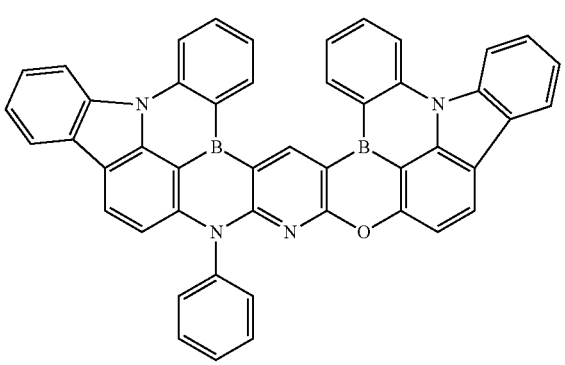
C-15
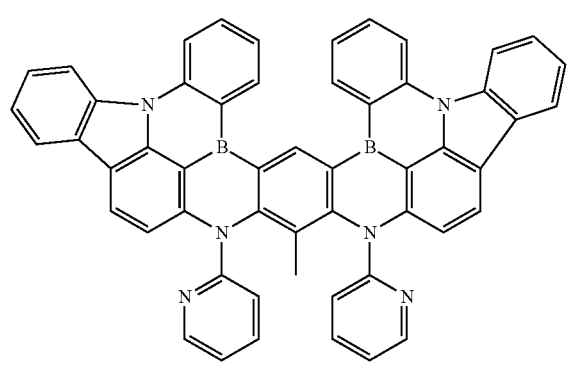
C-13
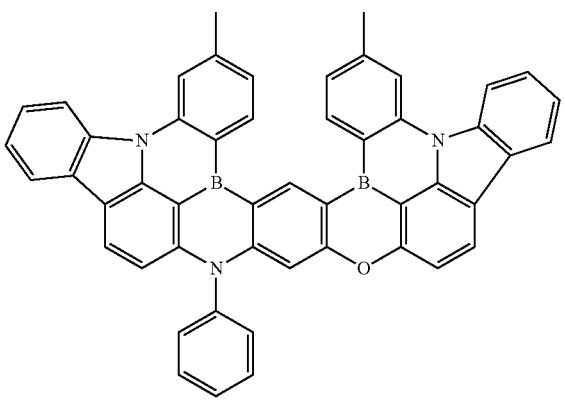
C-16

C-17
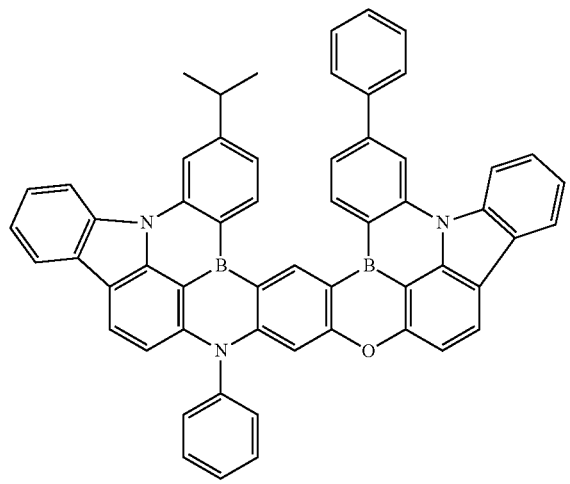
[Compound Group D]
D-1
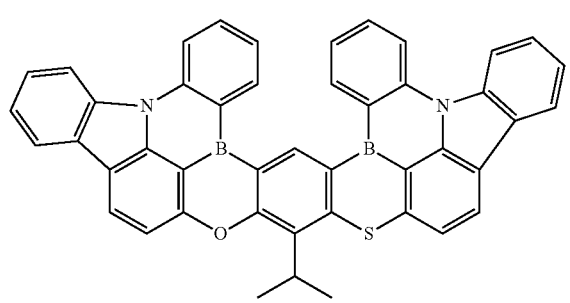
D-2
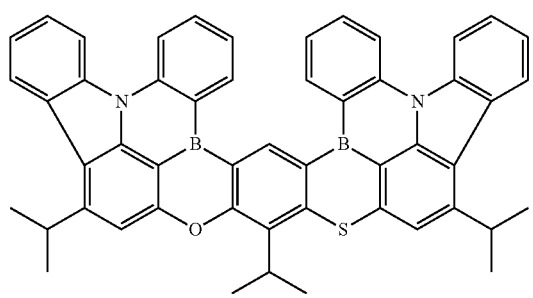
D-3
D-4
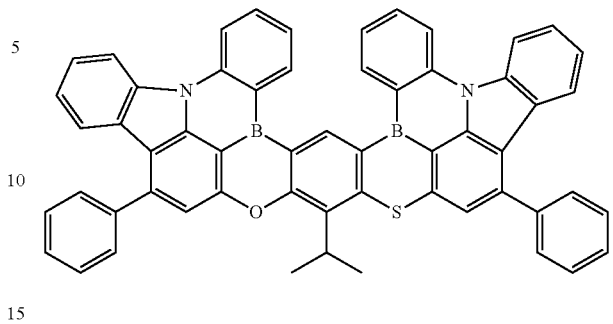
D-5
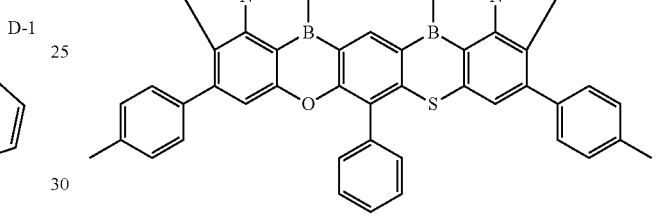
[Compound Group E]
E-1
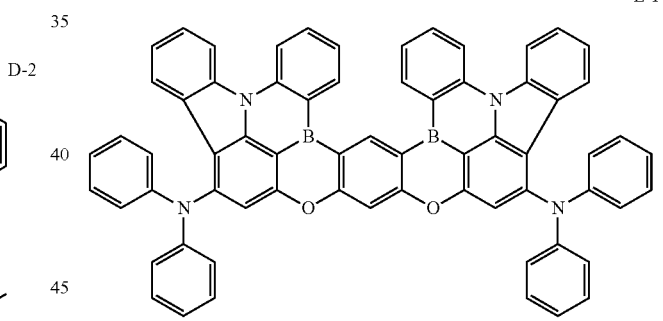
E-2
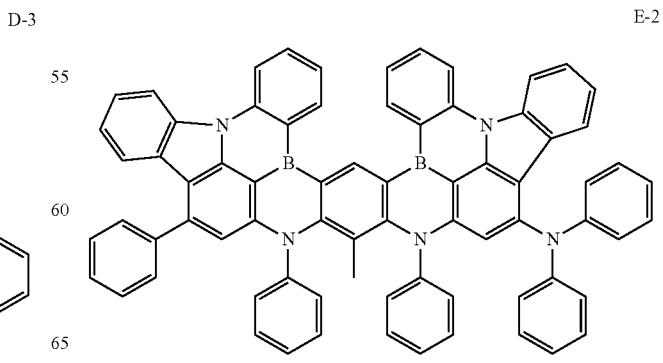

-continued
E-3
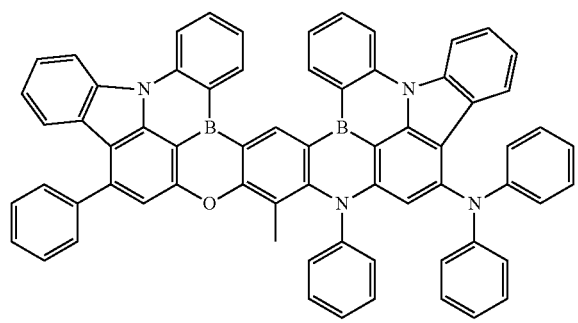
E-4
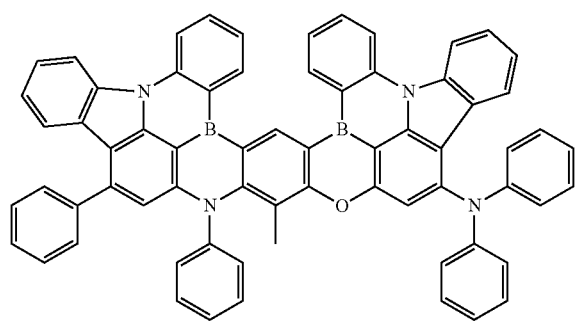
E-5
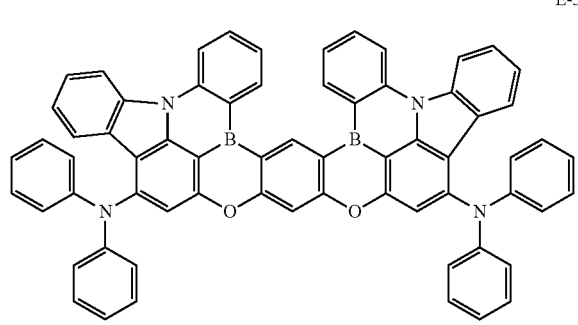
E-6
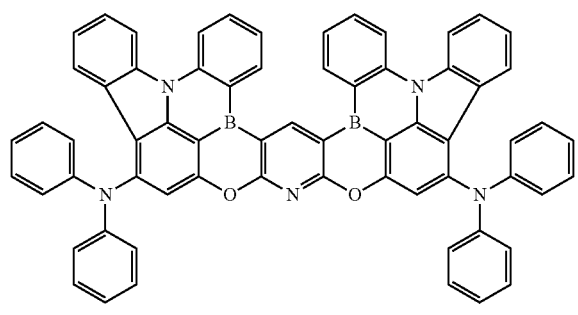
-continued
E-7
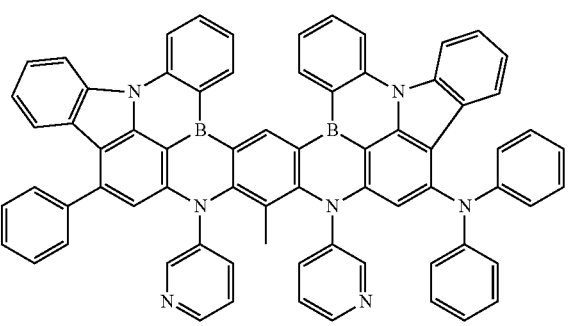
E-8
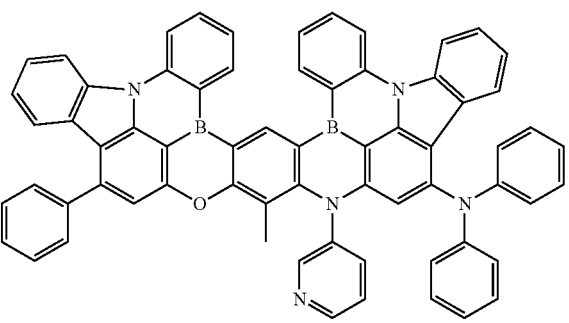
E-9
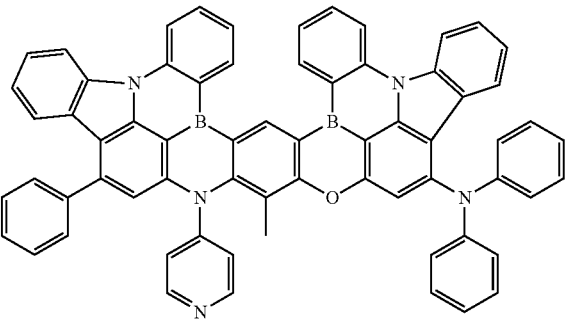
E-10
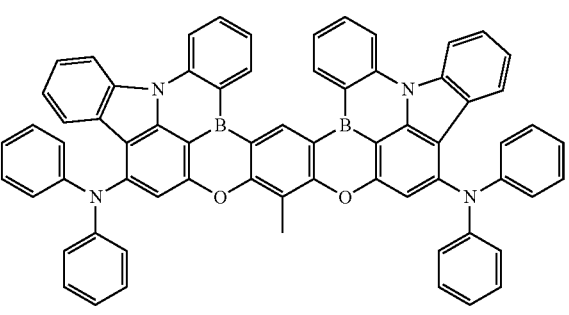

E-11
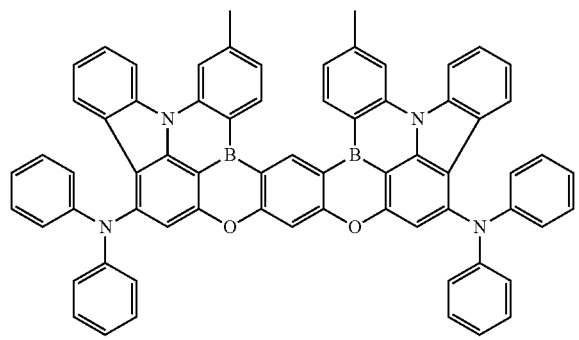
E-12
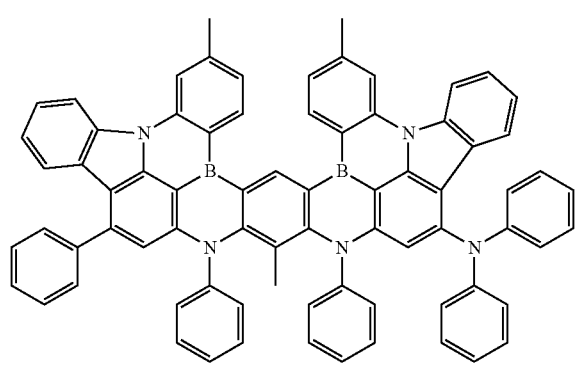
E-13
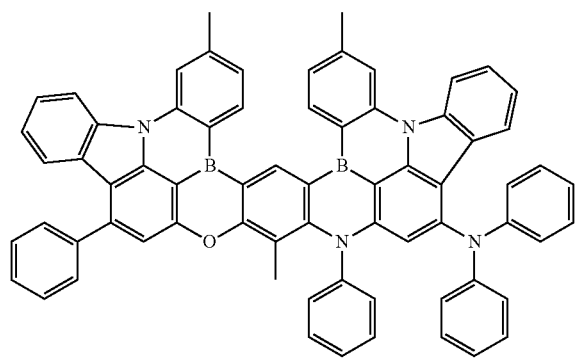
E-14
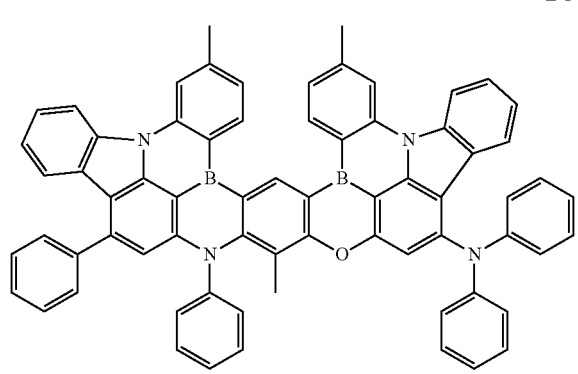
E-16
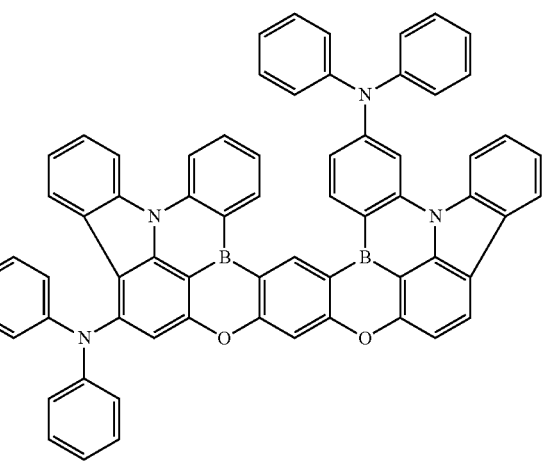
E-17
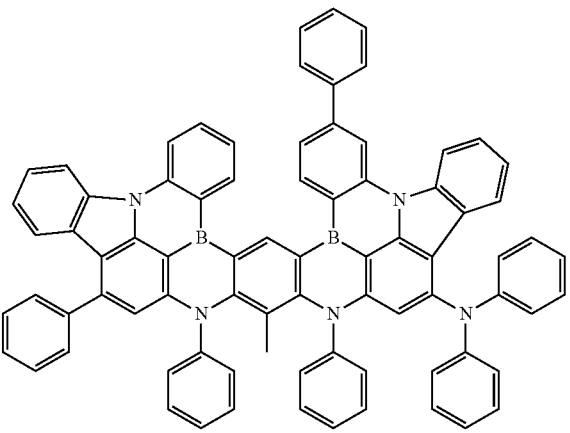
E-18
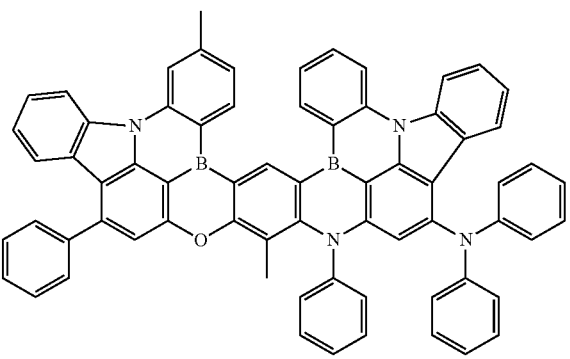

E-19
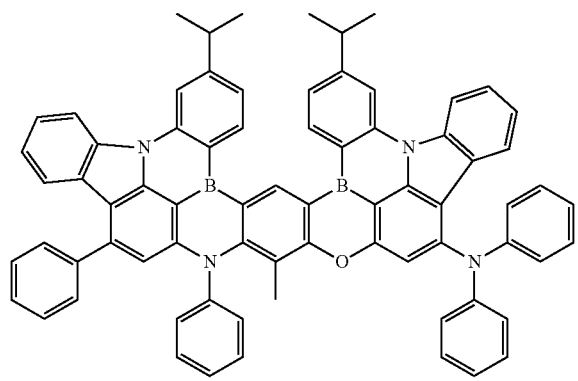
E-20
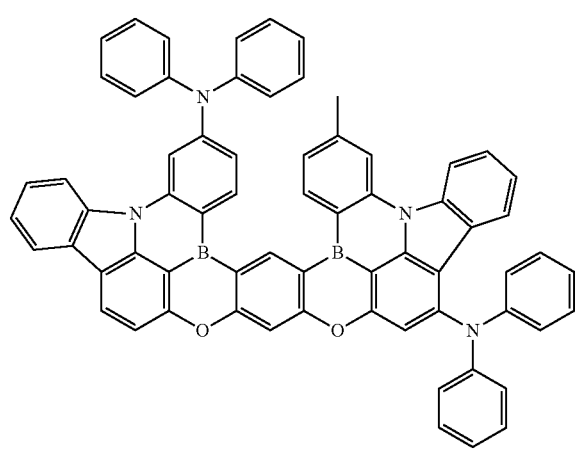
[Compound Group F]
F-1
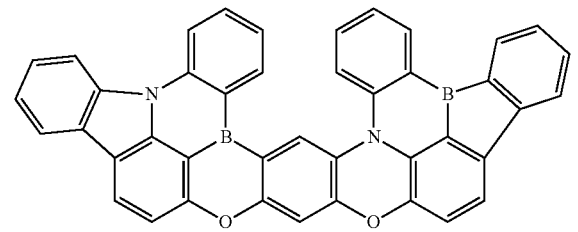
F-2
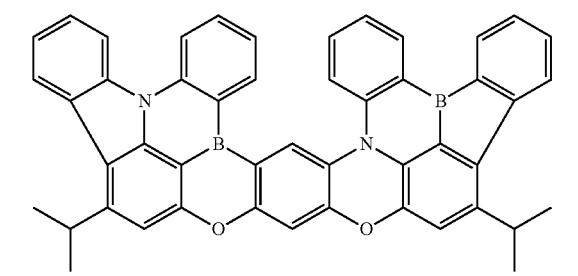
F-3
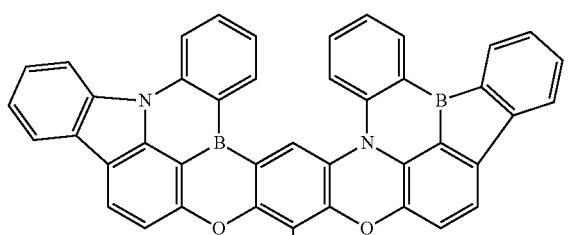
F-4
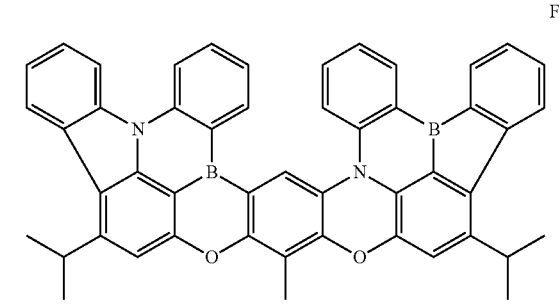
F-5
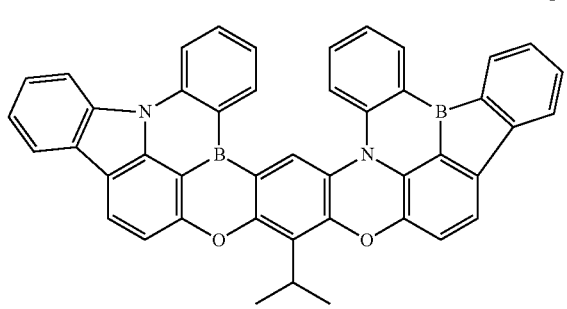
F-6
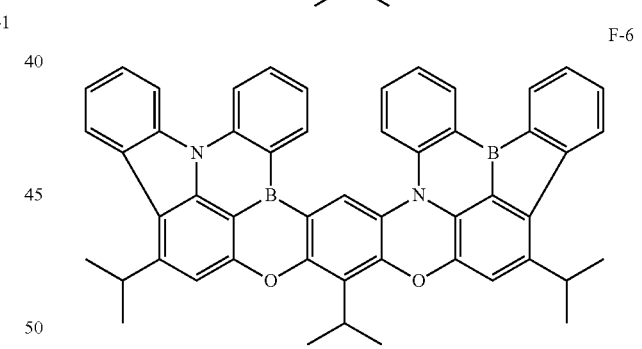
F-7
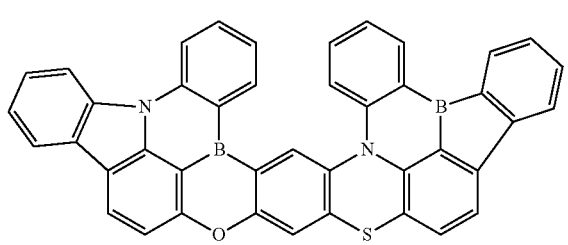

F-9
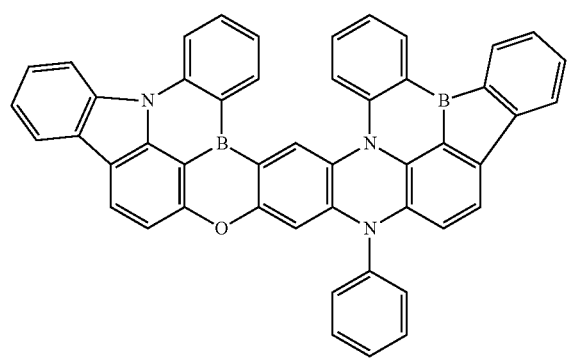
F-10
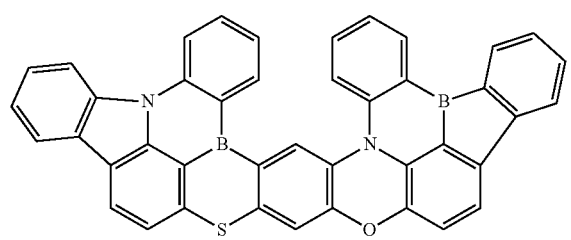
F-12
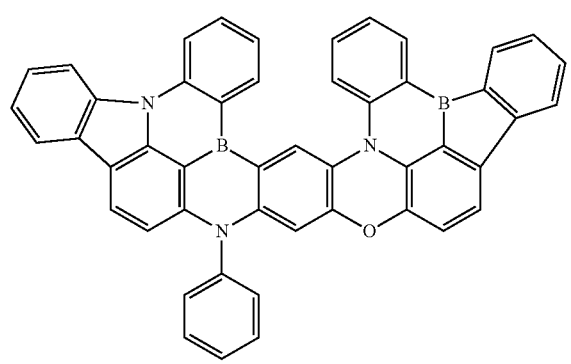
[Compound Group G]
G-1
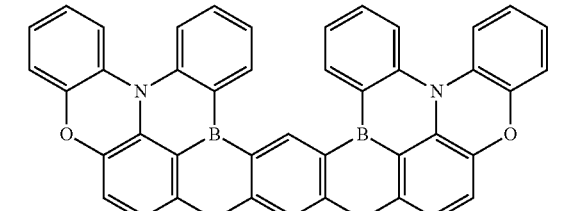
G-2
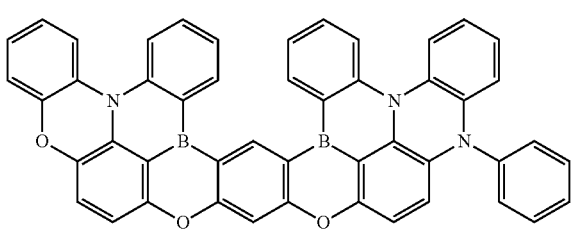
G-3
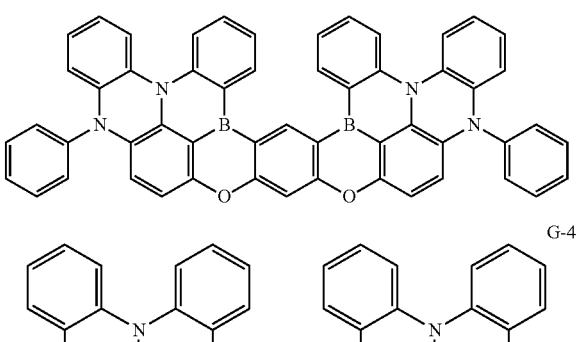
G-4
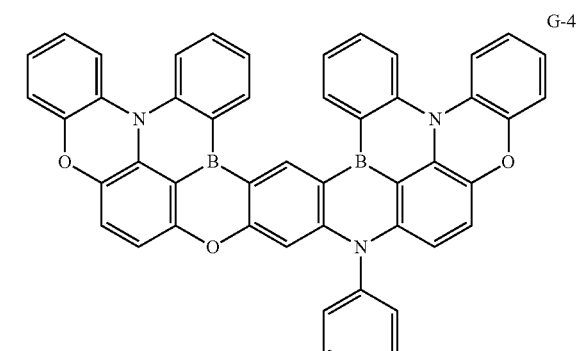
G-5
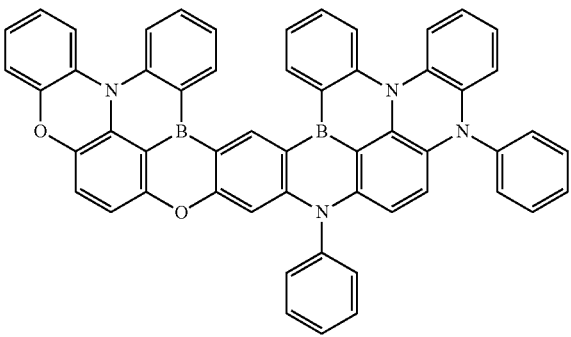
G-6
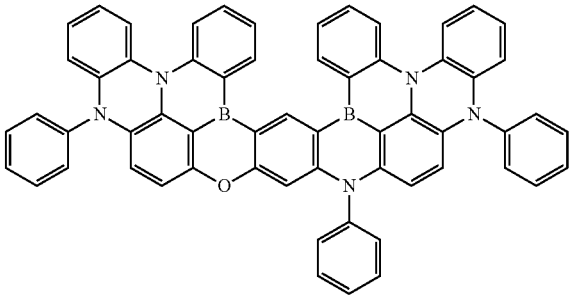
G-7
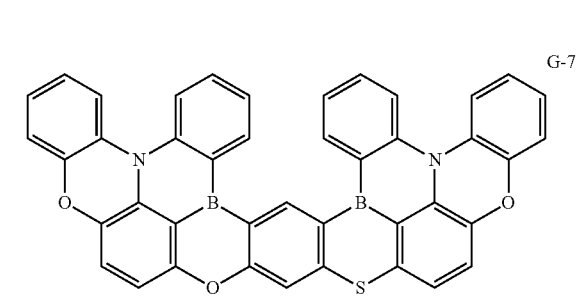

-continued
G-8
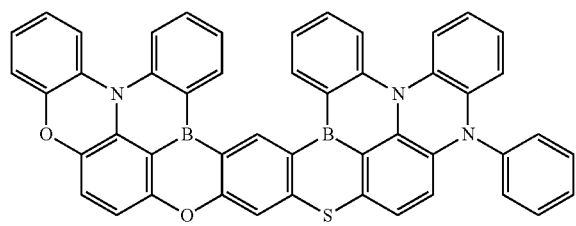
G-9
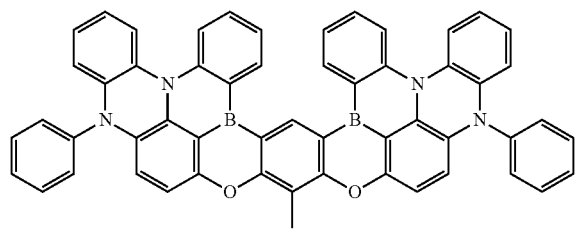
G-10
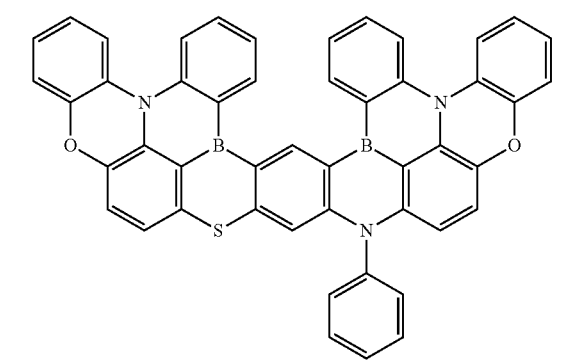
G-11
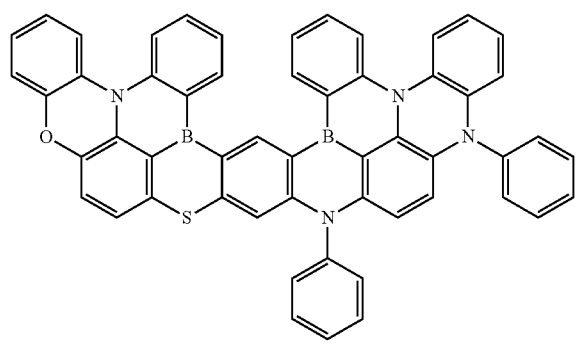
G-12
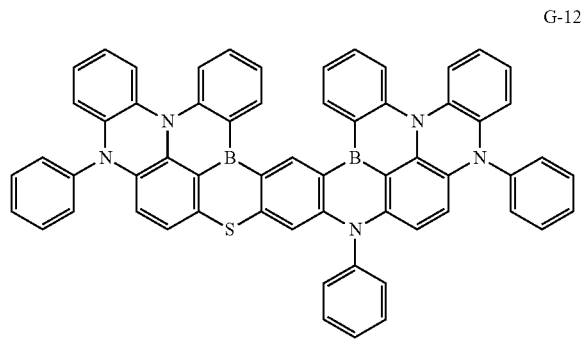
-continued
G-13
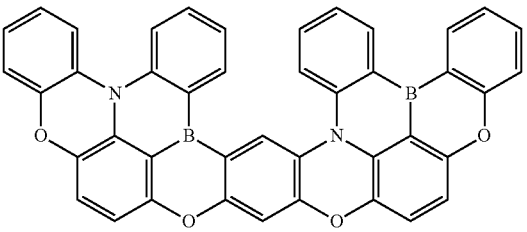
G-14
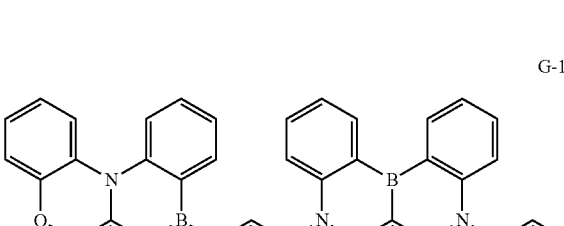
G-15
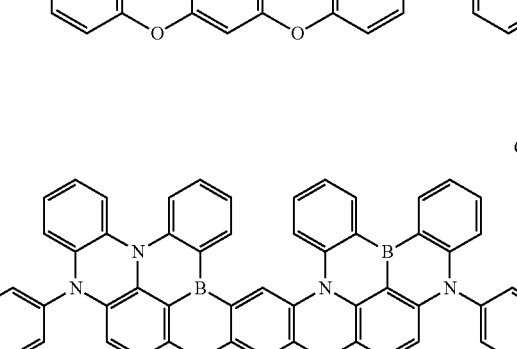
G-16
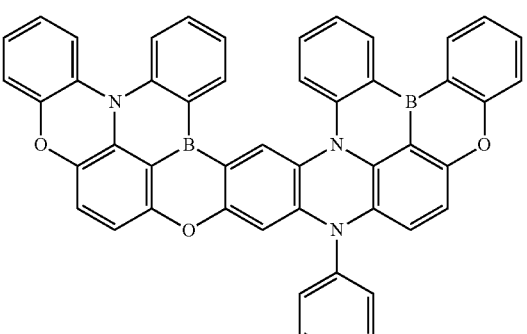
G-17
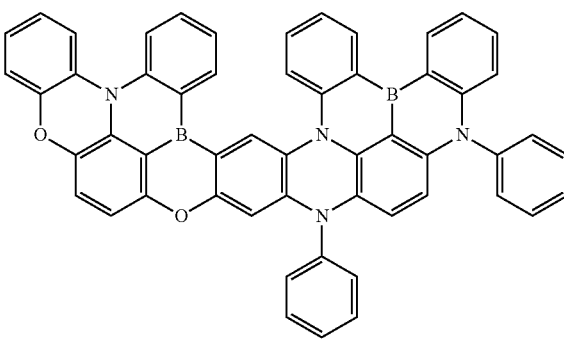

-continued
G-18
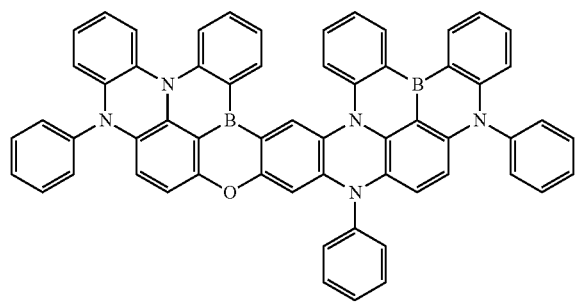
G-19
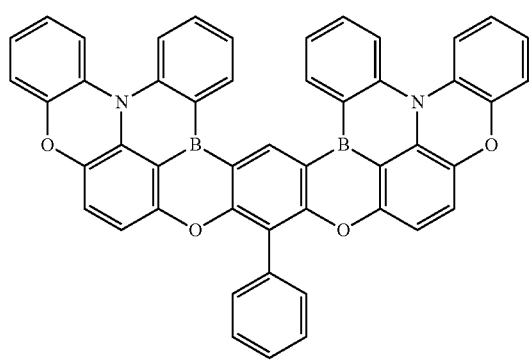
G-20
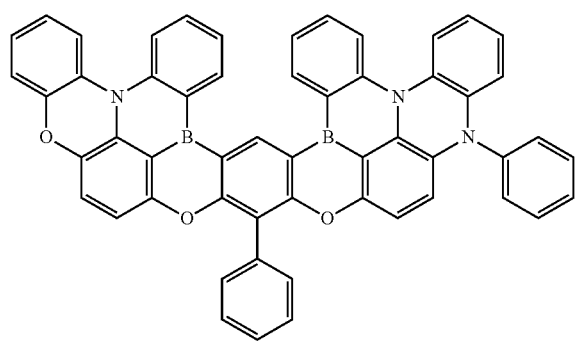
G-21
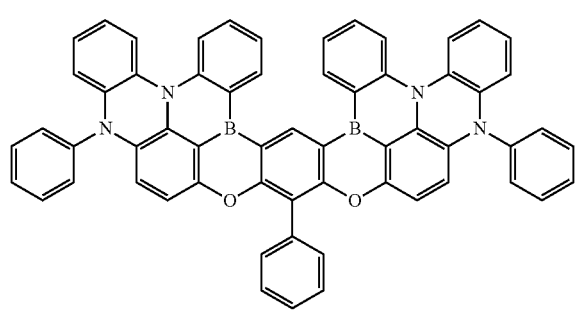
-continued
G-22
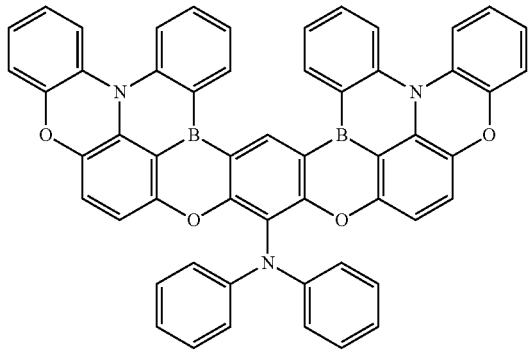
G-23
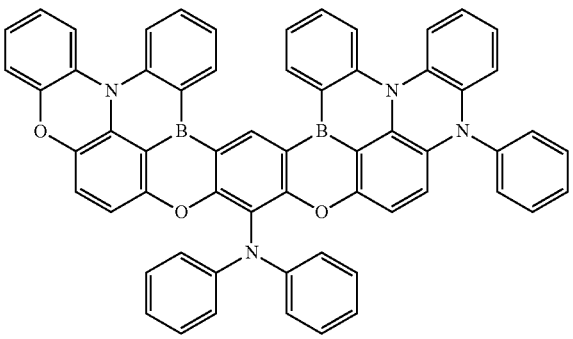
G-24
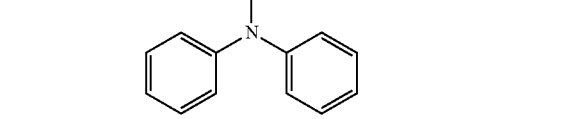
wherein in Compound A-31, D represents deuterium.
* * * * *